US011482553B2

(12) United States Patent
Cheng et al.

(10) Patent No.: US 11,482,553 B2
(45) Date of Patent: Oct. 25, 2022

(54) PHOTO-DETECTING APPARATUS WITH SUBPIXELS

(71) Applicant: Artilux, Inc., Menlo Park, CA (US)

(72) Inventors: Szu-Lin Cheng, Hsinchu County (TW); Chien-Yu Chen, Hsinchu County (TW); Shu-Lu Chen, Hsinchu County (TW); Yun-Chung Na, Hsinchu County (TW); Ming-Jay Yang, Hsinchu County (TW); Han-Din Liu, Hsinchu County (TW); Che-Fu Liang, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 91 days.

(21) Appl. No.: 17/005,298

(22) Filed: Aug. 27, 2020

(65) Prior Publication Data

US 2020/0395393 A1 Dec. 17, 2020

Related U.S. Application Data

(63) Continuation-in-part of application No. 16/282,881, filed on Feb. 22, 2019, now Pat. No. 10,777,692.

(60) Provisional application No. 62/989,901, filed on Mar. 16, 2020, provisional application No. 62/776,995, filed on Dec. 7, 2018, provisional application No. 62/770,196, filed on Nov. 21, 2018, provisional application No. 62/755,581, filed on Nov. 5, 2018, provisional application No. 62/752,285, filed on Oct.

(Continued)

(51) Int. Cl.
*H01L 27/146* (2006.01)

(52) U.S. Cl.
CPC .... *H01L 27/1463* (2013.01); *H01L 27/14609* (2013.01)

(58) Field of Classification Search
CPC ........... H01L 27/1463; H01L 27/14609; H01L 27/14603; H01L 27/1464; G01S 7/4914; G01S 17/36
See application file for complete search history.

(56) References Cited

U.S. PATENT DOCUMENTS 3,621,466 A 11/1971 Toshio
4,341,918 A 7/1982 Evans, Jr. et al.
(Continued)

FOREIGN PATENT DOCUMENTS

CN 101310387 11/2008
CN 105322001 2/2016
(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.
(Continued)

*Primary Examiner* — Karen Kusumakar
*Assistant Examiner* — Adam S Bowen
(74) *Attorney, Agent, or Firm* — Fish & Richardson P.C.

(57) ABSTRACT

A photo-detecting apparatus is provided. The photo-detecting apparatus includes at least one pixel, and each pixel includes N subpixels, wherein each of the subpixels comprises a detection region, two first conductive contacts, wherein the detection region is between the two first conductive contacts, wherein N is a positive integer and is ≥2.

18 Claims, 85 Drawing Sheets

Related U.S. Application Data

29, 2018, provisional application No. 62/717,908, filed on Aug. 13, 2018, provisional application No. 62/698,263, filed on Jul. 15, 2018, provisional application No. 62/695,060, filed on Jul. 8, 2018, provisional application No. 62/695,058, filed on Jul. 8, 2018, provisional application No. 62/686,697, filed on Jun. 19, 2018, provisional application No. 62/682,254, filed on Jun. 8, 2018, provisional application No. 62/660,252, filed on Apr. 20, 2018, provisional application No. 62/654,454, filed on Apr. 8, 2018, provisional application No. 62/634,741, filed on Feb. 23, 2018.

(56) References Cited

U.S. PATENT DOCUMENTS

| | | | |
|---|---|---|---|
| 5,453,611 | A | 9/1995 | Oozu |
| 5,673,284 | A | 9/1997 | Congdon et al. |
| 5,965,875 | A | 10/1999 | Merrill |
| 6,509,203 | B2 | 1/2003 | Spartiotis et al. |
| 7,090,133 | B2 | 8/2006 | Zhu |
| 7,411,265 | B2 | 8/2008 | Sekiguchi |
| 7,629,661 | B2 | 12/2009 | Rafferty et al. |
| 7,750,958 | B1 | 7/2010 | Dierickx |
| 7,826,058 | B1 | 11/2010 | Ulrich et al. |
| 7,884,310 | B2 | 2/2011 | Buettgen |
| 7,888,763 | B2 | 2/2011 | Qian et al. |
| 7,961,301 | B2 | 6/2011 | Earhart et al. |
| 8,129,813 | B2 | 3/2012 | Herz |
| 8,183,510 | B2 | 5/2012 | Venezia et al. |
| 8,405,823 | B2 | 3/2013 | Pfaff |
| 8,975,668 | B2 | 3/2015 | Costello et al. |
| 9,236,520 | B2 | 1/2016 | Okhonin et al. |
| 9,472,588 | B1 | 10/2016 | Liu et al. |
| 10,254,389 | B2 | 4/2019 | Na et al. |
| 10,269,855 | B2 | 4/2019 | Sallin et al. |
| 10,310,060 | B2 | 6/2019 | Na et al. |
| 10,353,056 | B2 | 7/2019 | Na et al. |
| 10,418,407 | B2 | 9/2019 | Na et al. |
| 10,613,202 | B2 | 4/2020 | Roy et al. |
| 10,690,495 | B2 | 6/2020 | Takagi et al. |
| 10,739,443 | B2 | 8/2020 | Na et al. |
| 10,741,598 | B2 | 8/2020 | Na et al. |
| 10,777,692 | B2 | 9/2020 | Cheng et al. |
| 10,795,003 | B2 | 10/2020 | Na et al. |
| 10,886,309 | B2 | 1/2021 | Na et al. |
| 10,886,311 | B2 | 1/2021 | Na et al. |
| 10,886,312 | B2 | 1/2021 | Na et al. |
| 11,105,928 | B2 | 8/2021 | Cheng et al. |
| 11,131,757 | B2 | 9/2021 | Na et al. |
| 2003/0042500 | A1 | 3/2003 | Rhodes et al. |
| 2005/0051730 | A1 | 3/2005 | Kuijk et al. |
| 2005/0167709 | A1 | 8/2005 | Augusto |
| 2007/0164767 | A1 | 7/2007 | Herz |
| 2009/0166684 | A1 | 7/2009 | Yahav et al. |
| 2009/0237770 | A1 | 9/2009 | Kim et al. |
| 2011/0031578 | A1 | 2/2011 | Miura et al. |
| 2011/0128430 | A1 | 6/2011 | Fossum |
| 2011/0255071 | A1 | 10/2011 | Van Der Tempel et al. |
| 2012/0133922 | A1 | 5/2012 | Pfaff |
| 2012/0307232 | A1 | 12/2012 | Mase |
| 2013/0026548 | A1 | 1/2013 | McCarten et al. |
| 2013/0214161 | A1 | 8/2013 | Cazuax et al. |
| 2014/0002700 | A1 | 1/2014 | Oishi |
| 2014/0111664 | A1 | 4/2014 | Kumano |
| 2014/0117428 | A1 | 5/2014 | Lee et al. |
| 2014/0159129 | A1 | 6/2014 | Wang |
| 2014/0291793 | A1* | 10/2014 | Tanaka ............. H01L 27/14645 257/435 |
| 2014/0312206 | A1 | 10/2014 | Okhonin et al. |
| 2014/0367740 | A1 | 12/2014 | Morse et al. |
| 2015/0001664 | A1 | 1/2015 | Van Der Tempel et al. |
| 2015/0187923 | A1 | 7/2015 | Kawahito |
| 2016/0141329 | A1 | 5/2016 | Cheng et al. |
| 2016/0150174 | A1 | 5/2016 | Hynecek |
| 2016/0155883 | A1 | 6/2016 | Shi et al. |
| 2016/0161599 | A1 | 6/2016 | Seliuchenko |
| 2016/0225922 | A1 | 8/2016 | Akkaya et al. |
| 2016/0284750 | A1 | 9/2016 | Ionescu et al. |
| 2016/0316159 | A1 | 10/2016 | Yoneda |
| 2017/0040361 | A1 | 2/2017 | Ikeda et al. |
| 2017/0041589 | A1 | 2/2017 | Patil et al. |
| 2017/0062508 | A1 | 3/2017 | Na et al. |
| 2017/0074643 | A1 | 3/2017 | Chang |
| 2017/0131389 | A1* | 5/2017 | Na ........................ H01L 29/161 |
| 2017/0141153 | A1 | 5/2017 | Lee et al. |
| 2017/0317116 | A1 | 11/2017 | Celo et al. |
| 2017/0332024 | A1 | 11/2017 | Feick |
| 2018/0061883 | A1 | 3/2018 | Na et al. |
| 2018/0175095 | A1 | 6/2018 | Sallin et al. |
| 2018/0188356 | A1 | 7/2018 | Na et al. |
| 2018/0190698 | A1 | 7/2018 | Na et al. |
| 2018/0190702 | A1 | 7/2018 | Na |
| 2018/0233521 | A1 | 8/2018 | Na et al. |
| 2018/0233528 | A1 | 8/2018 | Na et al. |
| 2018/0247968 | A1 | 8/2018 | Na et al. |
| 2019/0033432 | A1 | 1/2019 | Na et al. |
| 2019/0049564 | A1 | 2/2019 | Na et al. |
| 2019/0267498 | A1 | 8/2019 | Cheng et al. |
| 2019/0302243 | A1 | 10/2019 | Na et al. |
| 2019/0312158 | A1 | 10/2019 | Na et al. |
| 2019/0348463 | A1 | 11/2019 | Na et al. |
| 2019/0378872 | A1 | 12/2019 | Chen |
| 2020/0052016 | A1 | 2/2020 | Na et al. |
| 2020/0249327 | A1 | 8/2020 | Na et al. |
| 2020/0319345 | A1 | 10/2020 | Cheng et al. |
| 2021/0020672 | A1 | 1/2021 | Chen et al. |
| 2021/0373168 | A1 | 2/2021 | Cheng et al. |
| 2021/0126027 | A1 | 4/2021 | Na et al. |
| 2021/0302549 | A1 | 9/2021 | Na et al. |

FOREIGN PATENT DOCUMENTS

| | | |
|---|---|---|
| CN | 105762220 | 7/2016 |
| CN | 106449684 | 2/2017 |
| CN | 107403814 | 11/2017 |
| EP | 2081004 | 7/2009 |
| EP | 2330637 | 6/2011 |
| JP | H0548139 | 2/1993 |
| JP | H05-211321 | 8/1993 |
| JP | 2009-047658 | 3/2009 |
| JP | 2011-66097 | 3/2011 |
| JP | 2011-128024 | 6/2011 |
| JP | 2014-107562 | 6/2014 |
| JP | 2016-533648 | 10/2016 |
| WO | WO 2005/036647 | 4/2005 |
| WO | WO 2013/104718 | 7/2013 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/018477 | 2/2017 |
| WO | WO 2019/165220 | 8/2019 |
| WO | WO 2019/165229 | 8/2019 |
| WO | WO 2019/199691 | 10/2019 |

OTHER PUBLICATIONS

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-μm CMOS Technology," IEEE Trans. Electron. Dev., Jun. 2011, 58(6):1702-1709.

(56) References Cited

OTHER PUBLICATIONS

Fang et al., "An Integration PIN/MISS OEIC for High Current Photoreceiver Applications," IEEE Transactions on Electron Devices, Jan. 1997, 44(1):34-38.
Feng et al., "Vertical p-i-n germanium photodetector with high external responsivity integrated with large core Si waveguides," Optics Express, Jan. 4, 2010, 18(1):96-101.
Foix et al., "Lock-in Time-of-Flight (ToF) Cameras: A Survey," IEEE Sensors J., Sep. 2011. 11(9):1917-1926.
Fussum et al., "A Review of the Pinned Photodiode for CCD and CMOS Image Sensors," IEEE J. Electron Devices Soc. May 1, 2014, 2(3):33-43.
Geng, "Structured-light 3D surface imaging: a tutorial," Advances in Optics and Photonics, Jun. 30, 2011, 3(2):128-160.
Gulden et al., "Novel optical distance sensor based on MSM technology." IEEE Sensors Journal. Oct. 2004, 4(5):612-8.
Hutchinson et al., "High-Resolution Aliasing-Free Optical Beam Steering," Optica, Aug. 5, 2016, 3(8), 4 pages.
Joo et al., "High-sensitivity 10 Gbps Ge-on-Si photoreceiver operating at λ~1.55 μm," Optics Express, Aug. 2, 2010, 18(16):16474-16479.
Kang et al, "Monolithic Ge/Si Avalanche Photodiodes," IEEE Xplore, 2009, 3 pages.
Kato et al., "320×240 Back-Illuminated 10-μm CAPD Pixels for High-Speed Modulation Time-of-Flight CMOS Image Sensor," IEEE J. Solid-State Circuits, Apr. 2018, 53(4):1071-1078.
Kawahito et al., "A CMOS Time-of-Flight Range Image Sensor With Gates-on-Field-Oxide Structure," IEEE Sensors J., Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron., Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon., Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
PCT International Preliminary Report on Patentability in International Appln PCT/US2019/019167, dated Sep. 3, 2020, 9 pages.
PCT International Search Report and Written Opinion in International Appln. PCT/US2019/19167, dated May 14, 2019, 15 pages.
Perenzoni et al., "Compact SPAD-Based Pixel Architectures for Time-Resolved Image Sensors," Sensors, May 23, 2016, 16(745), 12 pages.
Place et al., "Rad tolerant CMOS image sensor based on hole collection 4T pixel pinned photodiode." IEEE Transactions on Nuclear Science., Dec. 6, 2012, 59(6):2888-93.
Rafferty et al., "Monolithic germanium SWIR imaging array," 2008 IEEE Conference on Technologies for Homeland Security, May 12, 2008:577-582.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 Gb/s high-speed optical interconnects," Sci. Rep., Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J., Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express, Oct. 17, 2007, 15(21):13965-13971.
Yokogawa et al., "IR sensitivity enhancement of CMOS Image Sensor with diffractive light trapping pixels," Sci. Rep., Jun. 19, 2017, 7(1):3832, 9 pages.

* cited by examiner

PHOTO-DETECTING APPARATUS WITH SUBPIXELS

CROSS REFERENCE TO RELATED APPLICATIONS

This patent application is a continuation-in-part of and claims the priority to U.S. patent application Ser. No. 16/282,881, filed Feb. 22, 2019, which claims the benefit of U.S. Provisional Patent Application No. 62/634,741, filed Feb. 23, 2018, U.S. Provisional Patent Application No. 62/654,454, filed Apr. 8, 2018, U.S. Provisional Patent Application No. 62/660,252, filed Apr. 20, 2018, U.S. Provisional Patent Application No. 62/698,263, filed Jul. 15, 2018, U.S. Provisional Patent Application No. 62/682,254, filed Jun. 8, 2018, U.S. Provisional Patent Application No. 62/686,697, filed Jun. 19, 2018, U.S. Provisional Patent Application No. 62/695,060, filed Jul. 8, 2018, U.S. Provisional Patent Application No. 62/695,058, filed Jul. 8, 2018, U.S. Provisional Patent Application No. 62/752,285, filed Oct. 29, 2018, U.S. Provisional Patent Application No. 62/717,908, filed Aug. 13, 2018, U.S. Provisional Patent Application No. 62/755,581, filed Nov. 5, 2018, U.S. Provisional Patent Application No. 62/770,196, filed Nov. 21, 2018, U.S. Provisional Patent Application No. 62/776,995, filed Dec. 7, 2018, which are each incorporated by reference herein in its entirety.

This application also claims the benefit of U.S. Provisional Patent Application No. 62/989,901, filed Mar. 16, 2020, which is incorporated by reference herein.

BACKGROUND

Photodetectors may be used to detect optical signals and convert the optical signals to electrical signals that may be further processed by another circuitry. Photodetectors may be used in consumer electronics products, image sensors, data communications, time-of-flight (TOF) ranging or imaging sensors, medical devices, and many other suitable applications. However, when photodetectors are applied to these applications in a single or array configuration, the leakage current, dark current, electrical/optical cross-talk, and power consumption can degrade performance.

SUMMARY

This specification relates to detecting light using a photodiode.

According to an embodiment of the present disclosure, a photo-detecting apparatus is provided. The photo-detecting apparatus includes a semiconductor substrate. A first germanium-based light absorption material is supported by the semiconductor substrate and configured to absorb a first optical signal having a first wavelength greater than 800 nm. A first metal line is electrically coupled to a first region of the first germanium-based light absorption material. A second metal line is electrically coupled to a second region of the first germanium-based light absorption material. The first region is un-doped or doped with a first type of dopants. The second region is doped with a second type of dopants. The first metal line is configured to control an amount of a first type of photo-generated carriers generated inside the first germanium-based light absorption material to be collected by the second region.

According to an embodiment of the present disclosure, a photo-detecting method is provided. The photo-detecting method includes transmitting an optical signal modulated by a first modulation signal, wherein the optical signal is modulated by the first modulation signal with one or multiple predetermined phase(s) for multiple time frames. The reflected optical signal is received by a photodetector. The reflected optical signal is demodulated by one or multiple demodulation signal(s), wherein the one or multiple demodulation signal(s) is/are the signal(s) with one or multiple predetermined phase(s) for multiple time frames. At least one voltage signal is output on a capacitor.

According to an embodiment of the present disclosure, a photo-detecting apparatus is provided. The photo-detecting apparatus includes at least one pixel, and each pixel includes N subpixels, wherein each of the subpixels includes a detection region and two first conductive contacts, wherein the detection region is between the two first conductive contacts, wherein N is a positive integer and is ≥2.

According to an embodiment of the present disclosure, a photo-detecting apparatus is provided. The photo-detecting apparatus includes a first pixel and a second pixel adjacent to the first pixel, wherein each of the first pixel and a second pixel includes N detection regions, 2N first conductive contacts each coupled to one of the detection regions, 2N second conductive contacts each coupled to one of the detection regions, wherein N is a positive integer and is ≥2, and an isolation region between the first pixel and the second pixel.

According to an embodiment of the present disclosure, a photo-detecting apparatus is provided. The photo-detecting apparatus includes a photo-detecting apparatus, the photo-detecting apparatus includes a pixel, and the pixel includes N subpixels, wherein each of the subpixels includes a detection region and two switches, wherein the detection region is between the two switches, wherein N is a positive integer and is ≥2.

According to an embodiment of the present disclosure, an imaging system is provided. The imaging system includes a transmitter unit capable of emitting light; and a receiver unit including an image sensor including: a photo-detecting apparatus, including: a plurality of pixels, wherein each of the pixels includes: N subpixels, wherein each of the subpixels includes a detection region and two first conductive contacts, wherein the detection region is between the two first conductive contacts and the detection region is configured to absorb photons having a wavelength, and to generate photo-carriers from the absorbed photons; wherein N is a positive integer and is ≥2.

Among other advantages and benefits of the embodiments disclosed herein, the embodiments provide a photo-detecting apparatus capable of absorbing a least but limited to a near-infrared (NIR) light or a short-wave infrared (SWIR) light efficiently. In some embodiments, a photo-detecting apparatus provides a high demodulation contrast, low leakage current, low dark current, low power consumption, low electrical/optical cross-talk and/or architecture for chip size miniaturization. In some embodiments, a photo-detecting apparatus is capable of processing the incident optical signal with multiple wavelengths, including different modulation schemes and/or time-division functions. Moreover, the photo-detecting apparatus can be used in time-of-flight (ToF) applications, which may operate at longer wavelengths compared to visible wavelengths (e.g., NIR and SWIR ranges) compared to visible wavelengths. A device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

These and other objectives of the present disclosure will become obvious to those of ordinary skill in the art after reading the following detailed description of the alternative embodiments that are illustrated in the various figures and drawings.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION

Figure 1A:
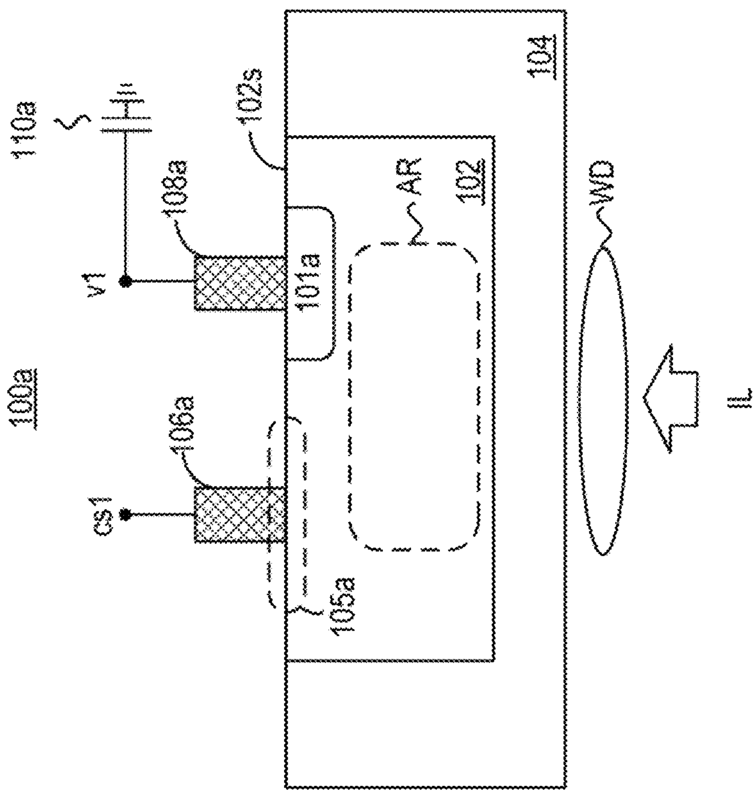
FIGS. 1A-1F illustrate cross-sectional views of a photo-detecting apparatus, according to some embodiments.

FIG. 1A illustrates a cross-sectional view of a photo-detecting apparatus, according to some embodiments. The photo-detecting apparatus 100*a* includes a germanium-based light absorption material 102 supported by the semiconductor substrate 104. In one implementation, the semiconductor substrate 104 is made by silicon or silicon-germanium or germanium or III-V compounds. The germanium-based light absorption material 102 herein refers to intrinsic germanium (100% germanium) or an alloy of elements including germanium, e.g., silicon-germanium alloy, ranging from 1% to 99% Ge concentration. In some implementations, the germanium-based light absorption material 102 may be grown using a blanket epitaxy, a selective epitaxy, or other applicable techniques. The germanium-based light absorption material 102 is embedded in the semiconductor substrate 104 in FIG. 1A, and in alternative embodiments the germanium-based light absorption material 102 may be partially embedded in or may be standing on the semiconductor substrate 104.

The photo-detecting apparatus 100*a* includes a control metal line 106*a* and a readout metal line 108*a*. The control metal line 106*a* and the readout metal line 108*a* are both electrically coupled to the surface 102*s* of the germanium-based light absorption material 102. In this embodiment, the control metal line 106*a* is electrically coupled to an un-doped region 105*a* on the surface 102*s*, where the un-doped region 105*a* has no dopants. The readout metal line 108*a* is electrically coupled to a doped region 101*a* on the surface 102*s*, where the doped region 101*a* has dopants.

It is noted that the germanium-based light absorption material 102 can be formed as intrinsic or extrinsic (e.g., lightly P-type or lightly N-type). Due to the defect characteristics of the germanium material, even if there is no additional doping process introduced, the germanium-based light absorption material 102 may still be lightly P-type. Thus, the un-doped region 105*a* may also be lightly P-type. The doped region 101*a* may be doped with P-type dopants or N-type dopants, depending on the type of photo-carries (i.e. holes or electrons) to be collected. In some implementations, the doped region 101*a* could be doped by thermal-diffusion, ion-implantation, or any other doping process.

The control metal line 106*a* is controlled by a control signal cs1 for controlling the moving direction of the electrons or holes generated by the absorbed photons. Assume that the doped region 101*a* is N-type and the control signal cs1 is at logic 1. An electric field is generated from the control metal line 106*a* to the germanium-based light absorption material 102. The electrons will move toward the control metal line 106*a* and be collected by the doped region 101*a*. On the contrary, if the doped region 101*a* is P-type, the holes will be collected instead. Alternatively, assume that the doped region 101*a* is N-type when the control signal cs1 is at logic 0, a different electric field is generated from the control metal line 106*a* to the germanium-based light absorption material 102. The electrons will not move toward the control metal line 106*a* and so cannot be collected by the doped region 101*a*. On the contrary, if the doped region 101*a* is P-type, the holes will not be collected instead.

Using the structure illustrated in FIG. 1A, the optical signal IL reflected by a target object (not shown in FIG. 1A) and incoming through the optical window WD can be absorbed by the germanium-based light absorption material 102, and generate electron-hole pairs such that the electrons or the holes (depending on whether the doped region 101*a* is N-type and P-type) are moving toward and being stored in the capacitor 110*a* according to the assertion of control signal cs1. The absorbed region AR is a virtual area receiving the optical signal IL incoming through the optical window WD. Due to a distance existing between the photo-detecting apparatus 100*a* and the target object (not shown in FIG. 1A), the optical signal IL has a phase delay with respect to the transmitted light transmitted by a transmitter (not shown in FIG. 1A). When the transmitted light is modulated by a modulation signal and the electron-hole pairs are demodulated through the control metal line 106*a* by a demodulation signal, the electrons or the holes stored in the capacitor 110*a* will be varied according to the distance. Therefore, the photo-detecting apparatus 100*a* can obtain the distance information based on the voltage v1 on the capacitor 110*a*.

The embodiments of FIG. 1A are a one-tap structure because they only use one control metal line 106*a* and one readout metal line 108*a* to obtain the distance information. The disclosed embodiments may also use two or more control lines or readout lines, and varieties of implantations to obtain the distance information, which will be described in detail hereinafter.

Figure 1B:
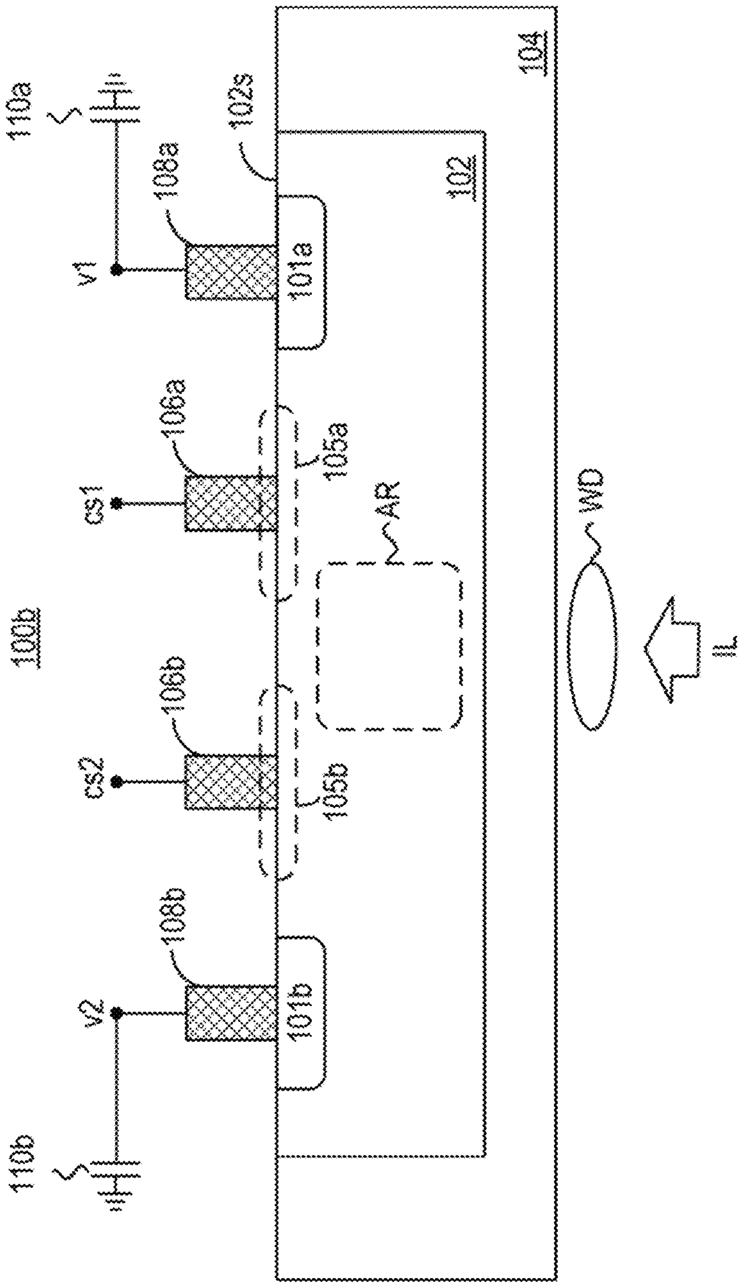

FIG. 1B illustrates a cross-sectional view of a photo-detecting apparatus, according to some embodiments. Compared to the embodiment of FIG. 1A, the photo-detecting apparatus 100*b* in FIG. 1B uses two control metal lines 106*a*, 106*b* to control the movement of the electrons or holes generated by the absorbed photons in the germanium-based light absorption material 102. Such a structure is referred as a two-tap structure. The photo-detecting apparatus 100*b* includes control metal lines 106*a*, 106*b* and readout metal lines 108*a*, 108*b*. The control metal lines 106*a*, 106*b* and the readout metal lines 108*a*, 108*b* are electrically coupled to the surface 102*s* of the germanium-based light absorption material 102. In this embodiment, the control metal lines 106*a*, 106*b* are respectively electrically coupled to the un-doped regions 105*a*, 105*b* on the surface 102*s*, where the un-doped regions 105*a*, 105*c* are the areas without dopants; and the readout metal line 108*a*, 108*b* are respectively electrically coupled to doped regions 101*a*, 101*b* on the surface 102*s*, where the doped regions 101*a*, 101*b* are the areas with dopant. The doped regions 101*a*, 101*b* may be doped with P-type dopants or N-type dopants.

The control metal lines 106*a*, 106*b* are respectively controlled by the control signals cs1, cs2 for controlling the moving direction of the electrons or holes generated by the absorbed photons. In some implementations, the control signals cs1 and cs2 are differential voltage signals. In some implementations, one of the control signals cs1 and cs2 is a constant voltage signal (e.g., 0.5v) and the other control signal is a time-varying voltage signal (e.g., sinusoid signal, clock signal or pulse signal operated between 0V and 1V).

Assume that the doped regions 101*a*, 101*b* are N-type and the control signals cs1, cs2 are clock signals with 180-degree phase different to each other. When the control signal cs1 is at logic 1 and the control signal cs2 is at logic 0, the photo-detecting apparatus 100*b* generates an electric field from the control metal line 106*a* to the germanium-based light absorption material 102, and the electrons will move toward the control metal line 106*a* and then be collected by the doped regions 101*a*. Similarly, when the control signal cs1 is at logic 0 and the control signal cs2 is at logic 1, the photo-detecting apparatus 100*b* generates an electric field from the control metal line 106*b* to the germanium-based light absorption material 102, and the electrons will move toward the control metal line 106*b* and then be collected by the doped region 101*b*. On the contrary, if the doped regions 101*a* and 101*b* are P-type, the holes will be collected instead.

In accordance with this two-tap structure, the optical signal IL reflected from a target object (not shown in FIG. 1B) can be absorbed by the germanium-based light absorption material 102 and generates electron-hole pairs such that the electrons or the holes (depending on the doped region 101*a* is N-type and P-type) move towards and are stored in the capacitor 110*a* or capacitor 110*b*, according to the assertions of control signal cs1 and control signal cs2. Due to a distance existing between the photo-detecting apparatus 100*b* and the target object (not shown in FIG. 1B), the optical signal IL has a phase delay with respect to the transmitted light transmitted by a transmitter (not shown in FIG. 1B). When the transmitted light is modulated by a modulation signal and the electron-hole pairs are demodulated through the control metal lines 106*a* and 106*b* by the demodulation signals, the electrons or the holes stored in the capacitor 110*a* and capacitor 110*b* will be varied according to the distance. Therefore, the photo-detecting apparatus 100*b* can obtain the distance information based on the voltage v1 on the capacitor 110*a* and the voltage v2 on the capacitor 110*b*. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continues-wave time-of-flight configuration, in-phase and quadrature voltages related voltage v1 and voltage v2 are used as input variables.

The control metal line 106*a* in FIG. 1A and control metal lines 106*a*, 106*b* in FIG. 1B are electrically coupled to the un-doped regions of the germanium-based light absorption material 102. In other embodiments, as described below, certain structures and the control metal lines 106*a*, 106*b* are electrically coupled to doped regions.

Figure 1C:
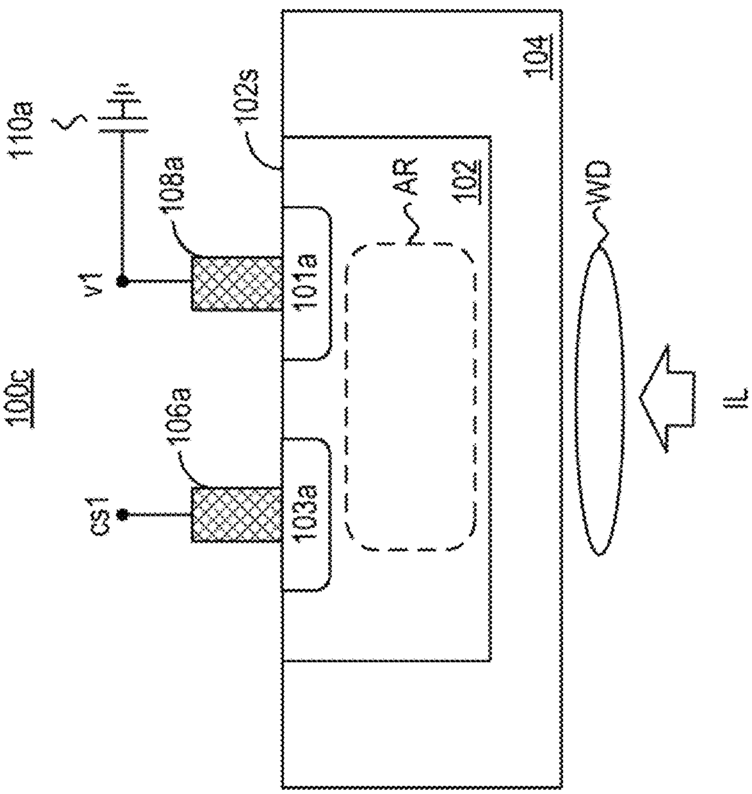

FIG. 1C illustrates a cross-sectional view of a photo-detecting apparatus, according to some embodiments. Similar to FIG. 1A, the photo-detecting apparatus 100*c* includes a control metal line 106*a* and a readout metal line 108*a*. The control metal line 106*a* and the readout metal line 108*a* are both electrically coupled to the surface 102*s* of the germanium-based light absorption material 102. In this embodiment, the control metal line 106*a* is electrically coupled to a doped region 103*a* on the surface 102*s*, where the doped region 103*a* is an area with dopants; and the readout metal line 108 is electrically coupled to a doped region 101*a* on the surface 102*s*, where the doped region 101*a* is also an area with dopants. In this embodiment, the region 101*a* and region 103*a* are doped with dopants of different types. For example, if the doped region 101*a* is doped with N-type dopants, the region 103*a* will be doped with P-type dopants, and vice versa.

The operation of photo-detecting apparatus 100*c* is similar to the embodiment of FIG. 1A. The control metal line 106*a* is used to control the moving direction of the electrons or holes generated by the absorbed photons according to the control signal cs1 to make the electrons or holes being collected by doped region 110*a*. By controlling the control signal cs1 and reading the voltage v1 on the capacitor 110*a*, the photo-detecting apparatus 100*c* can obtain a distance information between the photo-detecting apparatus 100*c* and the target object (not shown in FIG. 1C).

Figure 1D:
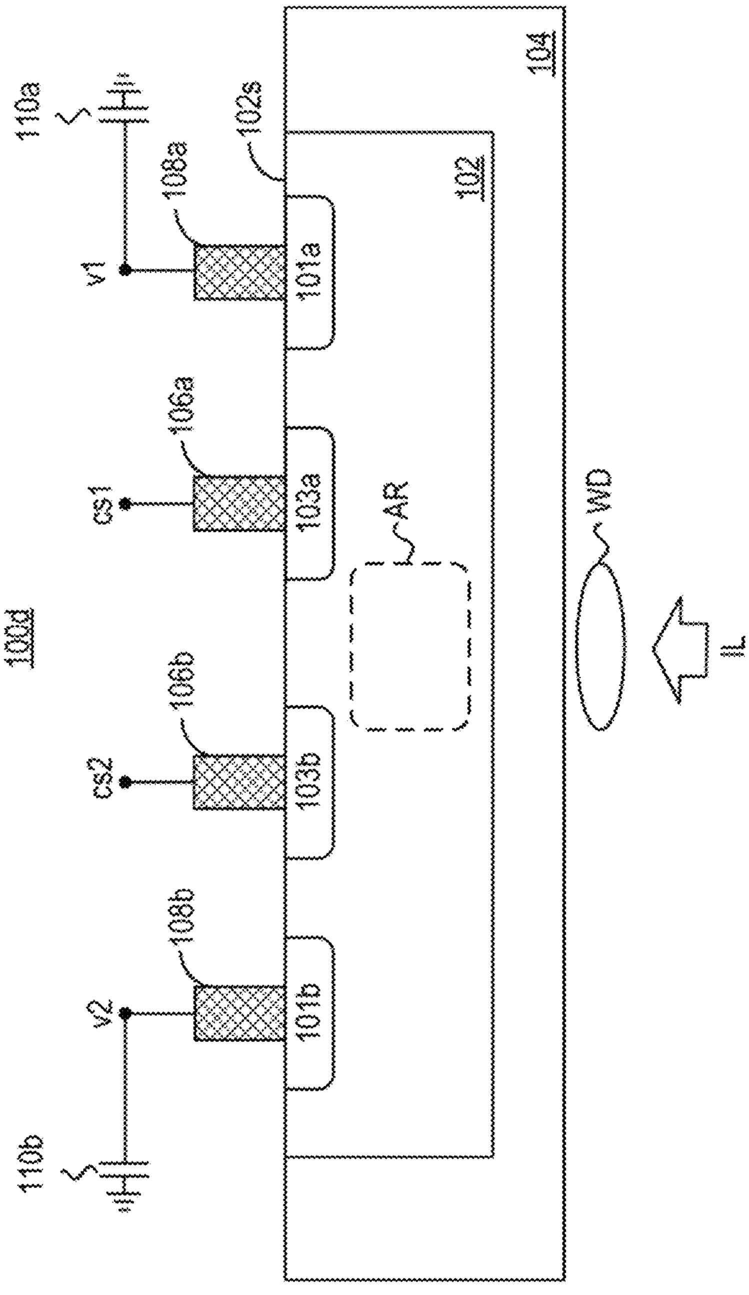

FIG. 1D illustrates a cross-sectional view of a photo-detecting apparatus, according to some embodiments. The photo-detecting apparatus 100*b* includes control metal lines 106*a*, 106*b* and readout metal lines 108*a*, 108*b*. The control metal lines 106*a*, 106*b* and the readout metal lines 108*a*, 108*b* are electrically coupled to the surface 102*s* of the germanium-based light absorption material 102. In this embodiment, the control metal lines 106*a*, 106*b* are respectively electrically coupled to the doped regions 103*a*, 103*b* on the surface 102*s*, where the doped regions 103*a*, 103*b* are areas with dopants. The readout metal line 108*a*, 108*b* are respectively electrically coupled to the doped regions 101*a*, 101*b* on the surface 102*s*, where the doped regions 101*a*, 101*b* are also areas with dopants. The regions 101*a*, 101*b*, 103*a*, 103*b* may be doped with P-type dopants or N-type dopants. In this embodiment, the doped regions 101*a*, 101*b* are doped with a dopant of the same type; and the doped regions 103*a*, 103*b* are doped with a dopant of the same type. However, the type of doped regions 101*a*, 101*b* is different from the type of the doped regions 103*a*, 103*b*. For example, if the doped regions 101*a*, 101*b* are doped as N-type, the doped regions 103*a*, 103*b* will be doped as P-type, and vice versa.

The operation of photo-detecting apparatus 100*d* is similar to the embodiment of FIG. 1B. The control metal lines 106*a*, 106*b* are used to control the moving direction of the electrons or holes generated by the absorbed photons according to the control signals cs1, cs2 to make the electrons or holes being stored in capacitor 110*a* or capacitor 110*b*. By controlling the control signals cs1, cs2 and reading the voltages v1, v2 on the capacitor 110*a*, 110*b*, the photo-detecting apparatus 100*d* can obtain a distance information between the photo-detecting apparatus 100*d* and the target object (not shown in FIG. 1D).

Figure 1E:
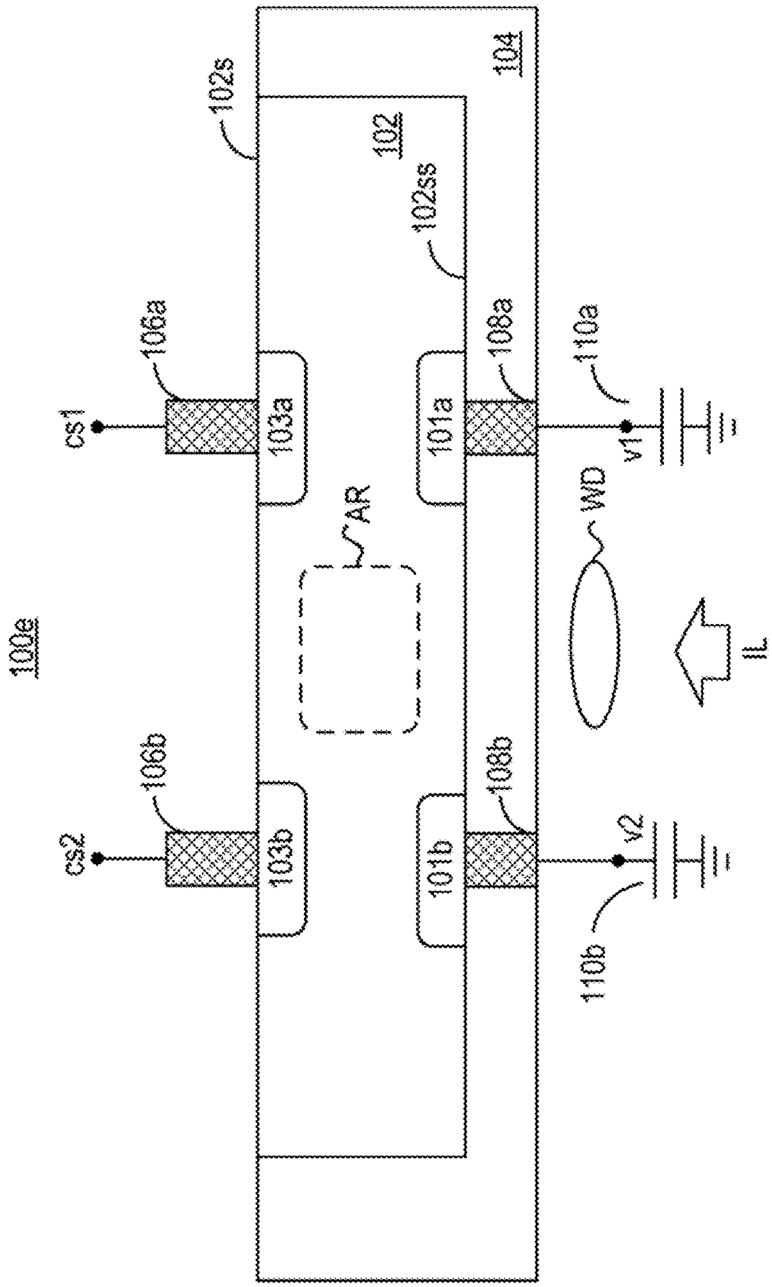

FIG. 1E illustrates a cross-sectional view of a photo-detecting apparatus, according to some embodiments. The operation of the apparatus is similar to FIG. 1D, in which the apparatus is able to obtain to the distance information between the photo-detecting apparatus 100*d* and the target object (not shown in FIG. 1E) by the way of generating the control signals cs1, cs2 and reading the voltages v1, v2 on the capacitor 110*a*, 110*b*. The difference from FIG. 1D is that the readout metal lines 108*a*, 108*b* and doped regions 101*a*, 101*b* are arranged at the surface 102*ss* opposite to the surface 102*s*. Because the control metal lines 106*a*, 106*b* and readout metal lines 108*a*, 108*b* are arranged in a vertical direction, the horizontal area of the photo-detecting apparatus 100*e* can be reduced accordingly.

Figure 1F:
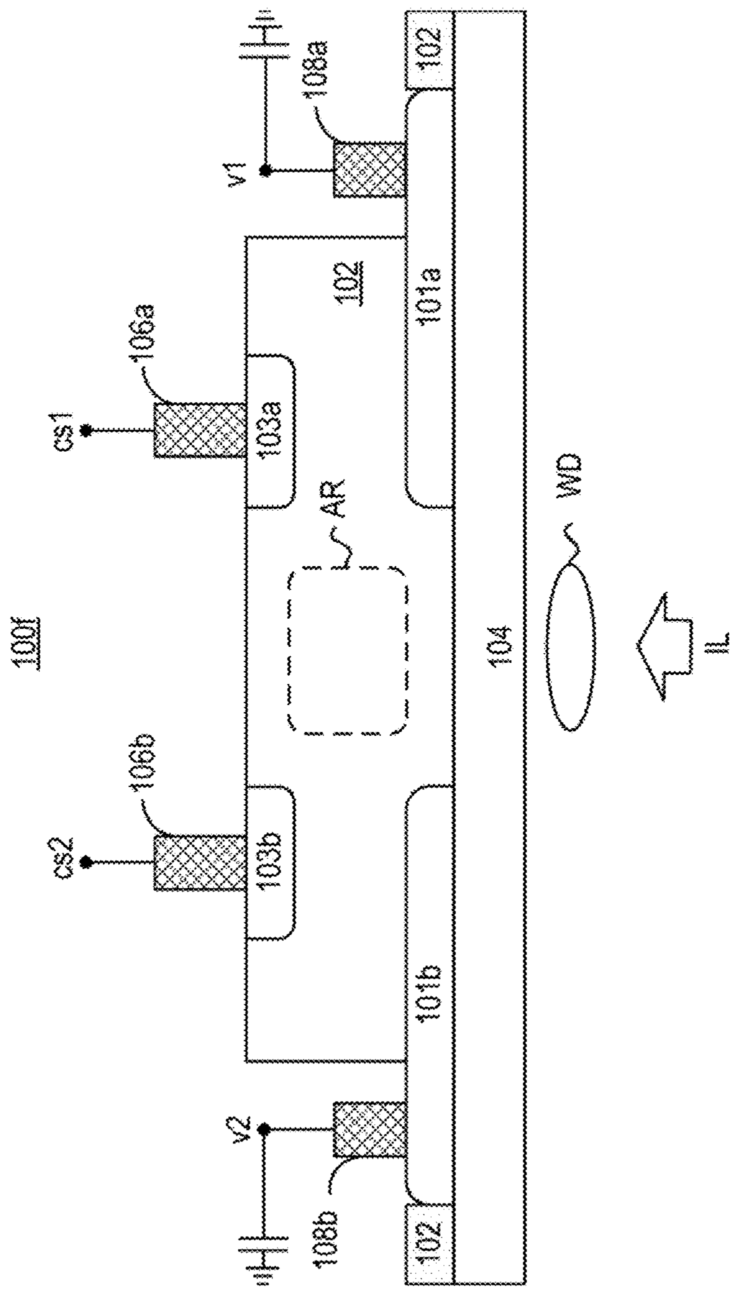

FIG. 1F illustrates a cross-sectional view of a photo-detecting apparatus, according to some embodiments. Compared to FIG. 1E, the embodiment in FIG. 1F also arranges the doped regions 101*a*, 101*b* at the surface 102*ss* opposite to the surface 102*s*, but the readout metal lines 108*a*, 108*b* are extending toward the surface 102s, rather than the semiconductor substrate 104. Such arrangements may simplify the fabrication process.

In some implementations, as the embodiments illustrated in FIG. 1A to FIG. 1F and the embodiments hereinafter, the control metal lines 106a, 106b and the surface 102s can be made as a metal-semiconductor junction (MS junction) with Schottky barrier, or a metal-insulator-semiconductor capacitor (MIS capacitor) by introducing oxide or high-K dielectric materials as the insulator in-between the metal and the semiconductor.

As the embodiments illustrated in FIG. 1A to FIG. 1F and the embodiments hereinafter, the germanium-based light absorption material 102 is made as rectangular from its cross-sectional view, however, in some implementations, the germanium-based light absorption material 102 can be made as inverted trapezoid or other patterns from its cross-sectional view.

The photo-detecting apparatuses illustrated in the present disclosure can be used in time-of-flight (ToF) applications, which may operate at longer wavelengths (e.g., NIR or SWIR range) compared to visible wavelengths. The wavelength could be more than 800 nm, such as 850 nm, 940 nm, 1050 nm, 1064 nm, 1310 nm, 1350 nm, or 1550 nm. On the other hand, the device/material implementer can design/fabricate a 100% germanium or an alloy (e.g., GeSi) with a predetermined percentage (e.g., more than 80% Ge) of germanium, either intrinsic or extrinsic, as a light absorption material to absorb the light at the aforementioned wavelengths.

Although the embodiments herein illustrate that the photo-detecting apparatus absorbs the optical signal IL from a back side, however, in some implementations, the photo-detecting apparatus can be designed to absorb the optical signal IL from a front side, e.g., by creating an optical window WD between the two control metal lines 106a, 106b.

The embodiments illustrated in FIG. 1A to FIG. 1F include a single photodetector, which can serve as a unit and be applied to each pixel of a pixel array. The following descriptions are alternative embodiments based on either one-tap or two-tap structures disclosed in FIG. 1A to FIG. 1F. In the following descriptions, one or two embodiments from FIG. 1A to FIG. 1F may be selected as a representative embodiment. The person skilled in the art can change, modify or combine the structures disclosed herein, such as replace two-tap structure with one-tap structure.

Figure 2A:
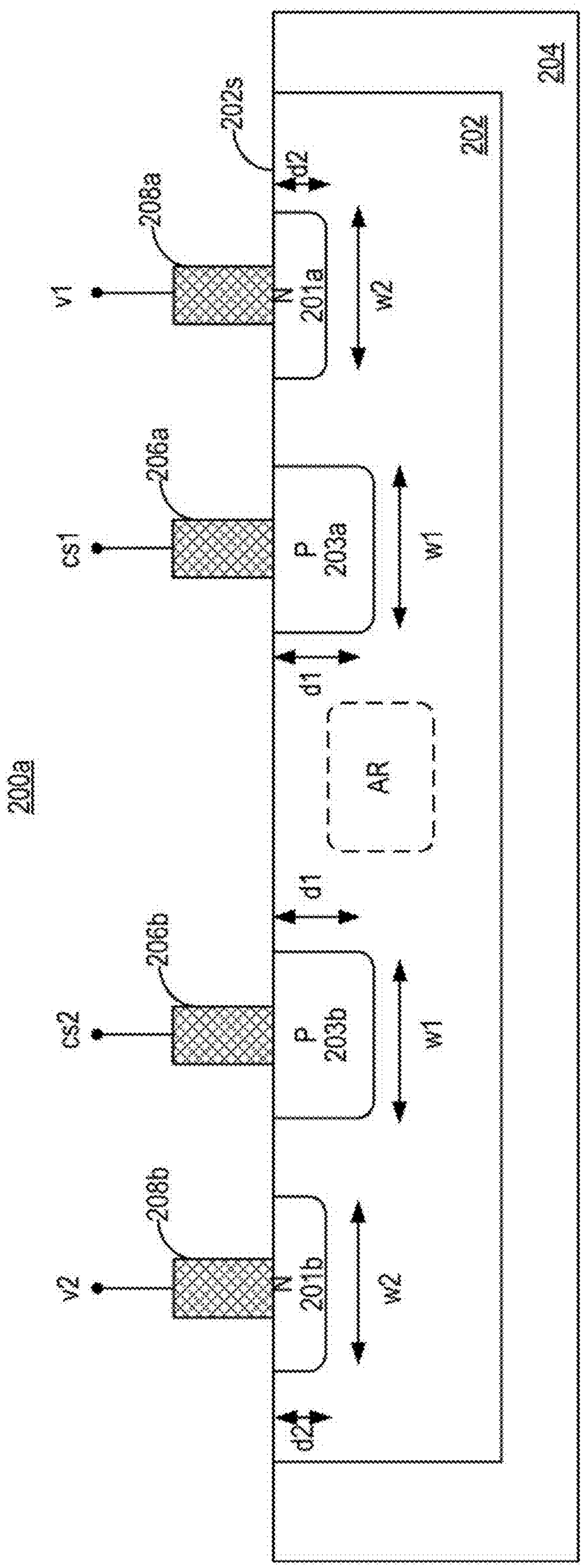
FIGS. 2A-2H illustrate cross-sectional views of a photo-detecting apparatus with body depletion mode, according to some embodiments.

FIG. 2A illustrates a cross-sectional view of a photo-detecting apparatus with body depletion mode, according to some embodiments. The photo-detecting apparatus 200a includes control metal lines 206a, 206b and readout metal lines 208a, 208b. The control metal lines 206a, 206b and the readout metal lines 208a, 208b are electrically coupled to the surface 202s of the germanium-based light absorption material 202. The control metal lines 206a, 206b are respectively electrically coupled to the P-type regions 203a, 203b on the surface 202s, and the readout metal line 208a, 208b are respectively electrically coupled to the N-type regions 201a, 201b on the surface 202s. In some embodiments, the depth d1 of the P-type regions 203a, 203b extending from the surface 202s is deeper than the depth d2 of the N-type regions 201a, 201b, and the germanium-based light absorption material 202 is lightly N-type. With deeper P-type regions 203a, 203b, larger depletion regions are created between the deeper P-type regions 203a, 203b and the N-type germanium-based light absorption material 202, which may allow electrons moving toward the N-type regions 201a, 201b when two different voltages are applied to the control metal lines 206a, 206b and therefore increases the quantum efficiency and the demodulation contrast. In other aspects, the width w1 of P-type regions 203a, 203b, the width w2 of N-type regions 201a, 201b, the doping concentration of P-type regions 203a, 203b, and/or the doping concentration of N-type regions 201a, 201b are also the parameters to adjust the area of the depletion regions.

In some embodiments, to fully deplete the body of the N-type germanium-based light absorption material 202, one can design through the N-type regions 201a, 201b and/or P-type regions 203a, 203b, either through its depths, widths or doping concentrations. Also, the thickness of the germanium-based light absorption material 202 should be designed accordingly.

Figure 2B:
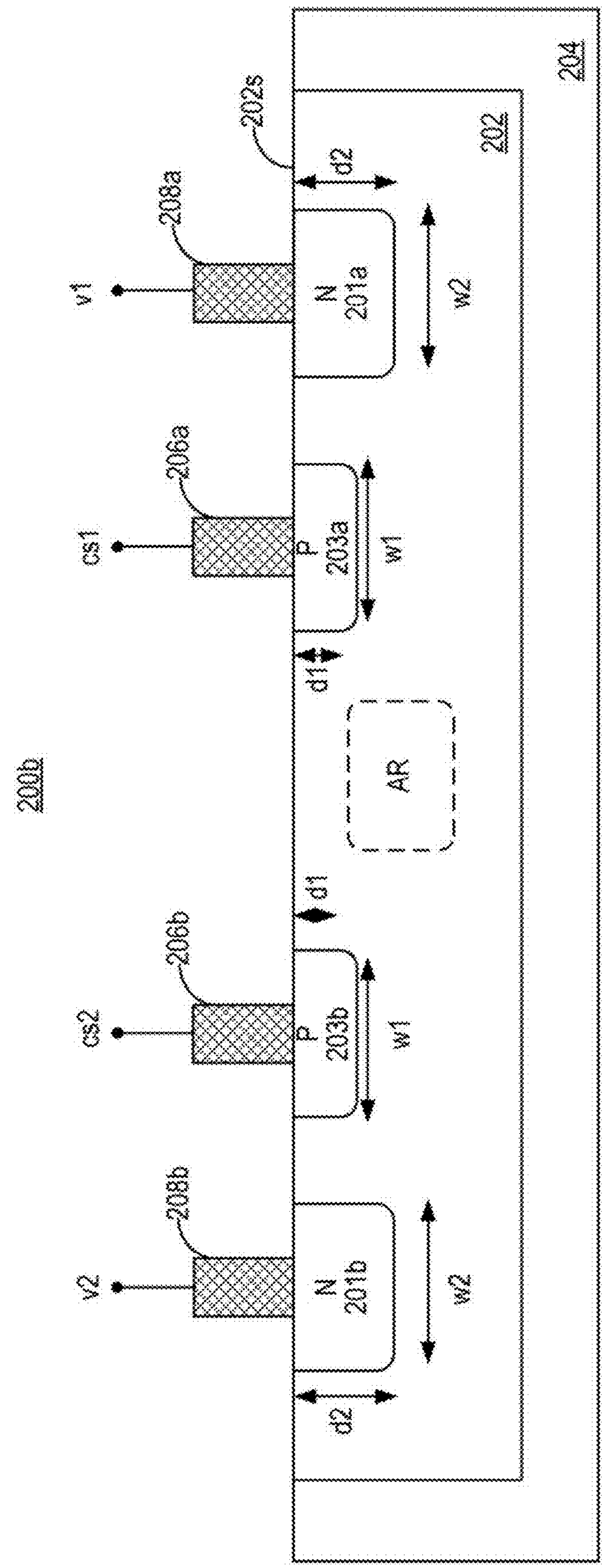

FIG. 2B illustrates a cross-sectional view of a photo-detecting apparatus with body depletion mode, according to some embodiments. The photo-detecting apparatus 200b can be designed with shallower P-type regions 203a, 203b. In other words, the depth d1 of the P-type regions 203a, 203b extending from the surface 202s is shallower than the depth d2 of the N-type regions 201a, 201b. Applying shallower P-type regions 203a, 203b may reduce the leakage between the P-type region 203a and P-type region 203b.

Figure 2C:
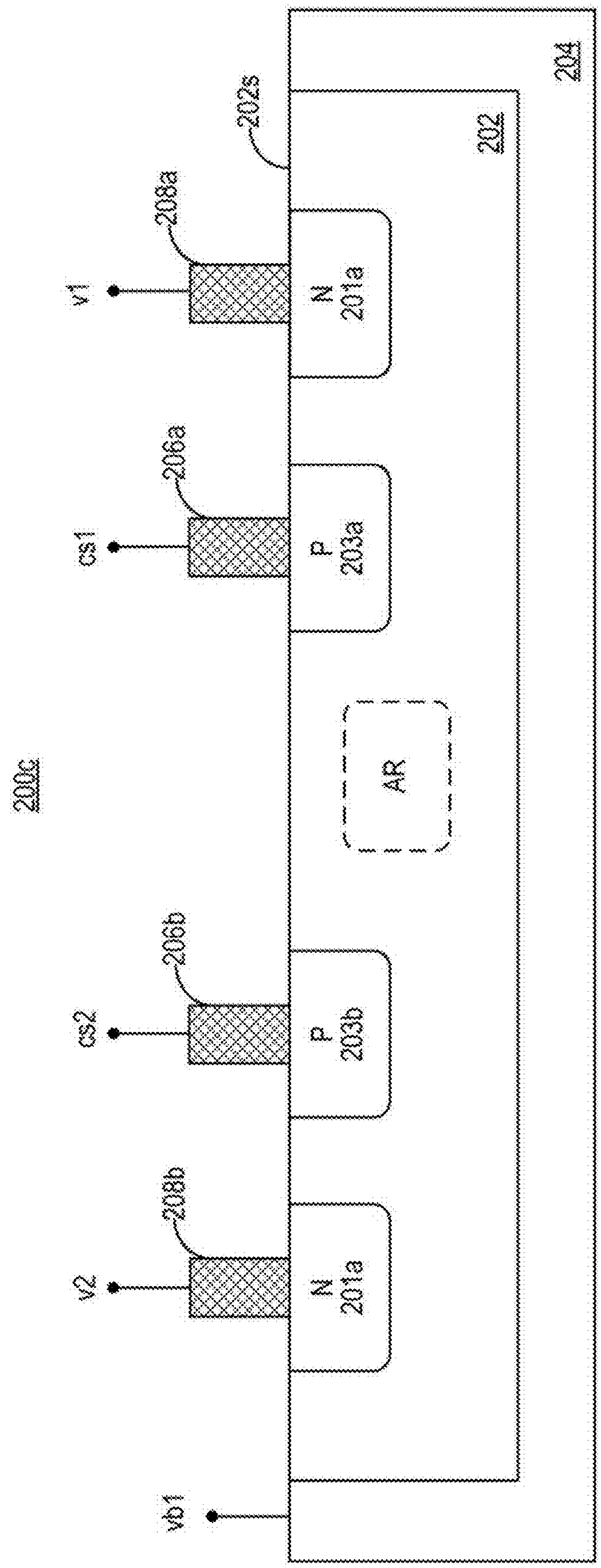

FIG. 2C illustrates a cross-sectional view of a photo-detecting apparatus with body depletion mode, according to some embodiments. The structure of photo-detecting apparatus 200c is similar to the photo-detecting apparatus 200a, 200b. The photo-detecting apparatus 200c applies a bias voltage vb1 on the semiconductor substrate 204. This bias voltage vb1 is applied for creating a reverse bias across the junctions between the N-type germanium-based light absorption material 202 and the P-type regions 203a, 203b. As a result, the depletion region underneath the P-type regions 203a, 203b can be enlarged or even fully depleted. Due to the larger depletion regions generated underneath the P-type regions 203a, 203b, it may make allow electrons moving toward the N-type regions 201a, 201b when two different voltages are applied to the control metal lines 206a, 206b and thus increases the quantum efficiency and the demodulation contrast.

Figure 2D:
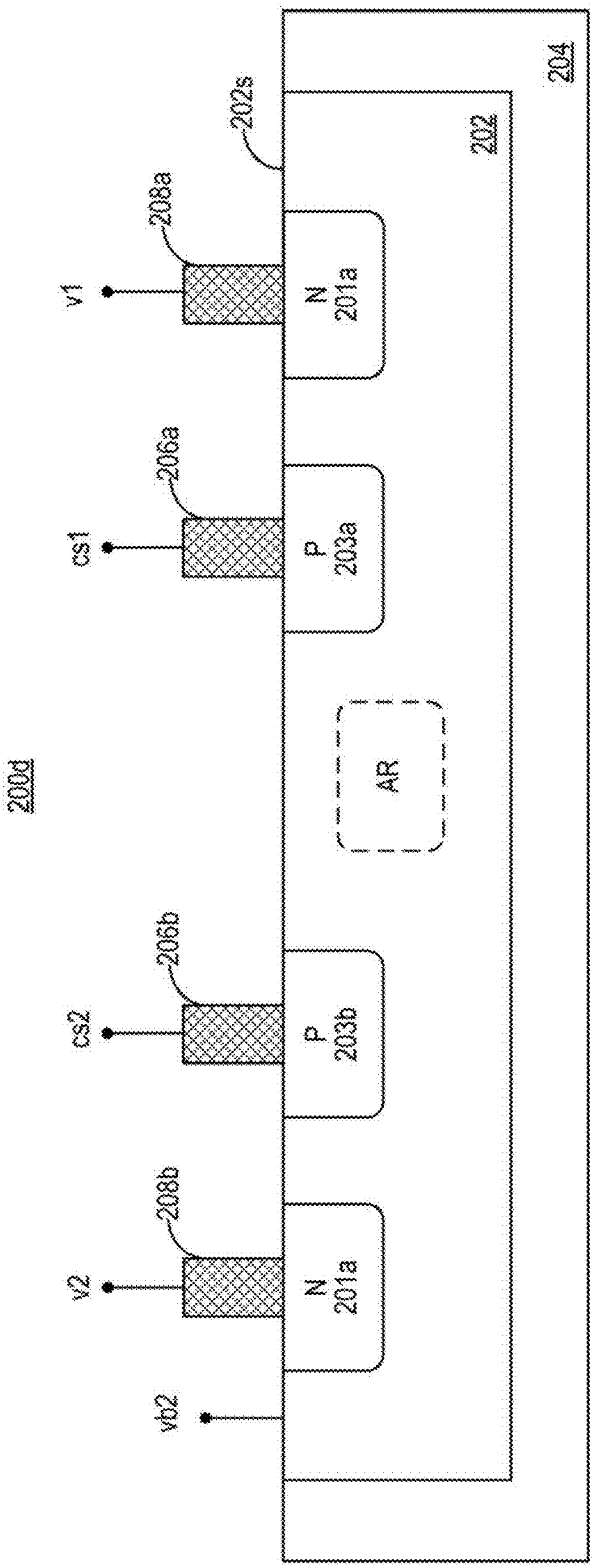

FIG. 2D illustrates a cross-sectional view of a photo-detecting apparatus with body depletion mode, according to some embodiments. Similar to the structure of photo-detecting apparatuses 200a, 200b, this embodiment applies a bias voltage vb2 on the germanium-based light absorption material 202 to control the depletion regions inside the germanium-based light absorption material 202. Specifically, the bias voltage vb2 is a reverse bias to the P-type regions 203a, 203b and the N-type germanium-based light absorption material 202, and so be able to enlarge the depletion regions surrounding the P-type regions 203a, 203b or even being fully depleted.

Figure 2E:
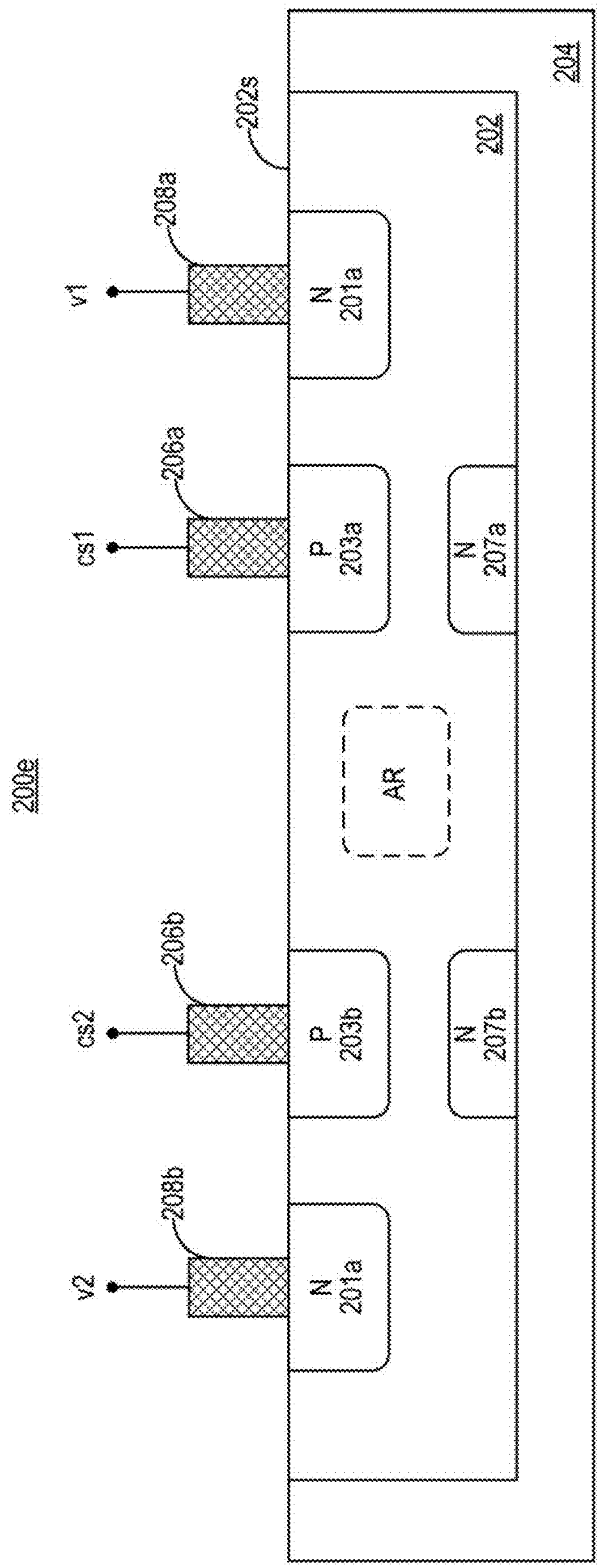

In order to create even larger depletion regions inside the germanium-based light absorption material 202, the embodiment shown in FIG. 2E is disclosed. The photo-detecting apparatus 200e includes N-type regions 207a, 207b on the surface 202ss. The surface 202ss is opposite to the surface 202s. With the N-type regions 207a, 207b, PN junctions are formed in which a depletion region between P-type region 203a and N-type region 207a, and a depletion region between P-type region 203b and N-type region 207b, are generated. Consequently, electric fields are created in the absorption region when two different voltages are applied to the control metal lines 206a, 206b. Therefore, the said depletion regions/electrical fields can be controlled by control signals cs1, cs2 to control the electron moving direction, either toward N-type region 201*a* or N-type region 201*b*.

Figure 2F:
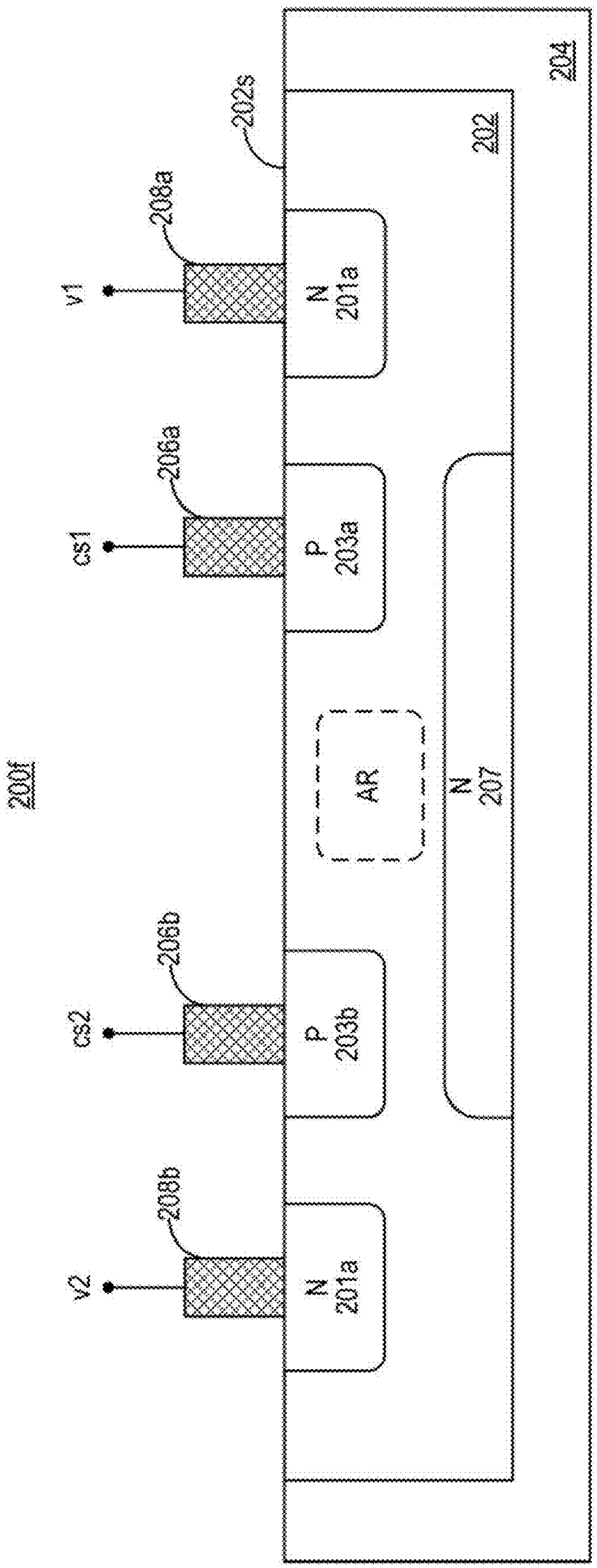

FIG. 2F illustrates a cross-sectional view of a photo-detecting apparatus with body depletion mode, according to some embodiments. The photo-detecting apparatus 200*f* includes a wider N-type region 207, which is located underneath the P-type regions 203*a*, 203*b*. Similarly, the N-type region 207 may enhance the generation of the depletion regions surrounding the P-type regions 203*a*, 203*b* and therefore increase the quantum efficiency and the demodulation contrast. It is noted that the width of the N-type region 207 is designable, and the width of the N-type region 207 in FIG. 2F is depicted for a reference.

Figure 2G:
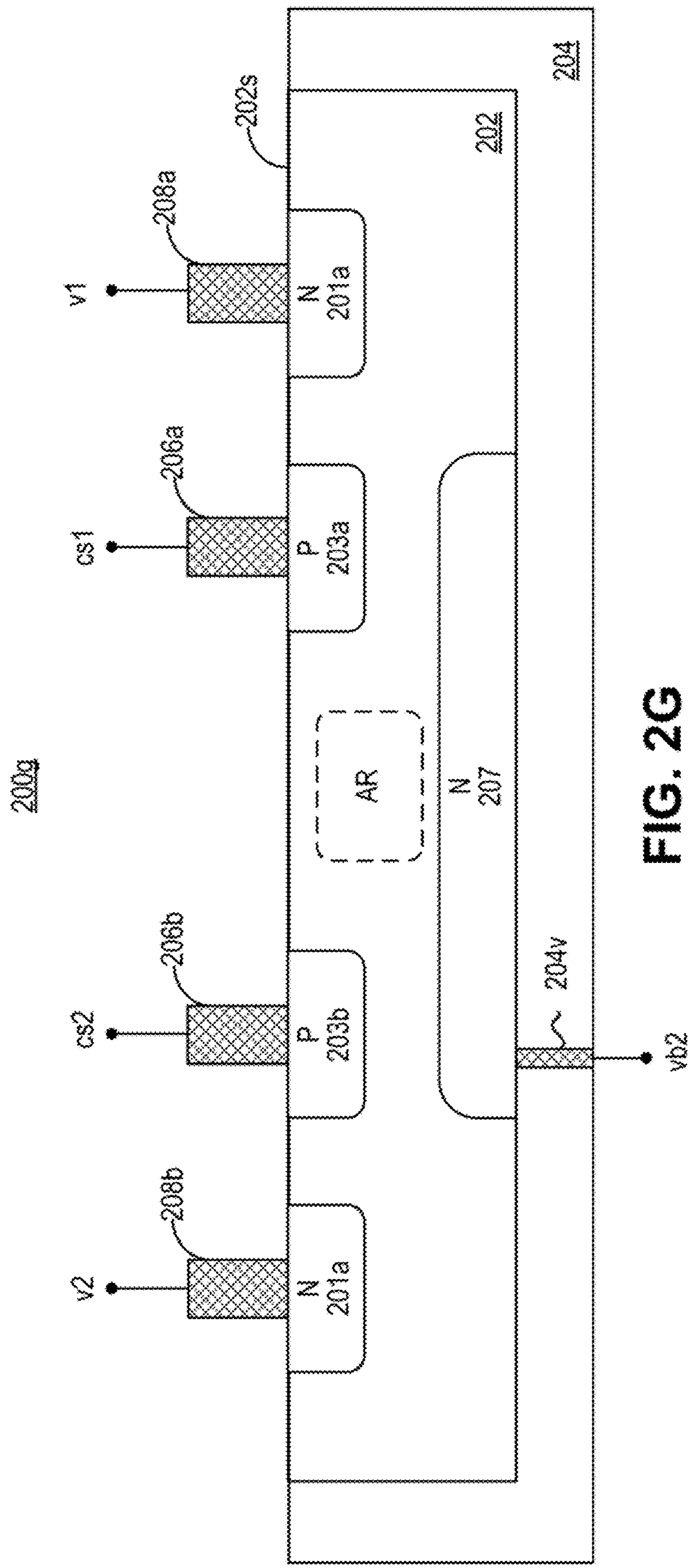
Figure 2H:
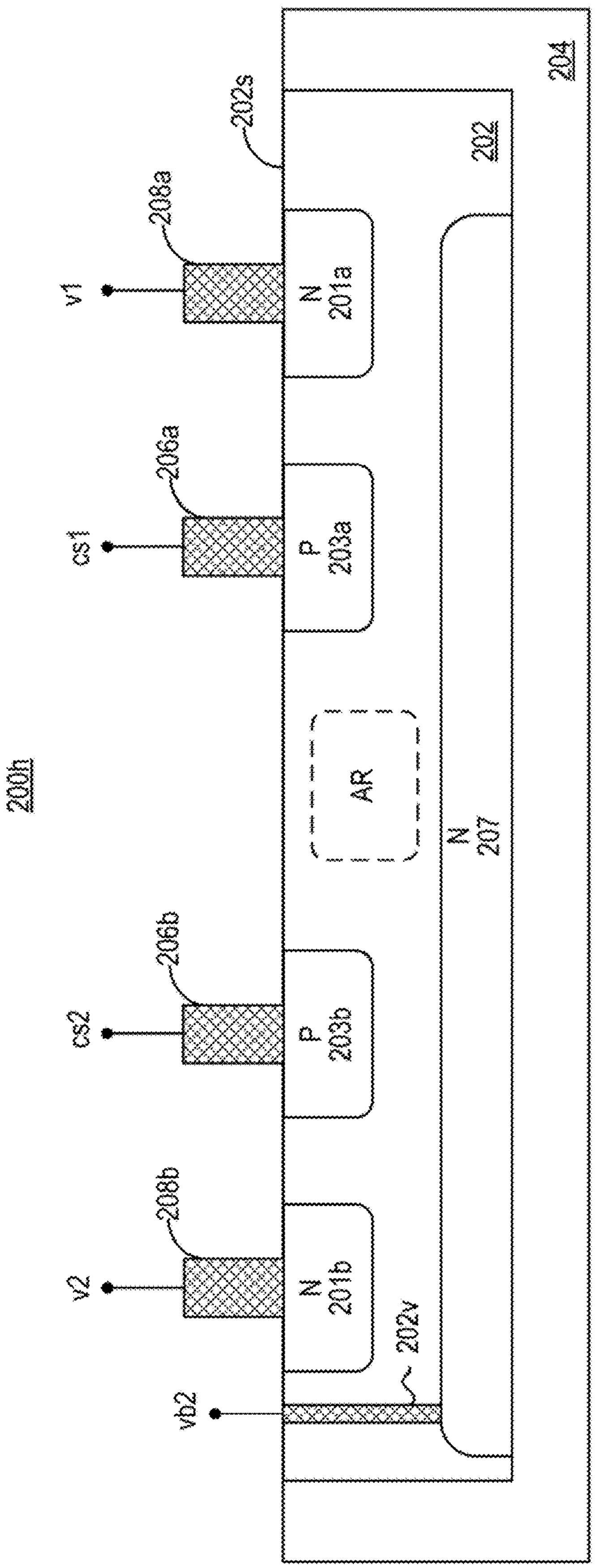

FIG. 2G and FIG. 2H illustrate alternative embodiments showing an approach to bias the N-type region 207. FIG. 2G applies a through-silicon-via (TSV) 204*v* to bias the N-type region 207, and FIG. 2G applies a through-germanium-via 202*v* extending from surface 202*s* to bias N-type region 207.

FIG. 2A to FIG. 2H illustrate a variety of embodiments using body depletion modes, including designing the depth of P-type regions 203*a*, 203*b*, applying bias voltages vb1, vb2 on either on semiconductor substrate 204 or germanium-based light absorption material 202, adding N-type regions 207, 207*a*, 207*b* inside the germanium-based light absorption material 202, etc. These approaches create the depletion regions underneath or surrounding the P-type regions 203*a*, 203*b* to control the moving of the electrons generated from the absorbed photons, either toward N-type region 201*a* or N-type region 201*b*.

Figure 3A:
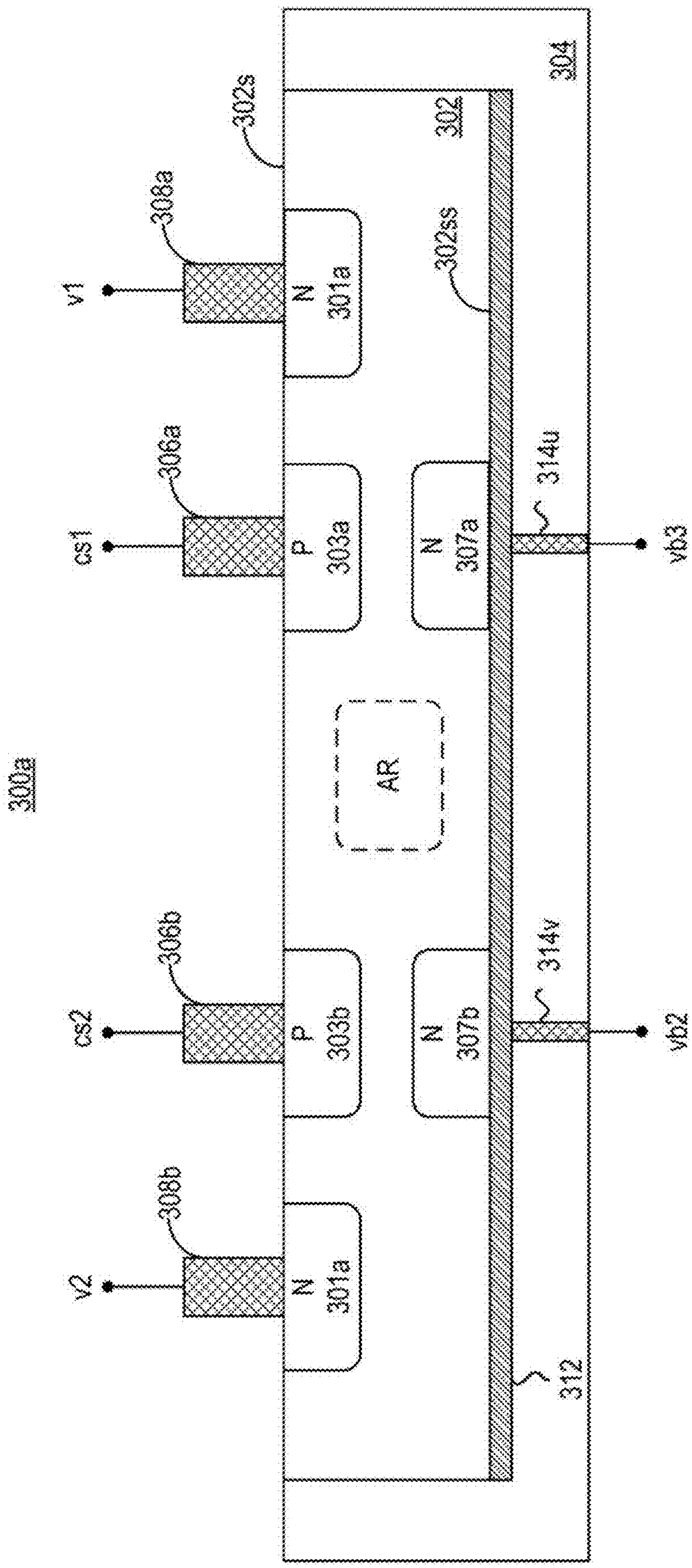
FIGS. 3A-3B illustrate cross-sectional views of a photo-detecting apparatus with gated body depletion mode, according to some embodiments.
Figure 3B:
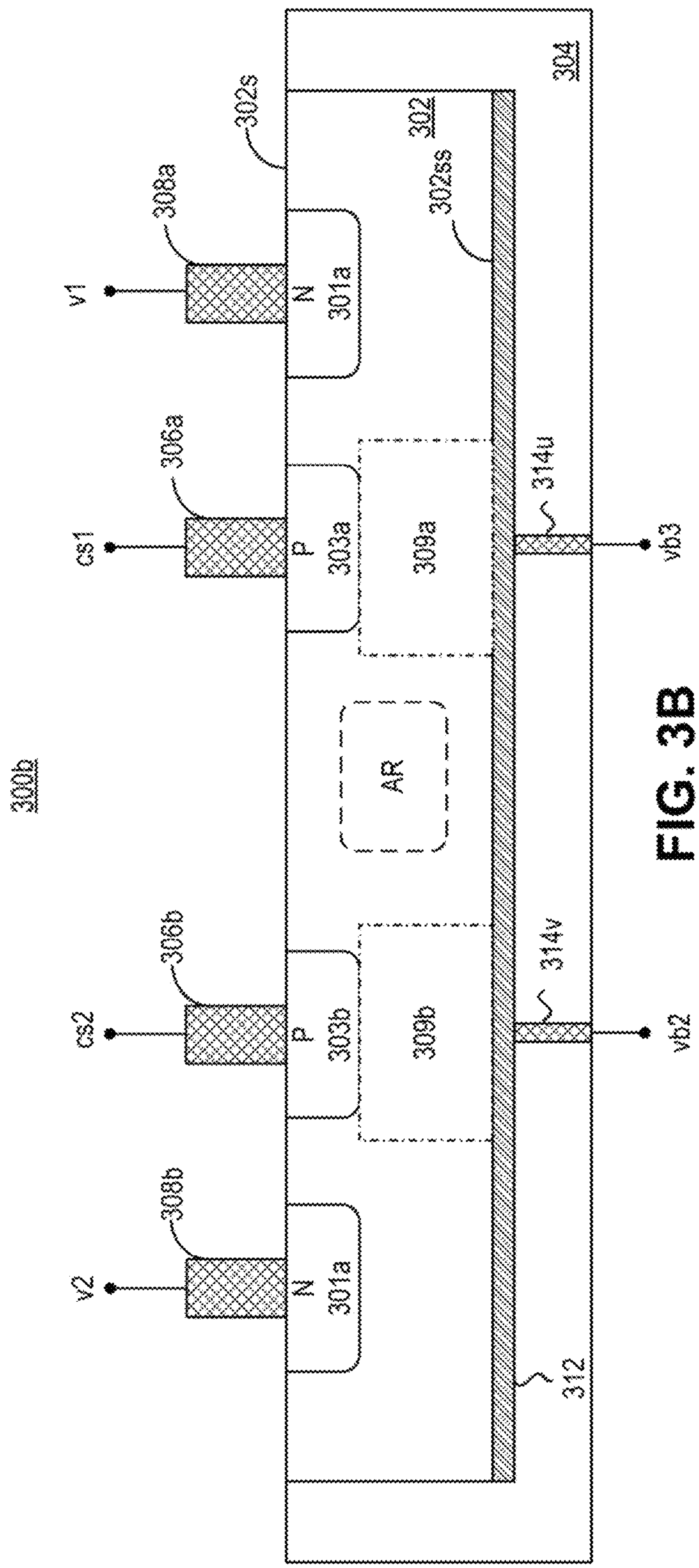

FIGS. 3A-3B illustrate cross-sectional views of a photo-detecting apparatus with gated body depletion mode, according to some embodiments Further to the embodiments illustrated in FIGS. 2A-2H, dielectric-gated body depletion modes are disclosed in FIGS. 3A-3B. The photo-detecting apparatus 300*a* includes control metal lines 306*a*, 306*b* and readout metal lines 308*a*, 308*b*. The control metal lines 306*a*, 306*b* and the readout metal lines 308*a*, 308*b* are electrically coupled to the surface 302*s* of the germanium-based light absorption material 302. The control metal lines 306*a*, 306*b* are respectively electrically coupled to the P-type regions 303*a*, 303*b* on the surface 302*s*, and the readout metal line 308*a*, 308*b* are respectively electrically coupled to the N-type regions 301*a*, 301*b* on the surface 202*s*. The germanium-based light absorption material 302 is lightly N-type. Furthermore, the photo-detecting apparatus 300*a* includes a N-type region 307 on the surface 302*ss*, and a dielectric layer 312 formed between the germanium-based light absorption material 302 and the semiconductor substrate 304, and a through silicon via (TSV) 314. In some embodiments, a dielectric layer 312 is arranged between a metal (via 314) and semiconductor (germanium-based light absorption material 302), which forms a MOS-like structure. With the dielectric layer 312 formed between the N-type region 307 and via 314, it may reduce or prevent the electrons from flowing into N-type region 307 to leak through via 314.

In some alternative embodiments, the dielectric layer 312 may not necessarily be continuous layer across the whole semiconductor substrate 304 but can be patterned into different regions located underneath N-type region 307. The dielectric layer 312 may be thin or with some predetermined thickness, including multiple kinds or layers of materials or alloy or compounds. For example, $SiO_2$, SiNx, high-K dielectric material or a combination of thereof.

FIG. 3B illustrates a cross-sectional view of a photo-detecting apparatus with gated body depletion mode, according to some embodiments. This embodiment has no N-type region 307 on the surface 302*ss*, but generates the depletion regions 309*a*, 309*b* through the body bias vb2 and vb3. The body bias vb2 and body bias vb3 may be jointly applied or individually applied to control the size of the depletion regions 309*a*, 309*b*. The individually applied voltage of the body bias vb2 and the individually applied voltage of body bias vb3 may be the same or different.

Either in FIG. 3A or FIG. 3B, these embodiments insert a dielectric layer 312 between the germanium-based light absorption material 302 and semiconductor substrate 304, and generate the depletion regions (e.g., 309*a*, 309*b* in FIG. 3B) underneath the P-type regions 303*a*, 303*b* according to the control signals cs1, cs2 and body bias vb2, vb3 so as to control the electron moving direction inside the germanium-based light absorption material 302. Due to the insertion of the dielectric layer 312, it may reduce or prevent the electrons from flowing into the N-type region 307 (FIG. 3A) and the depletion regions 309*a*, 309*b* (FIG. 3B) to leak through via 314 (both FIGS. 3A and 3B).

Figure 4A:
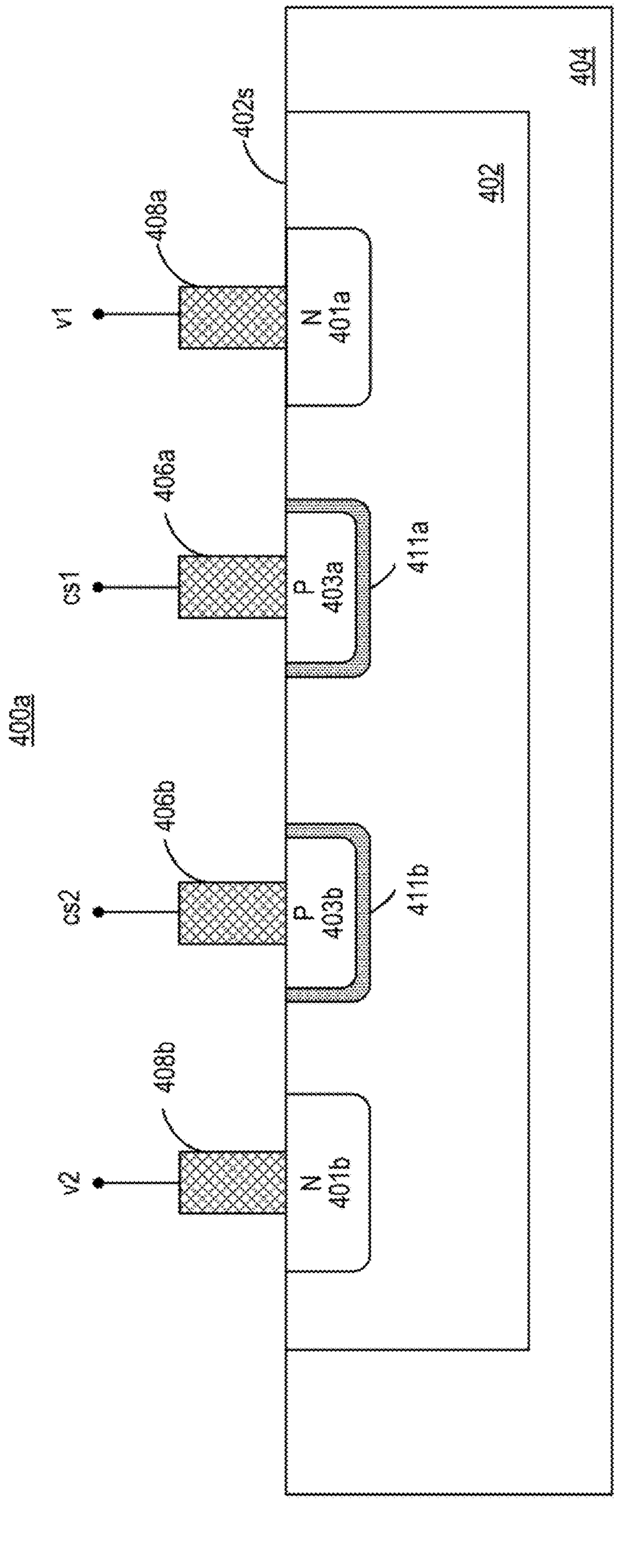
FIGS. 4A-4D illustrate cross-sectional views of a photo-detecting apparatus with a lower leakage current and a lower dark current, according to some embodiments.
Figure 4B:
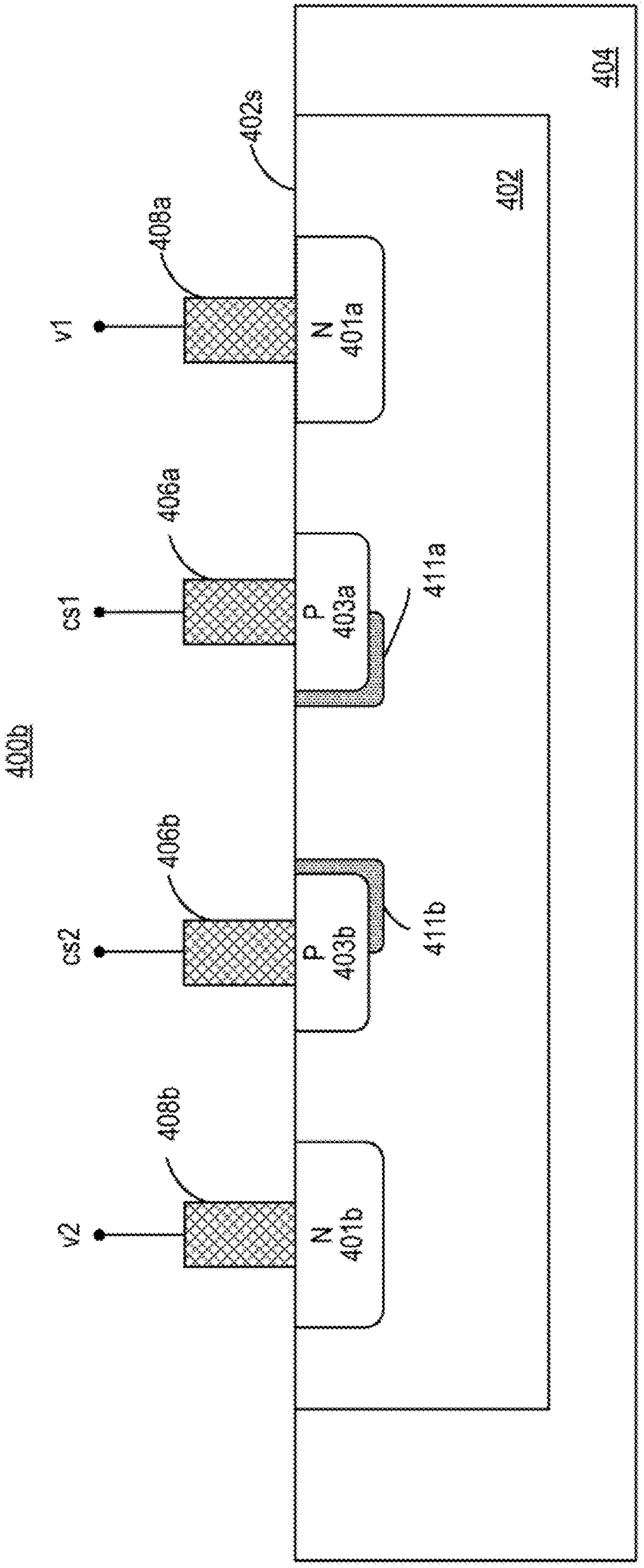

FIG. 4A illustrates a cross-sectional view of a photo-detecting apparatus with a lower leakage current and a lower dark current, according to some embodiments. The photo-detecting apparatus 400*a* includes control metal lines 406*a*, 406*b* and readout metal lines 408*a*, 408*b*. The control metal lines 406*a*, 406*b* and the readout metal lines 408*a*, 408*b* are electrically coupled to the surface 402*s* of the germanium-based light absorption material 402. The control metal lines 406*a*, 406*b* are respectively electrically coupled to the P-type regions 403*a*, 403*b* on the surface 402*s*, and the readout metal line 408*a*, 408*b* are respectively electrically coupled to the N-type regions 401*a*, 401*b* on the surface 402*s*. The operation of the apparatus in FIG. 4A is similar to the embodiments disclosed above. The embodiment of FIG. 4A adds N-wells 411*a*, 411*b* fully surrounding the P-type regions 403*a*, 403*b*. This may have the effect of reducing the leakage current between P-type regions 403*a*, 403*b*. In an alternative embodiment, the N-wells 411*a*, 411*b* can be added partially surrounding the P-type regions 403*a*, 403*b* as shown in FIG. 4B. This also has the effect of reducing the leakage current between P-type regions 403*a*, 403*b*.

Figure 4C:
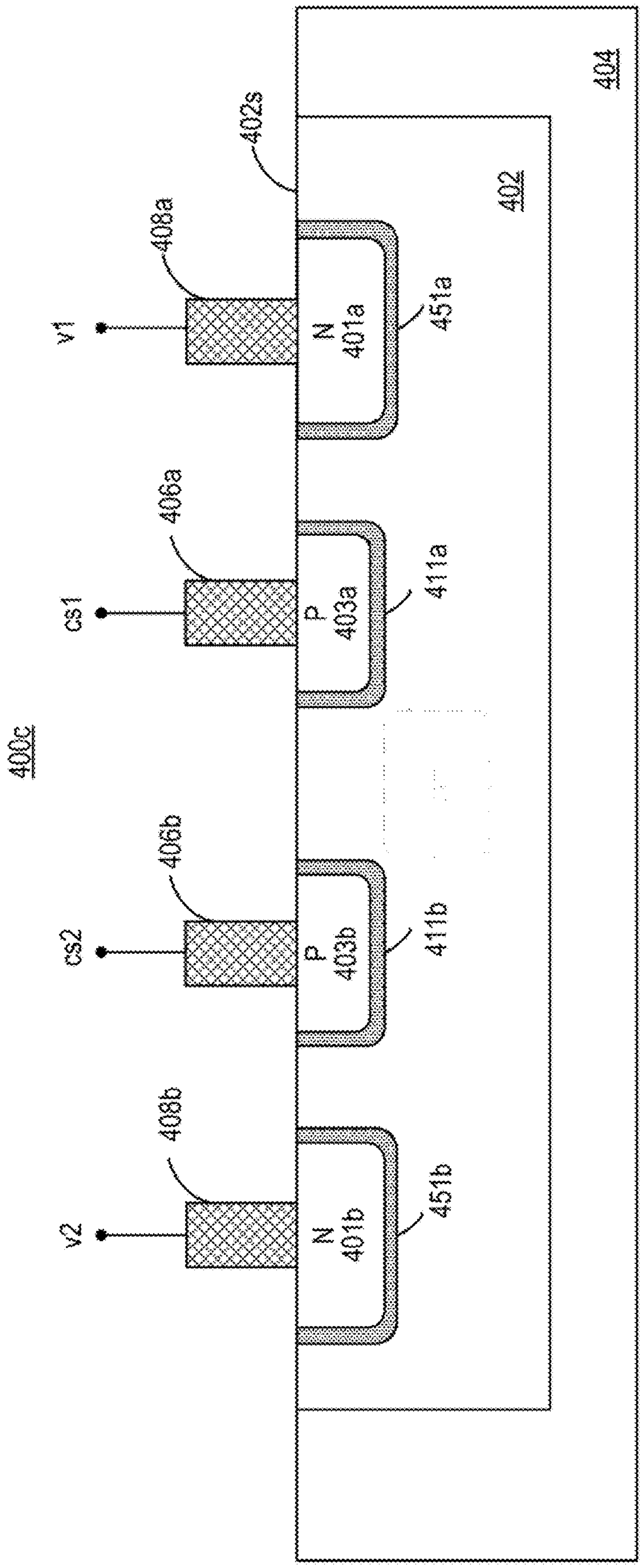
Figure 4D:
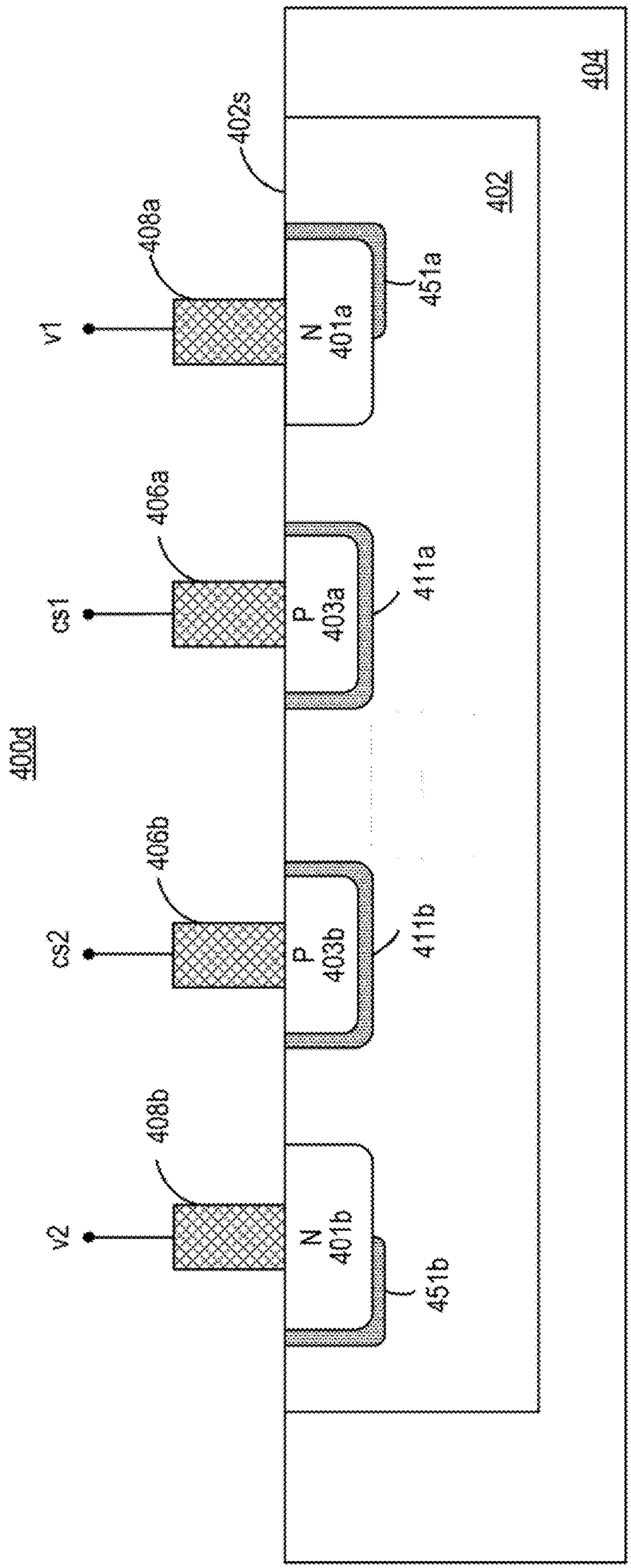

Further to the embodiments illustrated in FIG. 4A and FIG. 4B, P-wells may be added. The embodiment of FIG. 4C adds P-wells 451*a*, 451*b* fully surrounding the N-type regions 401*a*, 401*b*. This may have the effect of reducing the dark currents occurred at N-type regions 401*a*, 401*b*. In an alternative embodiment, the P-wells 451*a*, 451*b* can be added partially surrounding the N-type regions 401*a*, 401*b* as shown in FIG. 4D. This also has the effect of reducing the dark currents occurred at N-type regions 401*a*, 401*b*.

The embodiments illustrated in FIGS. 4A-4D apply N-wells and P-wells to reduce the leakage current and dark current, respectively. The person skilled in the art can change or modify the patterns of the N-wells 411*a*, 411*b* and/or P-wells 451*a*, 451*b* depending on the design requirements. For example, the N-well 411*a* can be designed fully surrounding the P-type regions 403*a* in an asymmetrical way (e.g., the left-hand side width of the N-well 411*a* is wider than the right-hand side width of the N-well 411*a*). Similarly, N-well 411*b* can also be designed fully surrounding the P-type regions 403*b* in an asymmetrical way (e.g., the right-hand side width of the N-well 411*b* is wider than the left-hand side width of the N-well 411*b*). Similar or modified implementations may also be applied to P-wells 451*a*, 451*b*.

Figure 5:
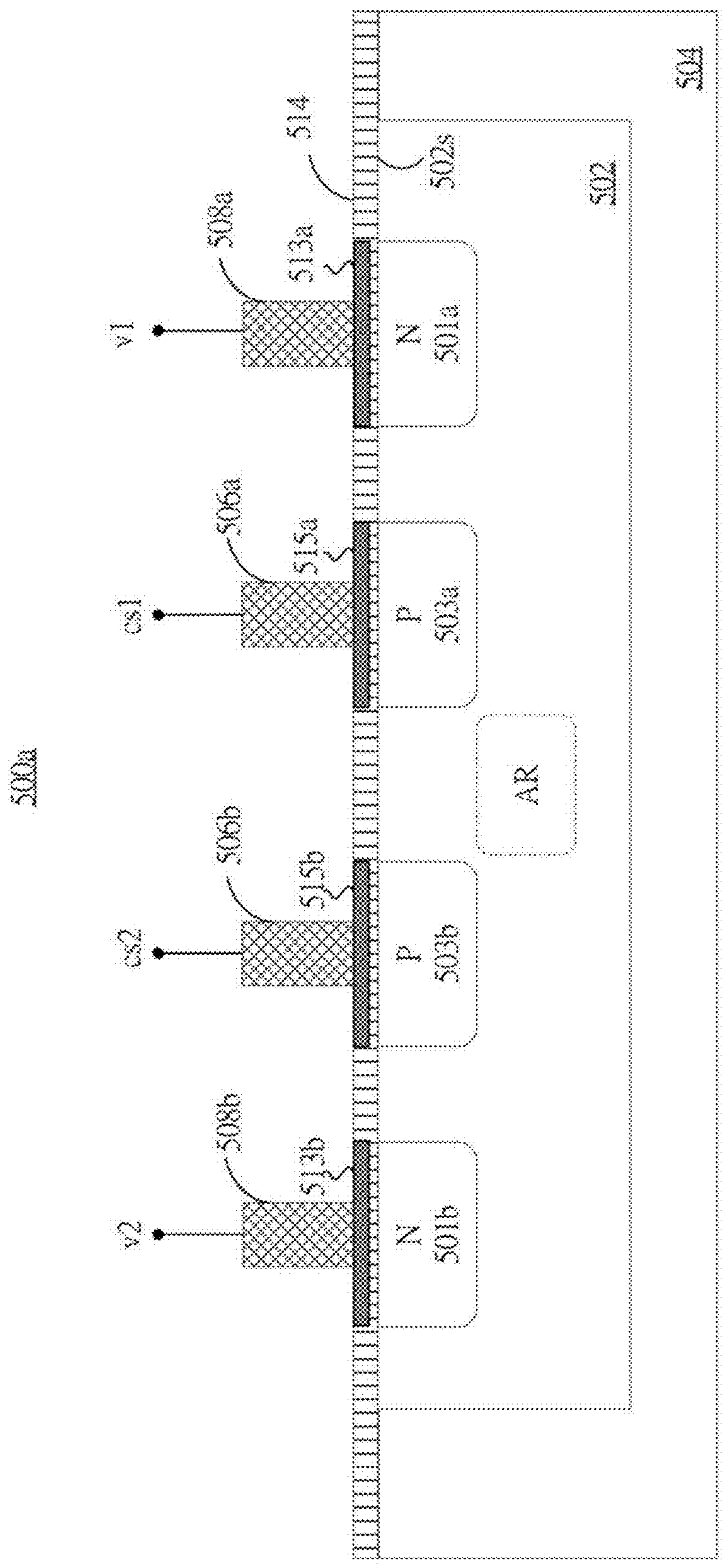
FIG. 5 illustrates a cross-sectional view of a photo-detecting apparatus with passivation layer, according to some embodiments.

FIG. 5 illustrates a cross-sectional view of a photo-detecting apparatus with passivation layer, according to some embodiments. The photo-detecting apparatus 500*a* includes control metal lines 506*a*, 506*b* and readout metal lines 508*a*, 508*b*. The control metal lines 506*a*, 506*b* and the readout metal lines 508*a*, 508*b* are electrically coupled to the surface 502*s* of the germanium-based light absorption material 502. The control metal lines 506*a*, 506*b* are respectively electrically coupled to the P-type regions 503*a*, 503*b* on the surface 502*s*, and the readout metal lines 508*a*, 508*b* are respectively electrically coupled to the N-type regions 501*a*, 501*b* on the surface 502*s*. The embodiment of FIG. 5 adds a passivation layer 514 (e.g., amorphous-silicon (a-Si), GeOx, Al2O3, $SiO_2$) over the surface 502*s*, adds a silicide (e.g., NiSi2, CoSi2) 513*a* at the connection between the readout metal line 508*a* and the N-type region 501*a*, adds a silicide 513*b* at the connection between the readout metal line 508*b* and the N-type region 501*b*, adds a silicide 515*a* at the connection between the control metal line 506*a* and the P-type region 503*a*, and adds a silicide 515*b* at the connection between the control metal line 506*b* and the P-type region 503*b*.

In accordance with this embodiment, forming the passivation layer 514 over the germanium-based light absorption material 502 can terminate the dangling bonds on the surface 502*s* and so reduce the dark currents. On the other hand, adding the silicide (e.g., NiSi2, CoSi2) can also reduce the contact or junction resistance between the metal and semiconductor, which reduces the voltage drop and reduces power consumption accordingly.

Figure 6A:
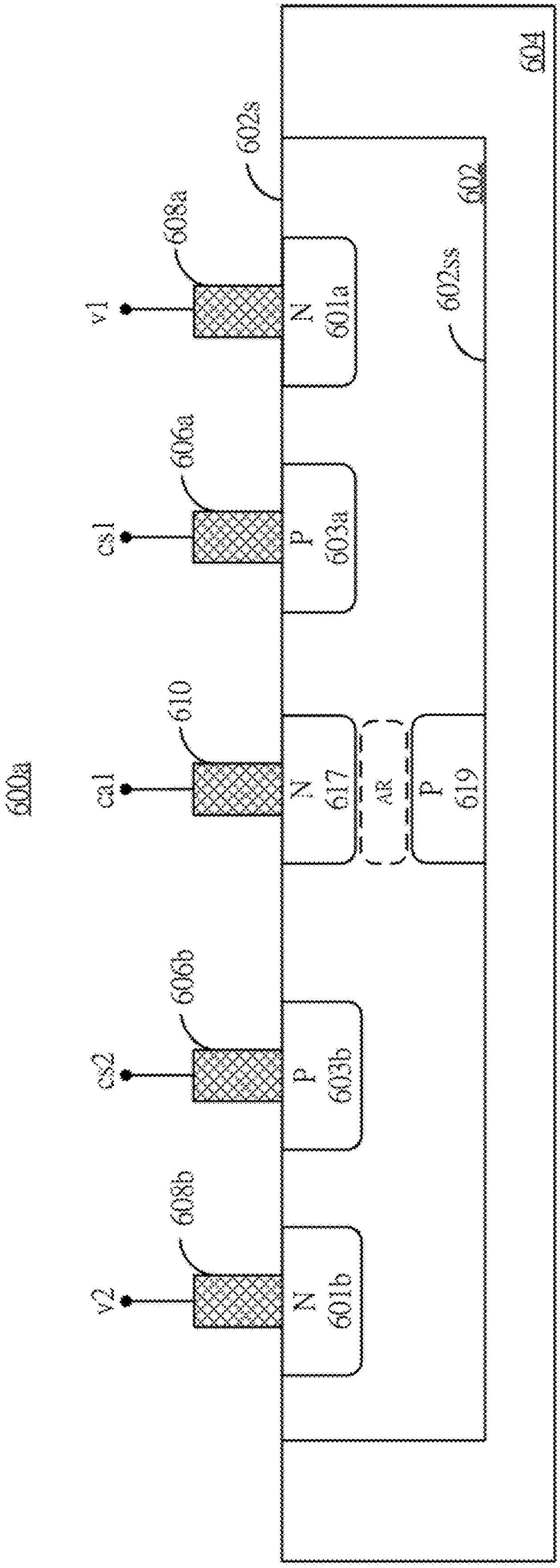
FIGS. 6A-6C illustrate cross-sectional views of a photo-detecting apparatus with boosted charge transfer speed, according to some embodiments.

FIG. 6A illustrates a cross-sectional view of a photo-detecting apparatus with boosted charge transfer speed, according to some embodiments. The photo-detecting apparatus 600*a* includes control metal lines 606*a*, 606*b* and readout metal lines 608*a*, 608*b*. The control metal lines 606*a*, 606*b* and the readout metal lines 608*a*, 608*b* are electrically coupled to the surface 602*s* of the germanium-based light absorption material 602. The control metal lines 606*a*, 606*b* are respectively electrically coupled to the P-type regions 603*a*, 603*b* on the surface 602*s*, and the readout metal line 608*a*, 608*b* are respectively electrically coupled to the N-type regions 601*a*, 601*b* on the surface 602*s*. The embodiment of FIG. 6A adds an N-type region 617 on the surface 602*s* and a P-type region 619 on the surface 602*ss*. The N-type region 617 and P-type region 619 are formed substantially on the center of the germanium-based light absorption material 602, which is a location that the optical signal IL may pass through. Due to the fact that the N-type region 617 and P-type region 619 are collectively formed as a PN-junction, there are built-in vertical electrical fields established between N-type region 617 and P-type region 619, which may assist separating the electron-hole pairs generated by the absorbed photons, where the electrons tends to move toward the N-type region 617 and the holes tends to move toward the P-type region 619. The N-type region 617 is operated to collect the electrons and the P-type region 619 is operated to collect the holes. The electrons stored in the N-type region 617 may be moved to N-type region 601*a* or N-type region 601*b* according to the control signals cs1, cs2. Notably, the metal line 610 can be floating or be biased by a bias voltage ca1 depending on the operation of photo-detecting apparatus 600*a*. In one implementation, doping concentration of the N-type regions 601*a*, 601*b* are higher than a doping concentration of the N-type region 617.

Figure 6B:
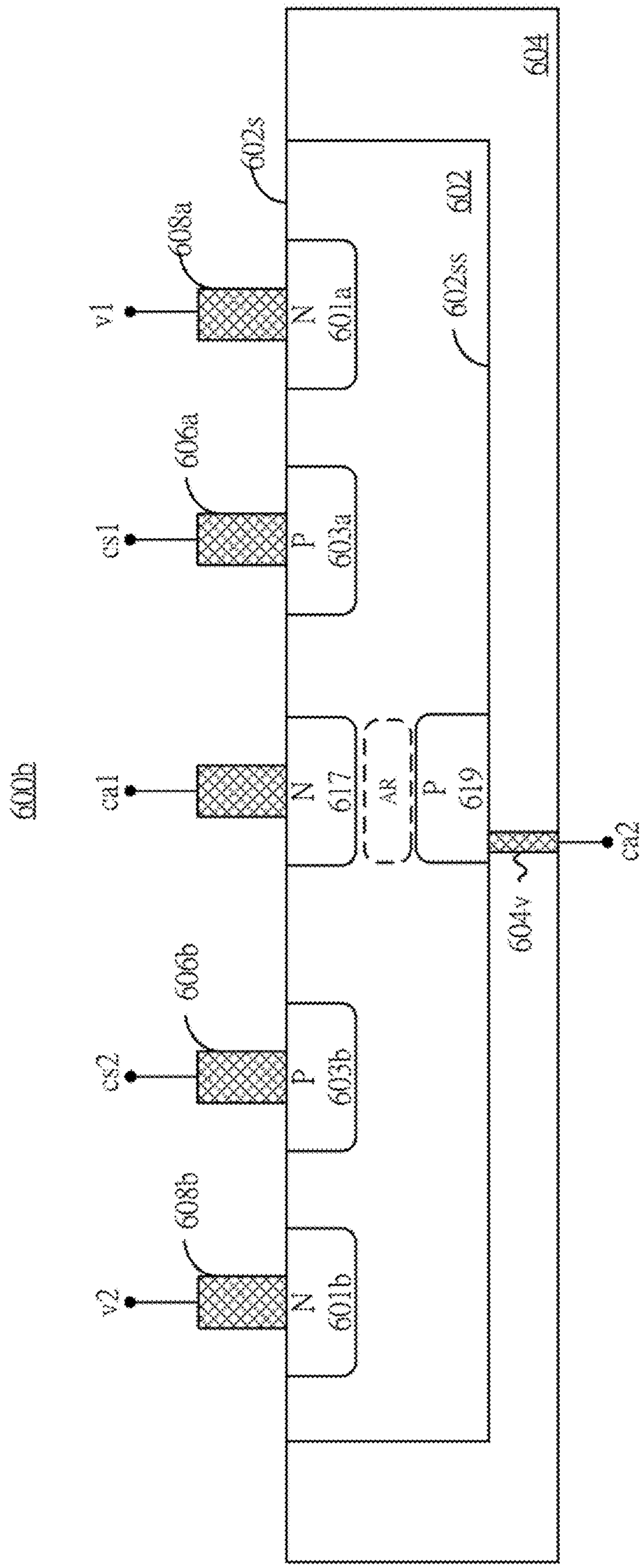

FIG. 6B illustrates a cross-sectional view of a photo-detecting apparatus with boosted charge transfer speed, according to some embodiments. This embodiment is similar to the photo-detecting apparatus 600*a*. The difference is that the P-type region 619 can be biased though a silicon via 604*v*, in which the holes collected in the P-type region 619 can be discharged through the silicon via 604*v*, which is biased by a bias voltage ca2 thereon.

Figure 6C:
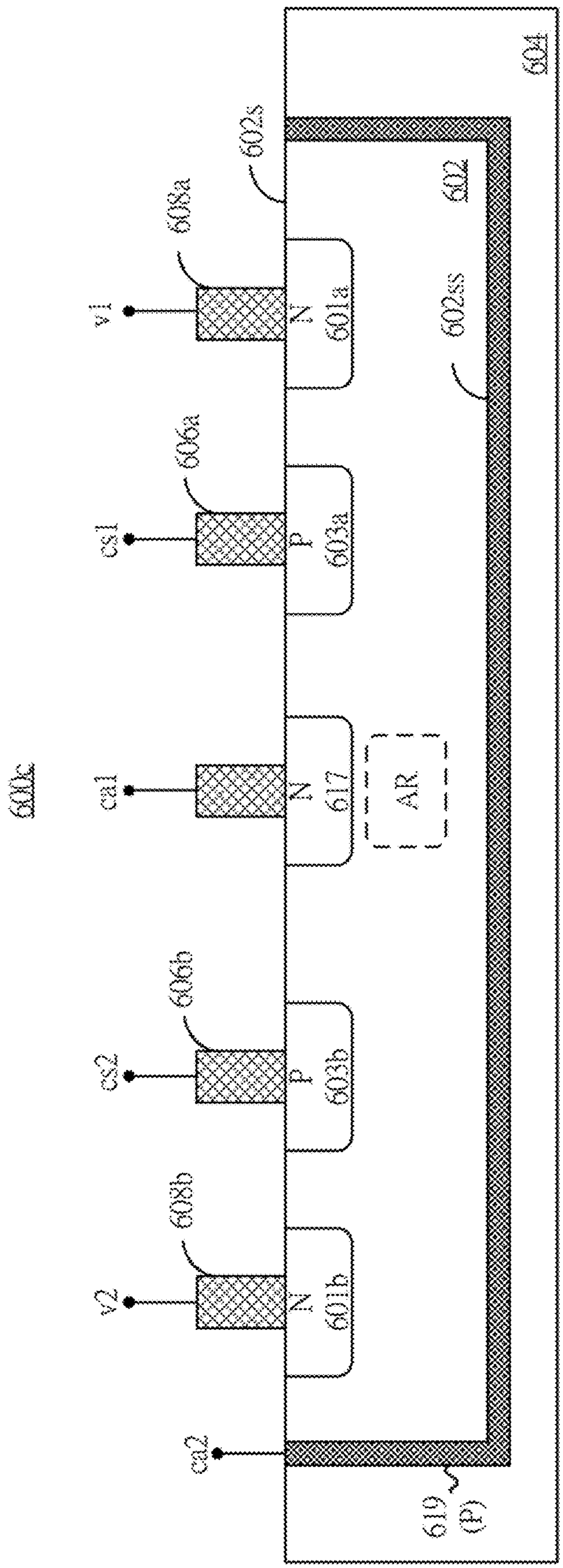

FIG. 6C illustrates a cross-sectional view of a photo-detecting apparatus with boosted charge transfer speed, according to some embodiments. The embodiment of FIG. 6C is similar to the photo-detecting apparatus 600*b*. The difference is that a P-type region 619 is formed as a U-shape or a well-shape underneath and surrounding the germanium-based light absorption material 602. Also, this P-type region 619 is electrically coupled to a bias voltage ca2. Therefore, the photo-generated holes can be collected and discharged by the P-type region 619.

Figure 7A:
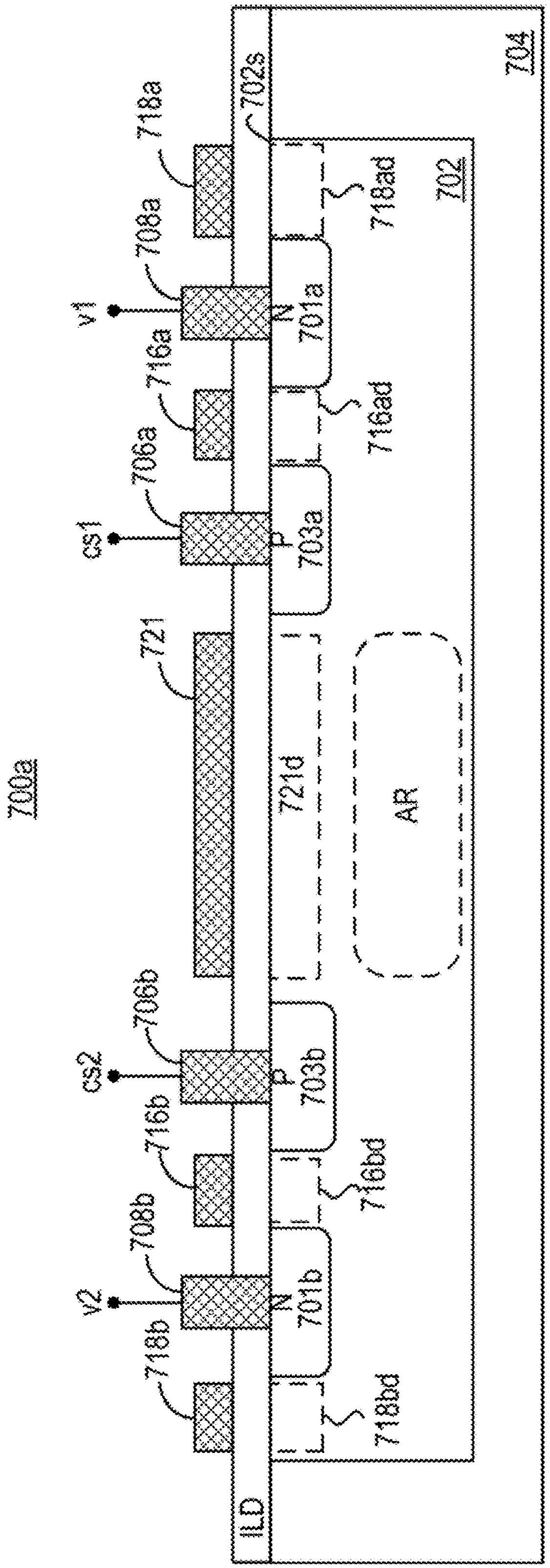
FIGS. 7A-7B illustrate cross-sectional views of a photo-detecting apparatus with surface depletion mode, according to some embodiments.

FIG. 7A illustrates a cross-sectional view of a photo-detecting apparatus with surface depletion mode, according to some embodiments. The photo-detecting apparatus 700*a* includes control metal lines 706*a*, 706*b* and readout metal lines 708*a*, 708*b*. The control metal lines 706*a*, 706*b* and the readout metal lines 708*a*, 708*b* are electrically coupled to the surface 702*s* of the germanium-based light absorption material 702. The control metal lines 706*a*, 706*b* are respectively electrically coupled to the P-type regions 703*a*, 703*b* on the surface 702*s*, and the readout metal line 708*a*, 708*b* are respectively electrically coupled to the N-type regions 701*a*, 701*b* on the surface 702*s*. This embodiment forms an interlayer dielectric ILD on the surface 702*s* and forms metals 721, 716*a*, 716*b*, 718*a*, 718*b* on the interlayer dielectric ILD. These metals 721, 716*a*, 716*b*, 718*a*, 718*b* can be biased to generate the depletion regions 721*d*, 716*ad*, 716*bd*, 718*ad*, 718*bd*. The biases applied on the metals 721, 716*a*, 716*b*, 718*a*, 718*b* can be different or the same, or have some of the metals 721, 716*a*, 716*b*, 718*a*, 718*b* floating.

The depletion region 712*d* can reduce the dark current between the P-type region 703*a* and the P-type region 703*b*. The depletion region 716*ad* can reduce the dark current between the P-type region 703*a* and the N-type region 701*a*. The depletion region 716*bd* can reduce the dark current between the P-type region 703*b* and the N-type region 701*b*. The depletion region 718*a* can reduce the dark current between N-type region 701*a* and another pixel (Not shown in FIG. 7A). The depletion region 718*b* can reduce the dark current between N-type region 701*b* and another pixel (Not shown in FIG. 7A). Therefore, by forming these surface depletion regions, the power consumption and the noise generation can be reduced.

As mentioned, the metals 721, 716*a*, 716*b*, 718*a*, 718*b* can be biased to generate the depletion regions 721*d*, 716*ad*, 716*bd*, 718*ad*, and 718*bd*. In other applications, the metals 721, 716*a*, 716*b*, 718*a*, 718*b* can be biased to make the corresponding regions 721*d*, 716*ad*, 716*bd*, 718*ad*, 718*bd* into accumulation or inversion, other than depletion.

In addition to the leakage reduction, the metals 721, 716*a*, 716*b*, 718*a*, 718*b* can reflect the residual optical signal IL into the germanium-based light absorption material 702 so as to be converted into electron-hole pairs accordingly. These metals 721, 716*a*, 716*b*, 718*a*, 718*b* serve like a mirror reflecting the light not being completely absorbed and converted by the germanium-based light absorption material 702 back to the germanium-based light absorption material 702 for absorption again. This would increase the overall absorption efficiency and therefore increase the system performance.

Figure 7B:
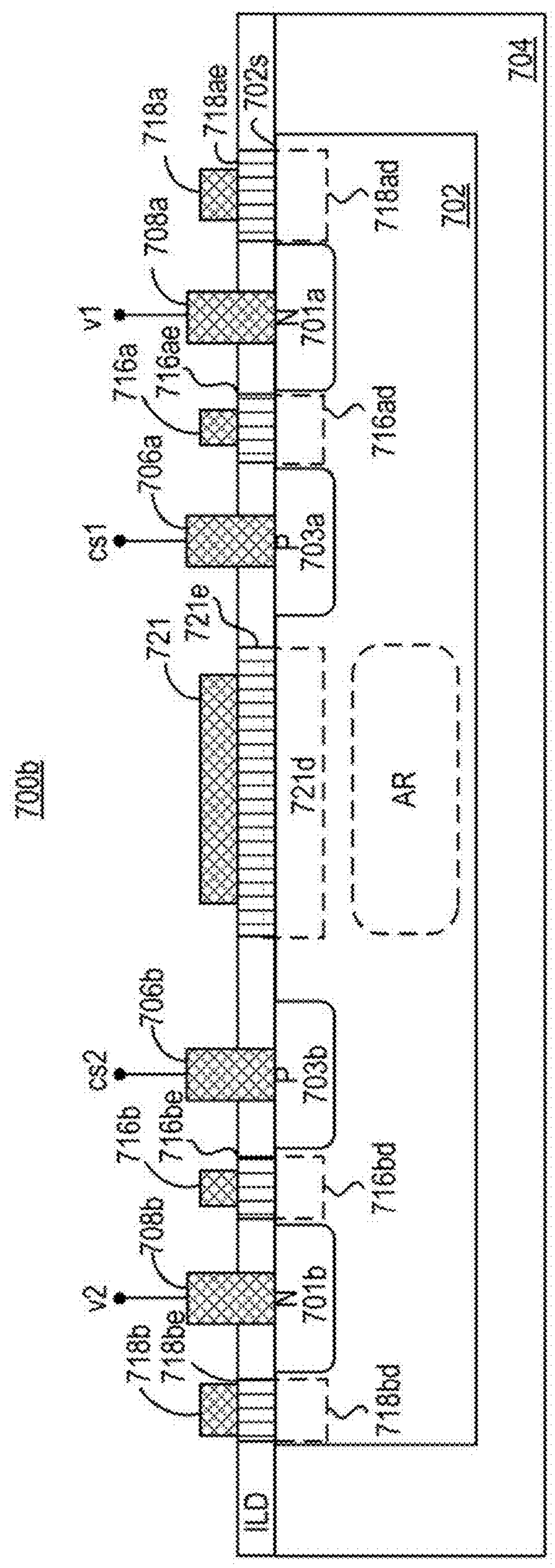

Furthermore, an alternative embodiment of the present disclosure is illustrated in FIG. 7B. Compared to FIG. 7A, this embodiment adds polarized dielectrics 721*e*, 716*ae*, 716*be*, 718*ae*, 718*be* (e.g., HfO2) as shown in FIG. 7B. Since there are dipole existing in the polarized dielectrics 721*c*, 716*ae*, 716*be*, 718*ae*, 718*be*, the depletion/accumulation/inversion regions 721*d*, 716*ad*, 716*bd*, 718*ad*, 718*bd* may be generated without biasing or biasing the metals 721, 716*a*, 716*b*, 718*a*, 718*b* at a small bias.

Figure 7C:
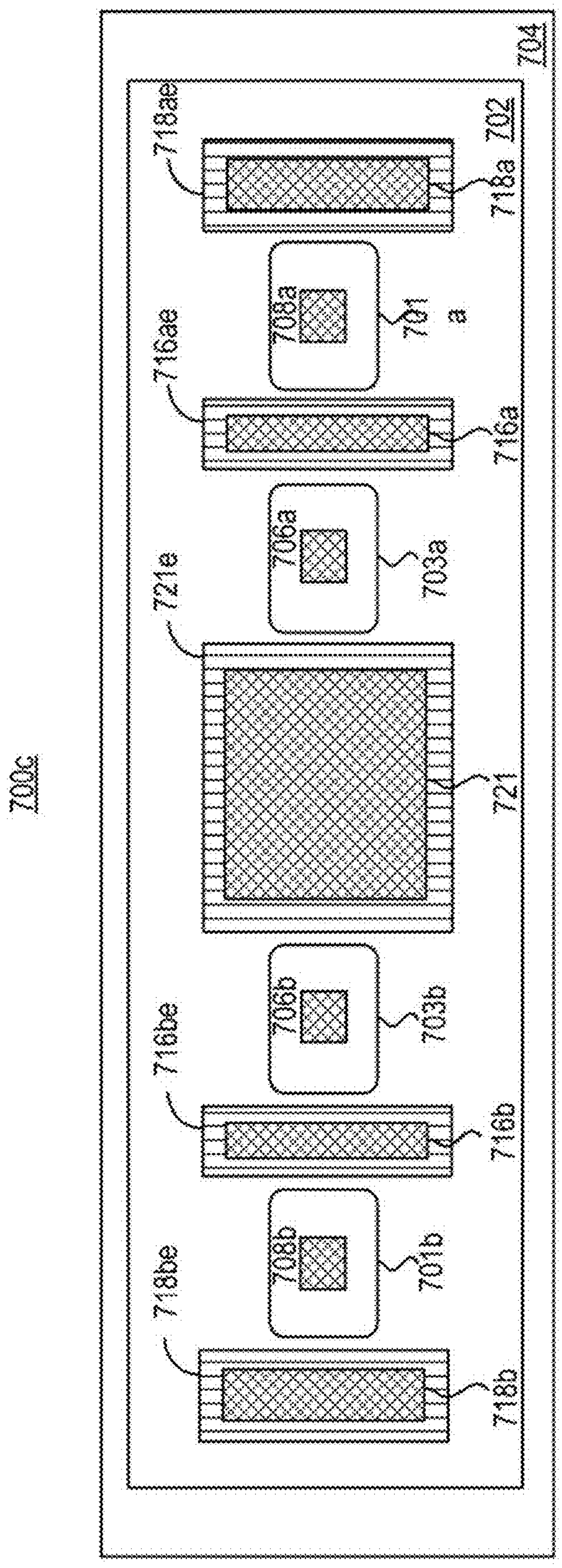
FIGS. 7C-7D illustrate planar views of a photo-detecting apparatus with surface depletion mode, according to some embodiments.
Figure 7D:
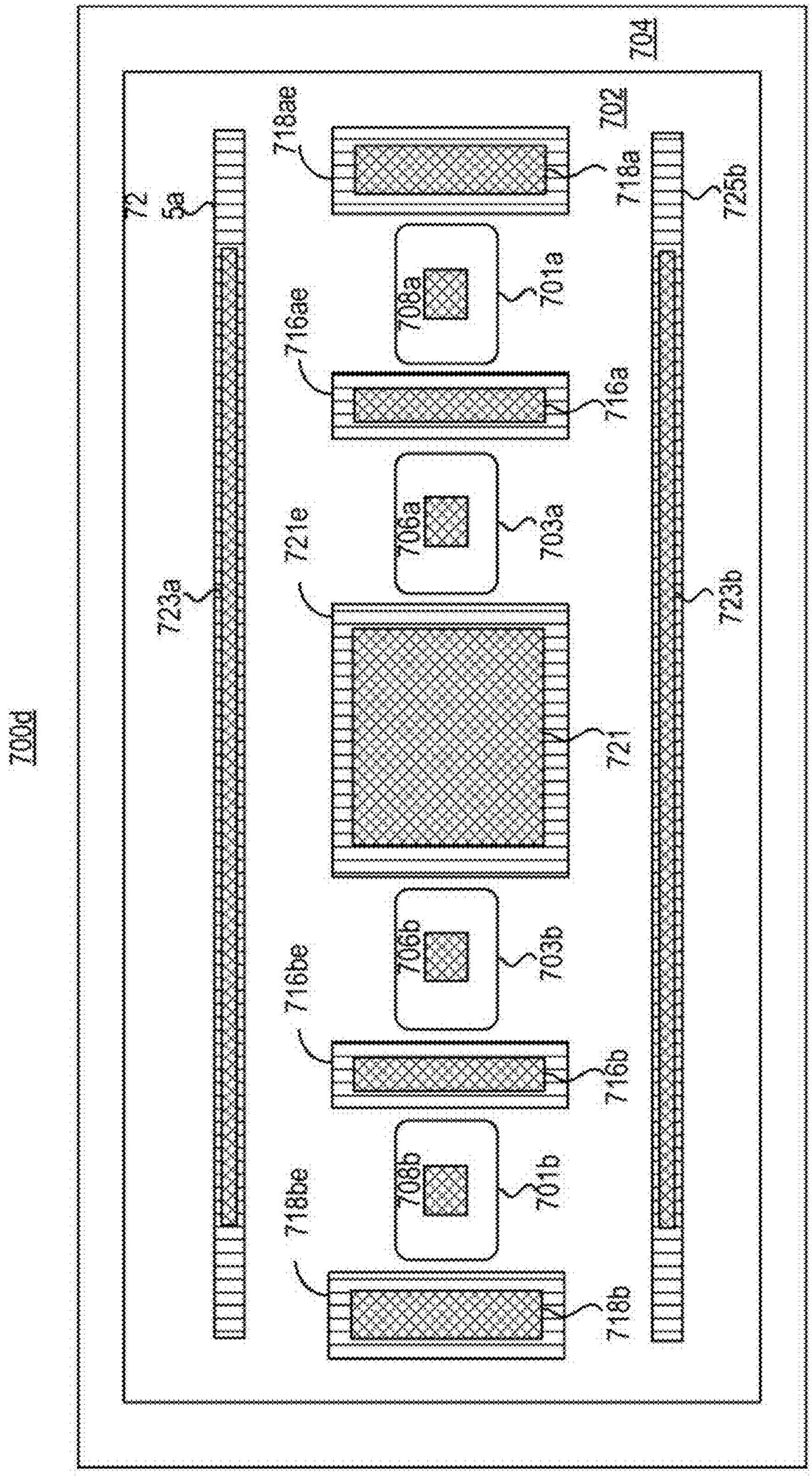

FIG. 7C illustrates a planar view of the photo-detecting apparatus 700B. It is noted that the metals 721, 716*a*, 716*b*, 718*a*, 718*b* and the polarized dielectrics 721*c*, 716*ae*, 716*be*, 718*ae*, 718*be* can be formed optionally. The device implementer can design a photo-detecting apparatus to include these elements or not based on different scenarios. Furthermore, in addition to adding the metals and polarized dielectrics in vertical direction as shown in FIG. 7C, there is also an alternative embodiment as shown in FIG. 7D, in which the metals 723*a*, 723*b*, and polarized dielectrics 725*a*, 725*b* are added in the horizontal direction.

Figure 8A:
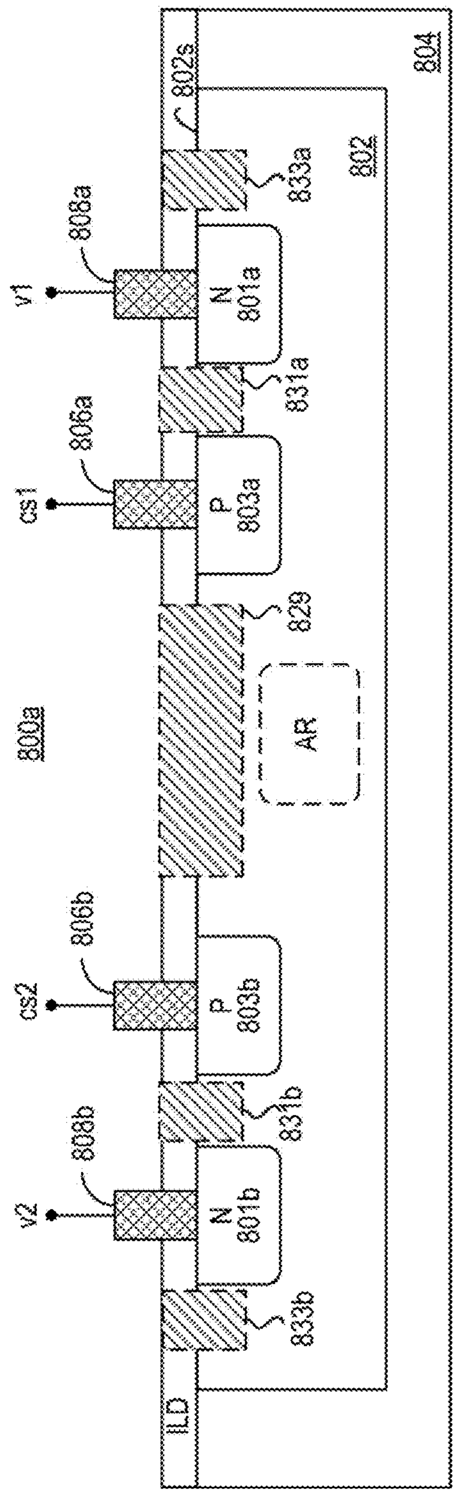
FIG. 8A illustrates a cross-sectional view of a photo-detecting apparatus with surface ion implantation, according to some embodiments.

FIG. 8A illustrates a cross-sectional view of a photo-detecting apparatus with surface ion implantation, according to some embodiments. The photo-detecting apparatus 800*a* includes control metal lines 806*a*, 806*b* and readout metal lines 808*a*, 808*b*. The control metal lines 806*a*, 806*b* and the readout metal lines 808*a*, 808*b* are electrically coupled to the surface 802*s* of the germanium-based light absorption material 802. The control metal lines 806*a*, 806*b* are respectively electrically coupled to the P-type regions 803*a*, 803*b* on the surface 802*s*, and the readout metal lines 808*a*, 808*b* are respectively electrically coupled to the N-type regions 801*a*, 801*b* on the surface 802*s*. In order to have a high surface resistance for a suppression of the surface leakage current, this embodiment utilizes neutral ion implantation as a surface treatment. As shown in this figure, the ion-processed regions 829, 831*a*, 831*b*, 833*a*, 833*b* are ion implanted (e.g., Si, Ge, C, $H_2$), in which accelerated ions collide with the substance and make damage to the atomic periodicity or the crystalline structure in the area of implantation. The lattice damage such as atomic vacancies and interstitials breaks the periodic potential seen by electron envelope function, so the electrons/holes gain higher probability being scattered. This effect results into a lower mobility and hence a higher resistance.

Figure 8B:
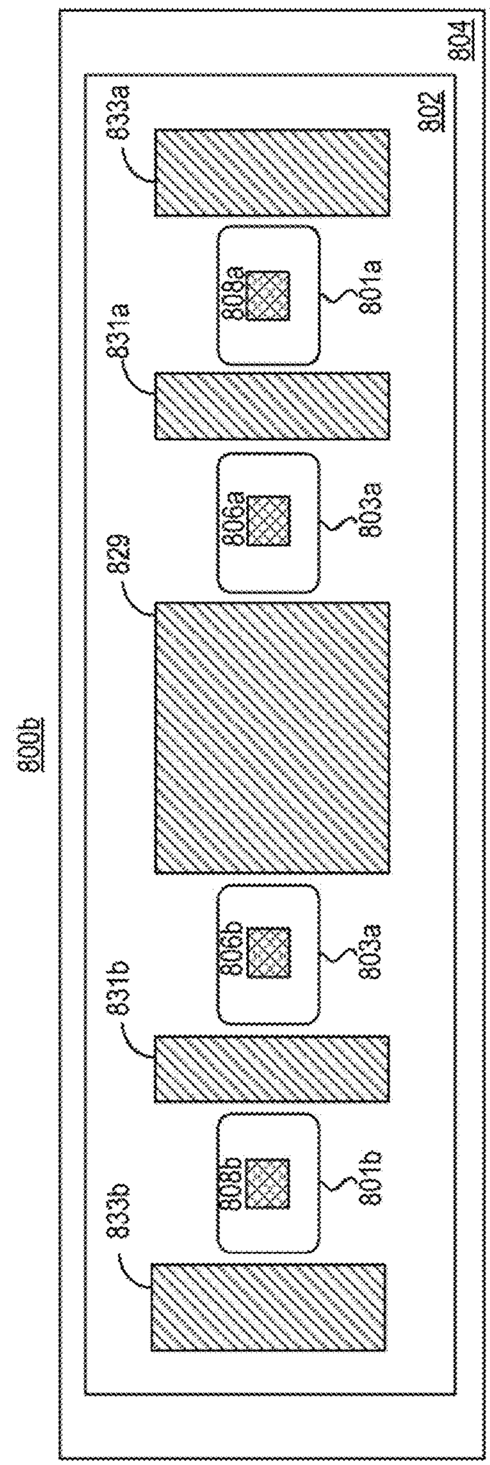
FIG. 8B illustrates a planar view of a photo-detecting apparatus with surface ion implantation, according to some embodiments.

FIG. 8B illustrates a planar view of a photo-detecting apparatus 800*a* with surface ion implantation, according to some embodiments. As shown in the figure, the ion-processed regions 829, 831*a*, 831*b*, 833*a*, 833*b* are vertically formed between the doped areas 801*a*, 801*b*, 803*a*, 803*b*. In some implementations, the ion-processed region(s) can be formed in other place(s), so the present embodiment is a reference rather than a limit.

Figure 9A:
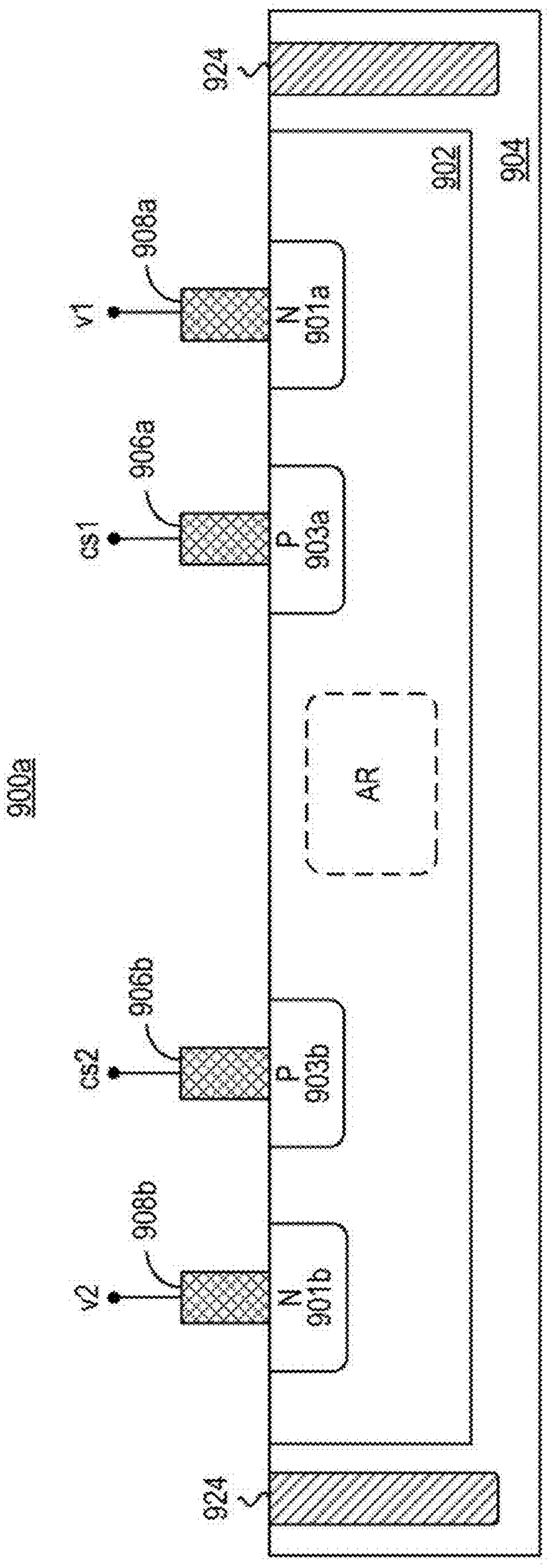
FIG. 9A illustrates a cross-sectional view of a photo-detecting apparatus with pixel to pixel isolation, according to some embodiments.

FIG. 9A illustrates a cross-sectional view of a photo-detecting apparatus with pixel to pixel isolation. The photo-detecting apparatus 900*a* includes control metal lines 906*a*, 906*b* and readout metal lines 908*a*, 908*b*. The control metal lines 906*a*, 906*b* and the readout metal lines 908*a*, 908*b* are electrically coupled to the surface 902*s* of the germanium-based light absorption material 902. The control metal lines 906*a*, 906*b* are respectively electrically coupled to the P-type regions 903*a*, 903*b* on the surface 902*s*, and the readout metal line 908*a*, 908*b* are respectively electrically coupled to the N-type regions 901*a*, 901*b* on the surface 902*s*. This embodiment includes an isolation region 924, which is formed as a ring surrounding the germanium-based light absorption material 902. In one implantation, the isolation region 924 is an N-type region. It depends on the types of the germanium-based light absorption material 902, the semiconductor substrate 904, and other factors, and the isolation region 924 may be implemented by a P-type region. With this isolation region 924, the photo-detecting apparatus 900*a* has the effect of reducing the cross-talk signals and/or powers to neighbor devices.

Figure 9B:
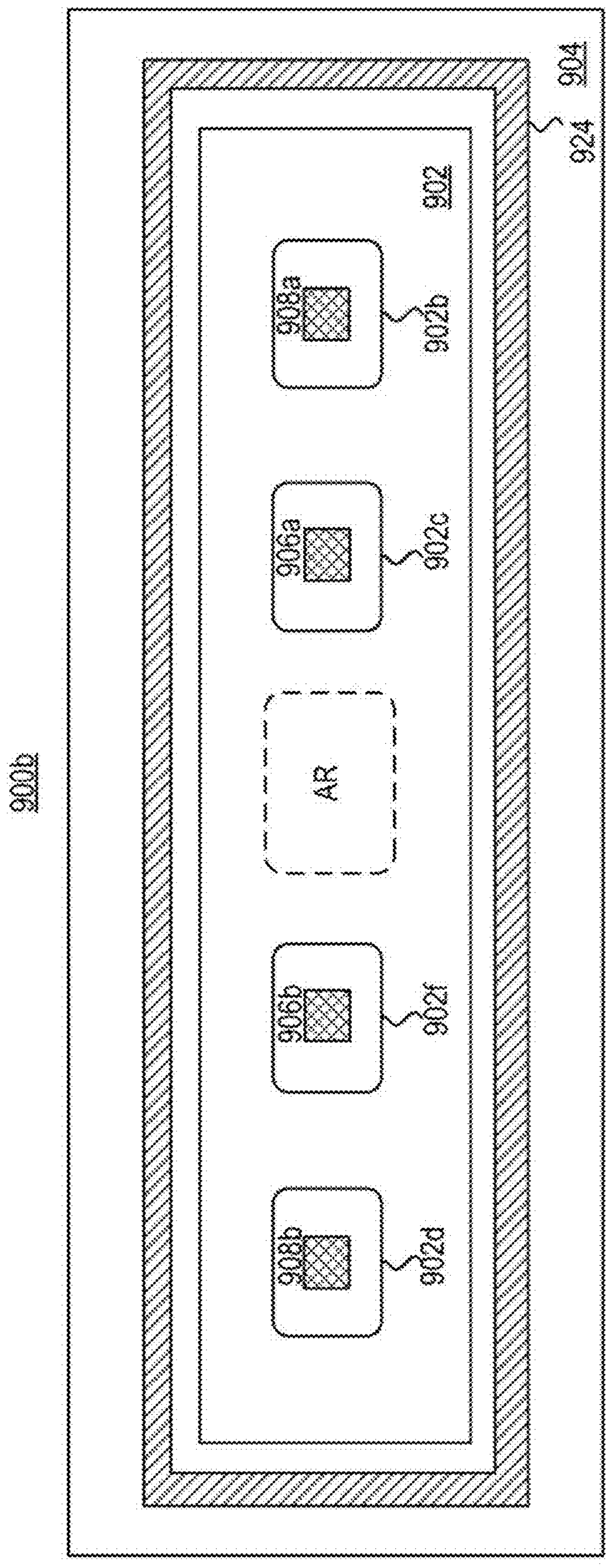
FIG. 9B illustrates a planar view of a photo-detecting apparatus with pixel to pixel isolation, according to some embodiments.

FIG. 9B illustrates a planar view of the photo-detecting apparatus 900*a* with pixel to pixel isolation. As shown in the figure, the isolation region 924 forms an entire ring. In other implementations, the isolation region 924 may be fragmented or discontinued.

Figure 9C:
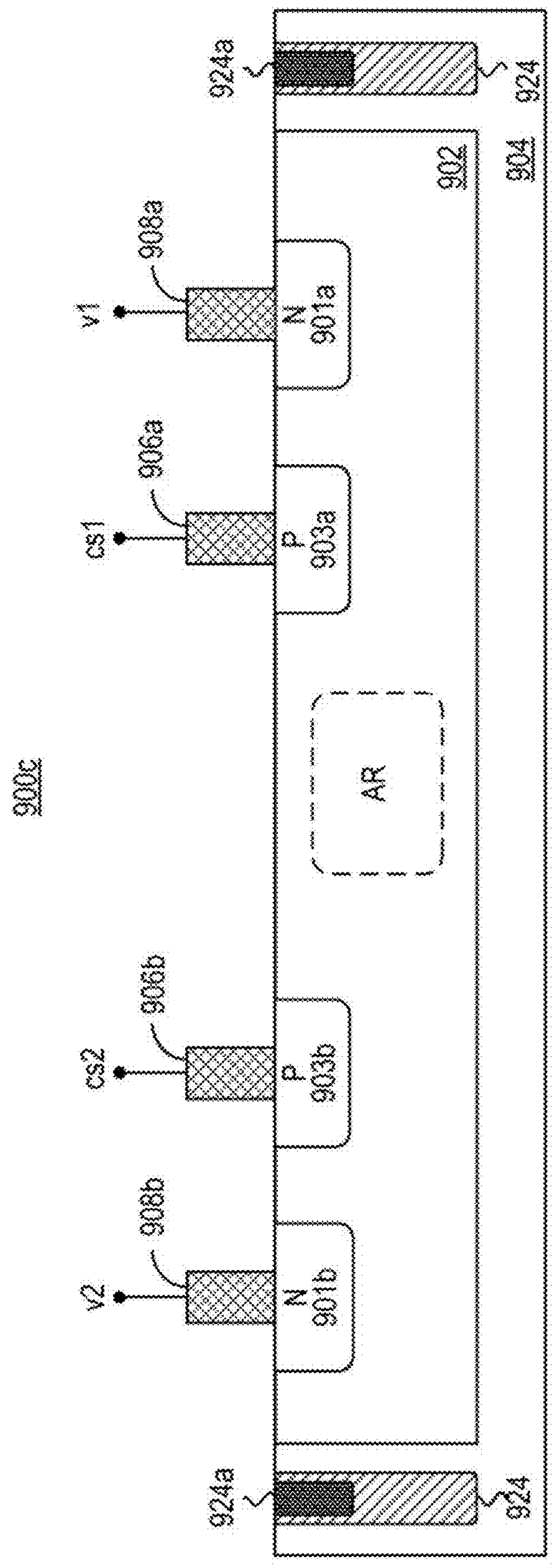
FIGS. 9C-9E illustrate cross-sectional views of a photo-detecting apparatus with pixel to pixel isolation, according to some embodiments.

FIG. 9C illustrates a cross-sectional view of a photo-detecting apparatus with pixel to pixel isolation. The photo-detecting apparatus 900*c* forms an additional narrow and shallow isolation region 924*a* inside isolation region 924. The doping concentration of the isolation region 924 and the doping concentration of the isolation region 924*a* are different. This may be applied to inhibit the crosstalk through surface conduction paths.

Figure 9D:
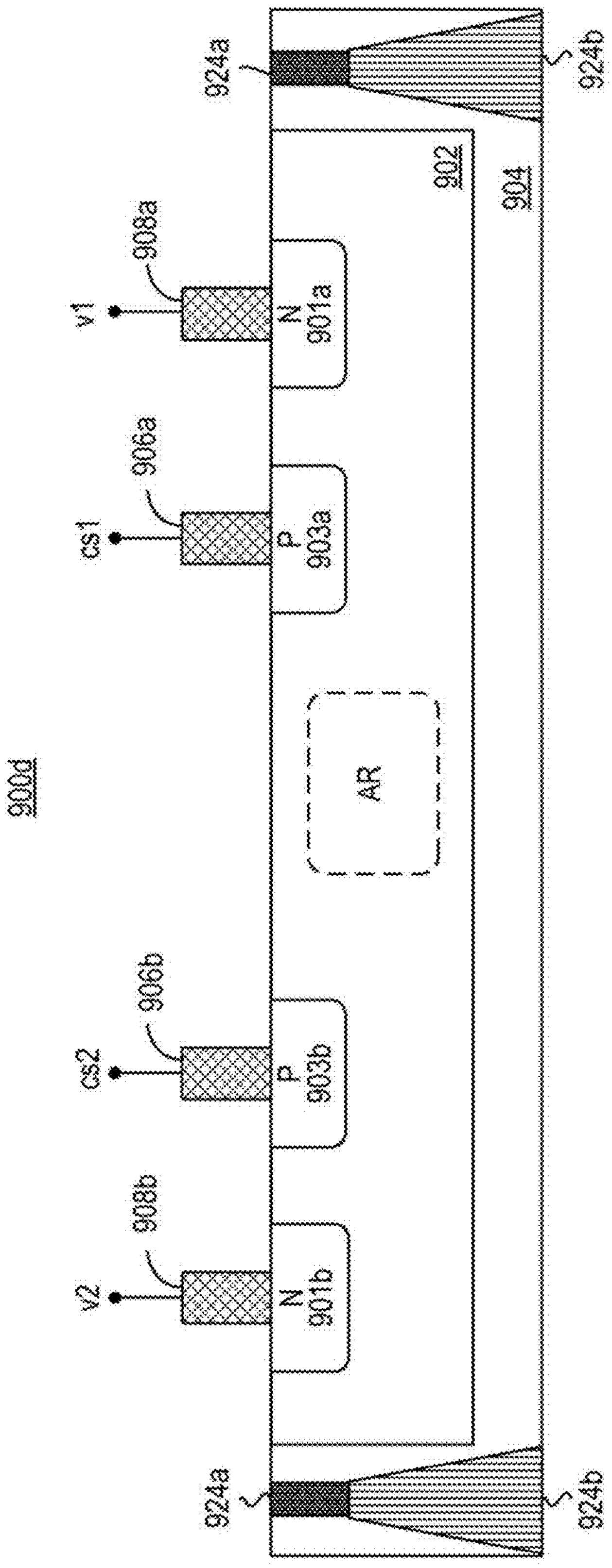

FIG. 9D illustrates a cross-sectional view of a photo-detecting apparatus with pixel to pixel isolation. The photo-detecting apparatus 900*d* forms an additional trench isolation region 924*b* extending from the isolation region 924*a* to the bottom surface of the semiconductor substrate 904. The trench isolation region 924*b* may be an oxide trench, in which block the electrical path between the germanium-based light absorption material 902 and adjacent devices.

Figure 9E:
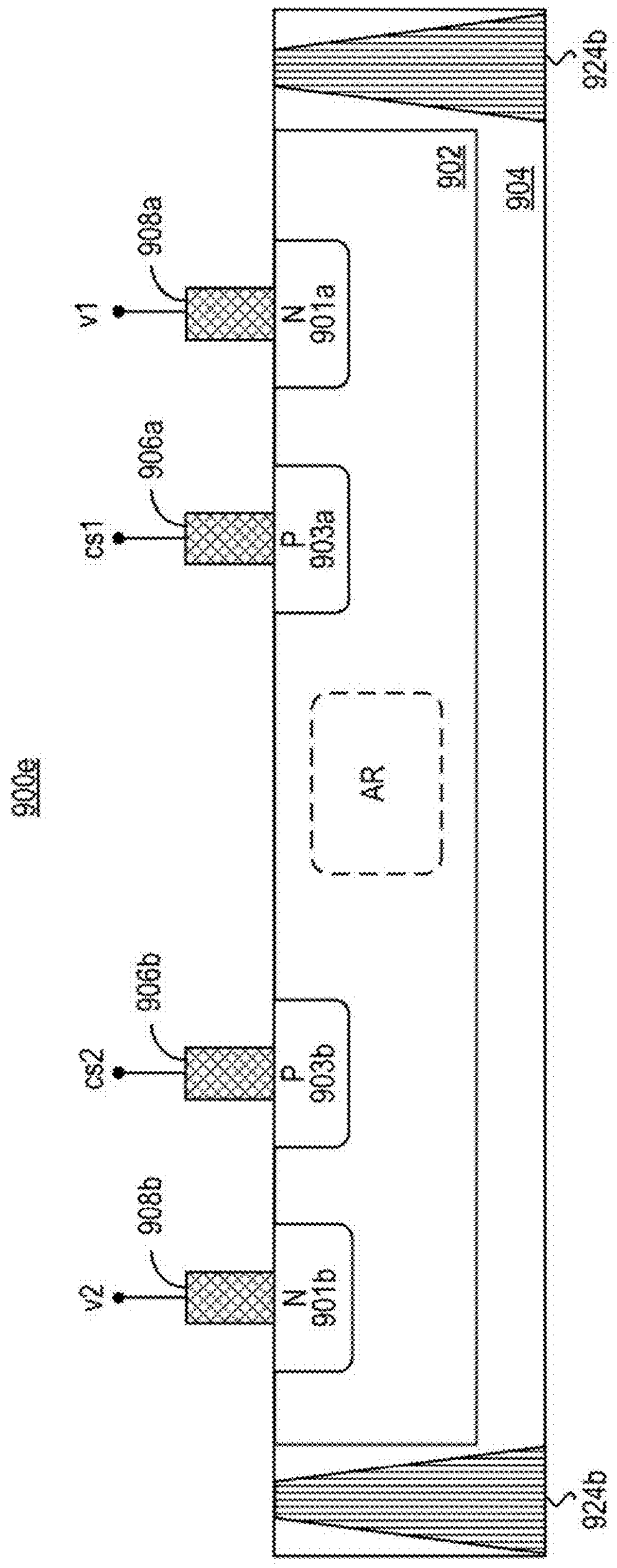

FIG. 9E illustrates a cross-sectional view of a photo-detecting apparatus with pixel to pixel isolation. The photo-detecting apparatus 900*e* forms a trench isolation region 924*b* extending from the top surface of the semiconductor substrate 904 to the bottom surface of the semiconductor substrate 904. The trench isolation region 924*a* may be an oxide trench, which blocks the electrical path between the germanium-based light absorption material 902 and adjacent devices.

Figure 10A:
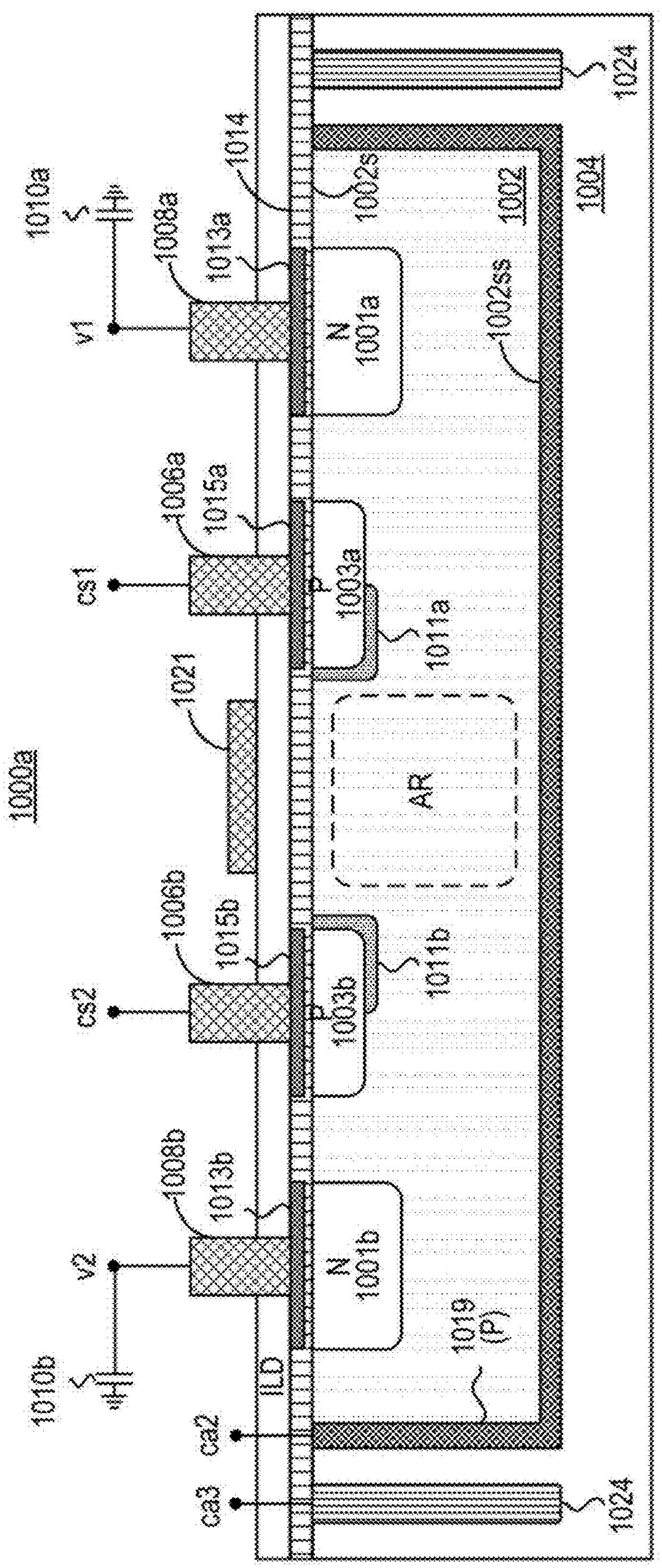
FIGS. 10A-10D illustrate cross-sectional views of a photo-detecting apparatus, according to some embodiments.

FIG. 10A illustrates a cross-sectional view of a photo-detecting apparatus, according to some embodiments. The embodiment of FIG. 10A includes and combines elements from the above embodiments. The photo-detecting apparatus 1000*a* includes control metal lines 1006*a*, 1006*b* and readout metal lines 1008*a*, 1008*b*. The control metal lines 1006*a*, 1006*b* and the readout metal lines 1008*a*, 1008*b* are electrically coupled to the surface 1002*s* of the germanium-based light absorption material 1002. The control metal lines 1006*a*, 1006*b* are respectively electrically coupled to the P-type regions 1003*a*, 1003*b* on the surface 1002*s*. The readout metal lines 1008*a*, 1008*b* are respectively electrically coupled to the N-type regions 1001*a*, 1001*b* on the surface 1002*s*. Similarly, the photo-detecting apparatus 1000*a* is able to obtain a distance information by the optical signal IL. Specifically, when the optical signal IL is incoming to the absorbed region AR, it will be converted into electron-hole pairs and then separated by the electrical field generated between the P-type regions 1003*a*, 1003*b*. The electrons may move toward either N-type region 1001*a* or N-type region 1001*b* according to the control signals cs1, cs2. In some implementations, the control signals cs1 and cs2 are differential voltage signals. In some implementations, one of the control signals cs1 and cs2 is a constant voltage signal (e.g., 0.5*v*) and the other control signal is a time-varying voltage signal (e.g., sinusoid signal, clock signal or pulse signal; in-between 0V and 1V). Due to a distance existing between the photo-detecting apparatus 1000*a* and the target object (not shown in FIG. 10A), the optical signal IL has a phase delay with respect to the transmitted light transmitted by a transmitter (not shown in FIG. 10A). The transmitted light is modulated by a modulation signal and the electron-hole pairs are demodulated through the control metal lines 1006*a* and 1006*b* by another modulation signal. The electrons or the holes stored in the capacitor 1010*a* and capacitor 1010*b* will be varied according to the distance. Therefore, the photo-detecting apparatus 1000*a* can obtain the distance information based on the voltage v1 on the capacitor 1010*a* and the voltage v2 on the capacitor 1010*b*. According to one embodiment, the distance information can be derived based on calculations with voltage v1 and voltage v2 as input variables. For one example, in a pulse time-of-flight configuration, voltage ratios related to voltage v1 and voltage v2 are used as input variables. In another example, in a continuous-wave time-of-flight configuration, in-phase and quadrature voltages related voltage v1 and voltage v2 are used as input variables.

In addition to detecting the distance, this photo-detecting apparatus 1000*a* includes a different depth design for N-type regions 1001*a*, 1001*b* and P-type regions 1003*a*, 1003*b*, and also adds N-well 1011*a*, 1011*b*, which may reduce the leakage current between the P-type region 1003*a* and the P-type region 1003*b*. Second, the photo-detecting apparatus 1000*a* includes a well-shape P-type region 1019 covering the germanium-based light absorption material 1002, which may collect and discharge the holes through the bias voltage ca2. Third, the photo-detecting apparatus 1000*a* includes the passivation layer 1014 and inter-layer dielectric ILD to process the surface 1002*s* to the defects existing on the surface 1002*s*. Fourth, the photo-detecting apparatus 1000*a* includes the metal 1021, which may or may not be biased to generate the accumulation, inversion, or depletion on the surface 1002*s*. Moreover, the metal 1021 can be used as a mirror to reflect the residual optical signal IL back into the germanium-based light absorption material 1002 to be converted to electron-hole pairs. Fifth, the photo-detecting apparatus 1000*a* adds silicides 1013*a*, 1013*b*, 1015*a*, 1015*b* to reduce the voltage drop. Sixth, the photo-detecting apparatus 1000*a* can add the isolation region 1024, either implemented by doping materials or insulating oxides. The isolation region 1024 may be electrically coupled to a bias voltage ca3. In some implementations, the isolation region 1024 and the P-type region 1019 may be electrically coupled together by a metal layer, and the metal layer is left floated or being electrically coupled to a voltage source.

Figure 10B:
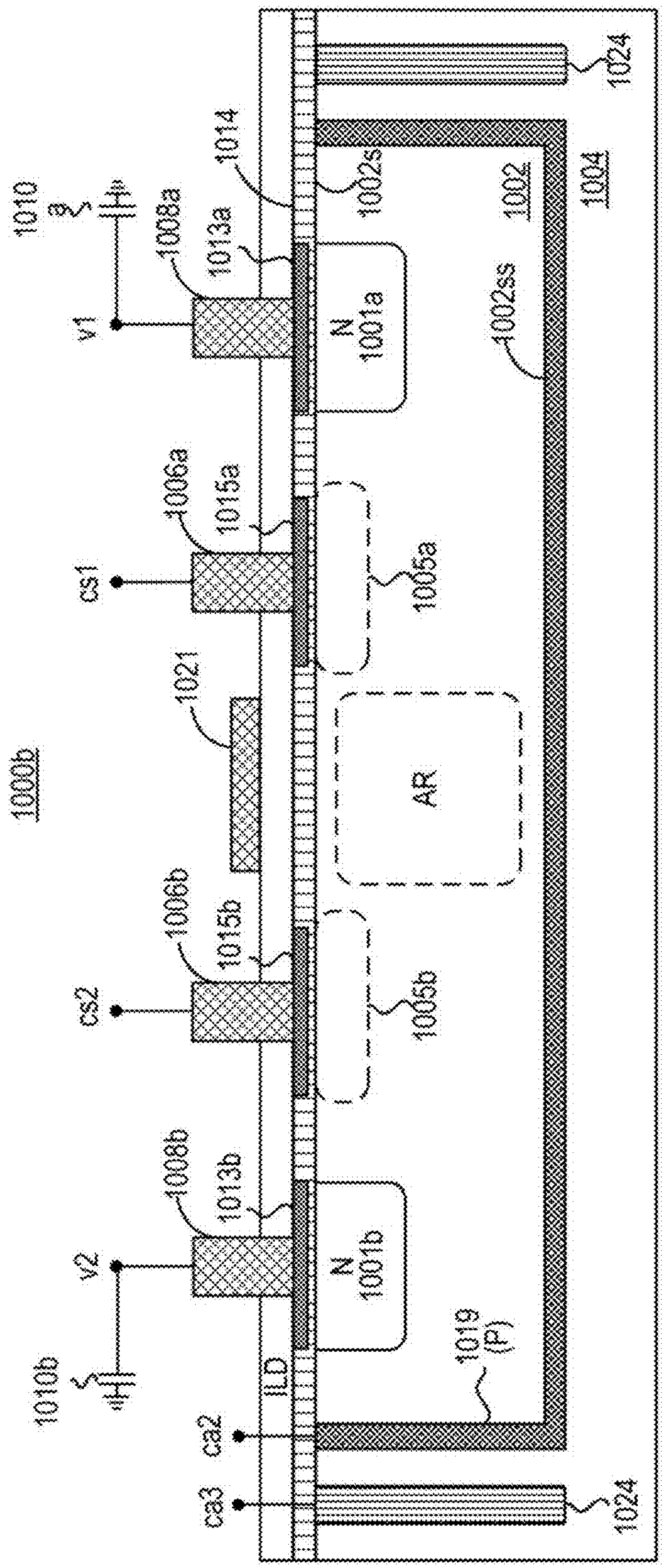

FIG. 10B illustrates a cross-sectional view of a photo-detecting apparatus, according to some embodiments. The structure of the photo-detecting apparatus 1000*b* is similar to the photo-detecting apparatus 1000*a*. The difference is that the control metal lines 1006*a*, 1006*b* in FIG. 10B are electrically coupled to the un-doped regions 1005*a*, 1005*b*.

Figure 10C:
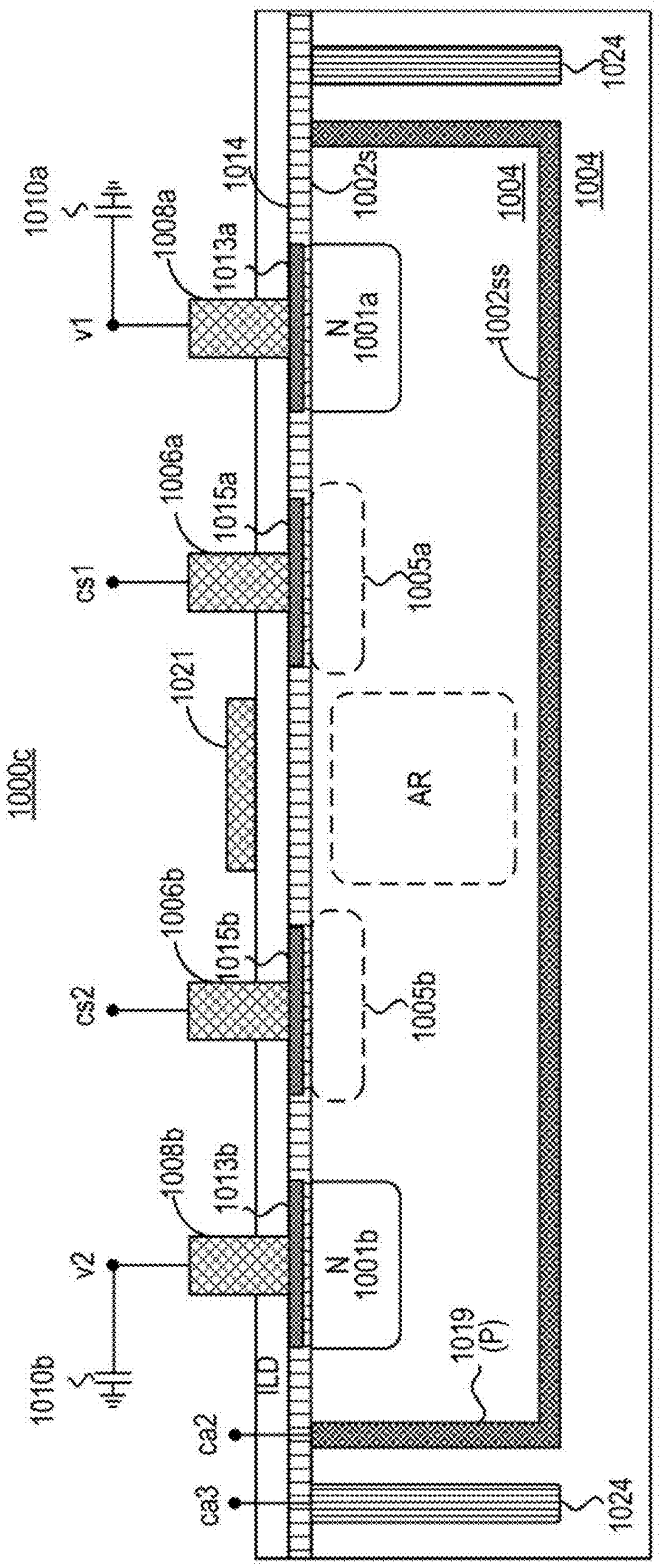
Figure 10D:
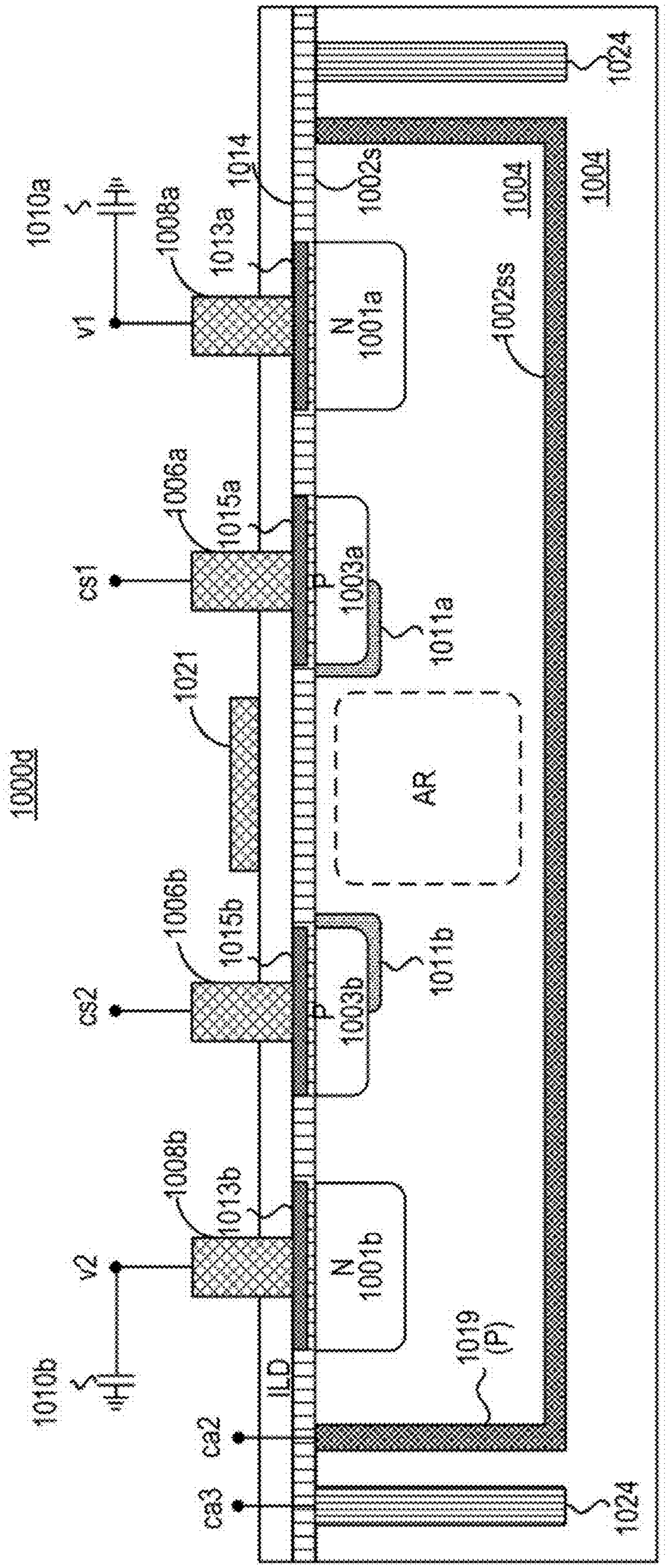

Furthermore, although the above-mentioned embodiments use a germanium-based light absorption material 1002 to absorb the optical signal IL, one embodiment without germanium-based light absorption material 1002 may be implemented. As shown in FIG. 10C, photo-detecting apparatus 1000*c* can use the semiconductor substrate 1004 as the light absorption material. In some implementations, the semiconductor substrate 1004 can be silicon, silicon-germanium, germanium, or III-V compounds. Besides, P-type regions 1003*a*, 1003*b* and N-wells 1011*a*, 1011*b* may be added on the surface 1002*s* of the semiconductor substrate 1004, as the embodiment illustrated in FIG. 10D.

The photo-detecting apparatuses 1000*a*, 1000*b*, 1000*c* and 1000*d* are illustrated to show the possible combinations from embodiments (FIG. 1A to FIG. 9E) disclosed above. It is understood that the device implementer can arbitrarily combine two or more above embodiments to implement other photo-detecting apparatus(s) and numerous combinations may be implemented.

It is noted that the doping concentrations for the doped regions shown in the embodiments can be properly designed. Take the embodiment of FIG. 10A as an example, the doping concentrations of the N-type regions 1001*a*, 1001*b* and the doping concentrations of the P-type regions 1003*a*, 1003*b* could be different. In one implementation, the P-type regions 1003*a*, 1003*b* are lightly doped and N-type regions 1001*a*, 1001*b* are highly doped. In general, the doping concentration for the lightly doping may range from $10^{16}/cm^3$ or less to $10^{18}/cm^3$, and the doping concentration for the highly doping may range from $10^{18}/cm^3$ to $10^{20}/cm^3$ or more. Through the doping concentration adjustment, the Schottky contacts can be formed between the control metal lines 1006*a*, 1006*b* and the P-type regions 1003*a*, 1003*b* respectively; and the Ohmic contacts can be formed between the readout metal lines 1008*a*, 1008*b* and N-type regions 1001*a*, 1001*b* respectively. In this scenario, the resistances between control metal lines 1006*a*, 1006*b* and the P-type regions 1003*a*, 1003*b* are higher than the resistances between readout metal lines 1008*a*, 1008*b* and the N-type regions 1001*a*, 1001*b*.

On the other hands, the doping type for those doped regions can also be implemented in different ways. Take the embodiment of FIG. 10A as an example, The P-type regions 1003*a*, 1003*b* can be replaced by N-type if the regions 1003*a*, 1003*b* are doped with N-type dopants. Similarly, the N-type regions 1001*a*, 1001*b* can be replaced by P-type if the regions 1001*a*, 1001*b* are doped with P-type dopants. Therefore, it is possible to implement an embodiment that the doped regions 1001*a*, 1001*b*, 1003*a* and 1003*b* all are doped with same type dopants.

Figure 11A:
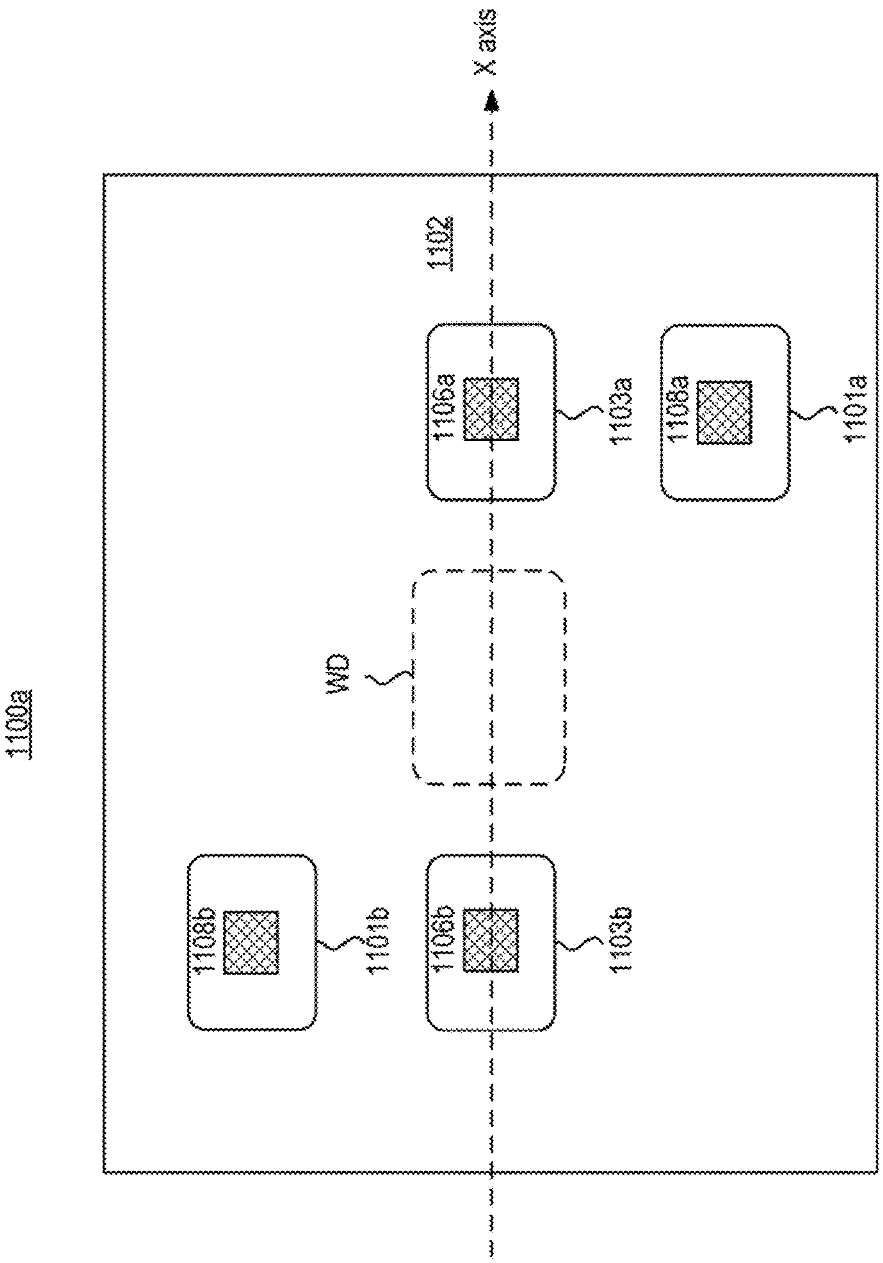
FIGS. 11A-11E illustrate planar views of a photo-detecting apparatus with chip size miniaturization, according to some embodiments.

Please refer to FIG. 11A, which illustrates a planar view of a photo-detecting apparatus, according to some embodiments. The photo-detecting apparatus 1100*a* includes the layout positions for control metal lines 1106*a*, 1106*b*, readout metal lines 1108*a*, 1108*b*, N-type regions 1001*a*, 1001*b* and P-type regions 1003*a*, 1003*b* on the germanium-based light absorption material 1102. In this embodiment, the control metal lines 1106*a*, 1106*b* are positioned on the axis X axis, however, readout metal lines 1108*a*, 1108*b* are not positioned on the axis X axis. In this embodiment, the four terminals are not on the same axis, which may reduce the area of the photo-detecting apparatus 1100*a*. The geometric relations between each element are shown in FIG. 11A.

Figure 11B:
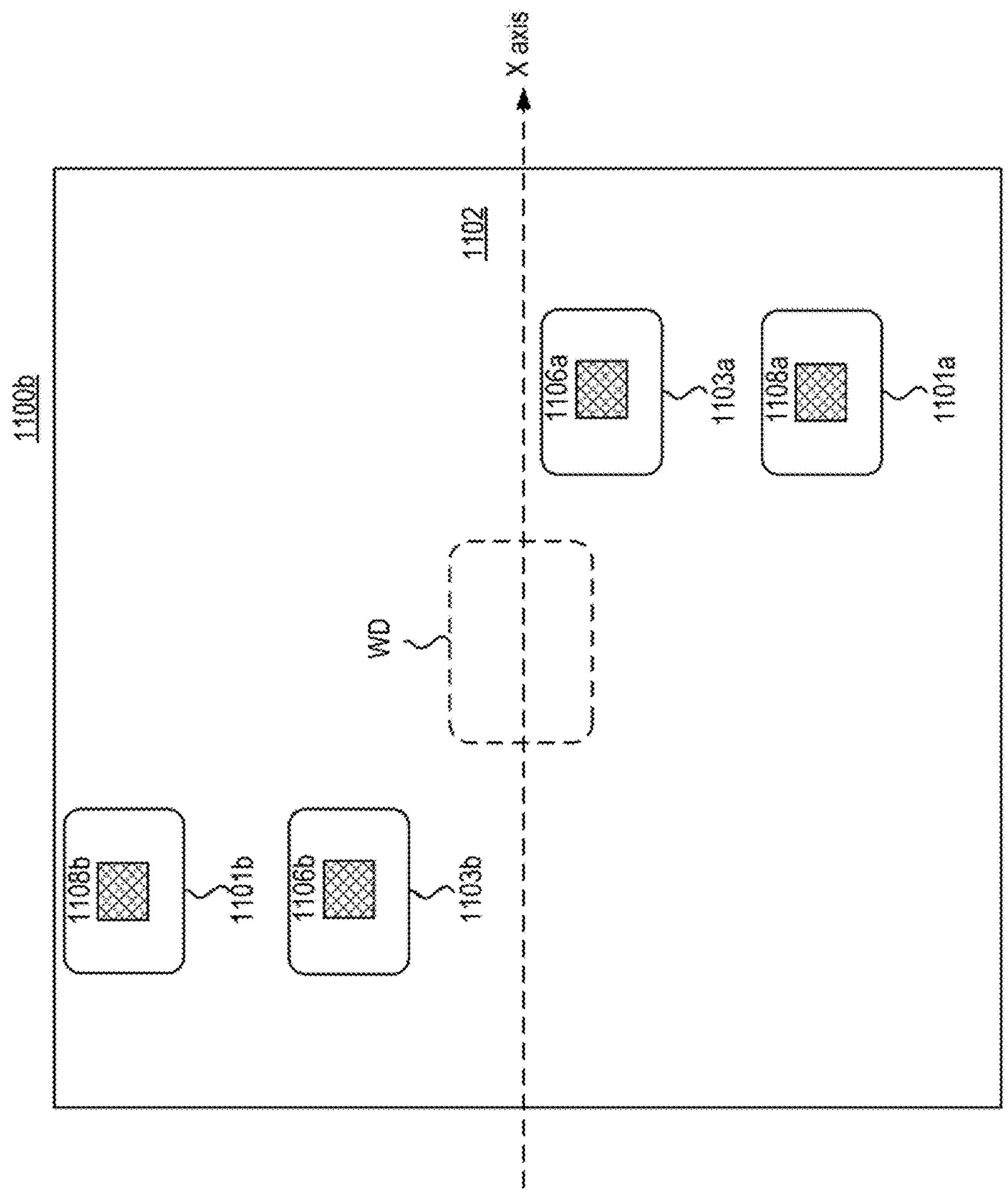

FIG. 11B illustrates a planar view of a photo-detecting apparatus, according to some embodiments. Compared to FIG. 11A, the control metal lines 1106*a*, 1106*b* are not positioned on the axis X axis, but respectively aligned with readout metal lines 1108*a*, 1108*b* in the direction perpendicular to the axis X axis. Similarly, the geometric relations between each element are shown in FIG. 11B.

Figure 11C:
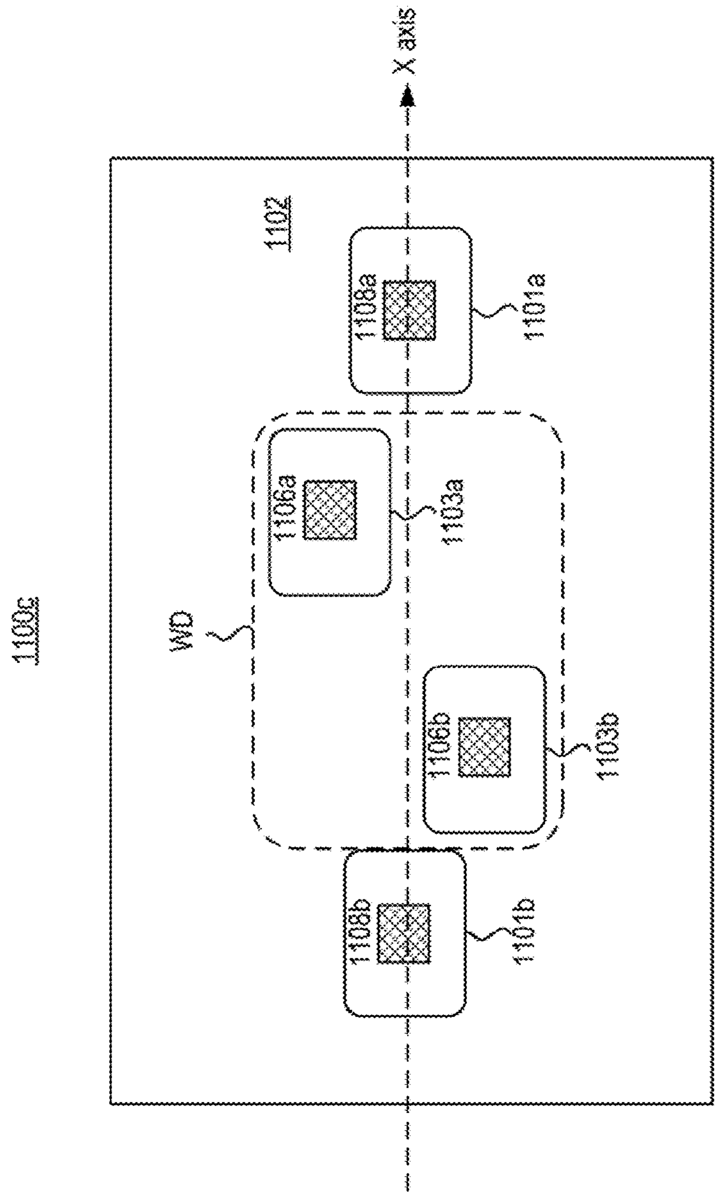

FIG. 11C illustrates a planar view of a photo-detecting apparatus, according to some embodiments. The control metal lines 1106*a*, 1106*b* are formed above the absorbed region AR and opposing each other in a diagonal direction in the optical window WD. The readout metal lines 1108*a*, 1108*b* are formed on the axis X axis.

Figure 11D:
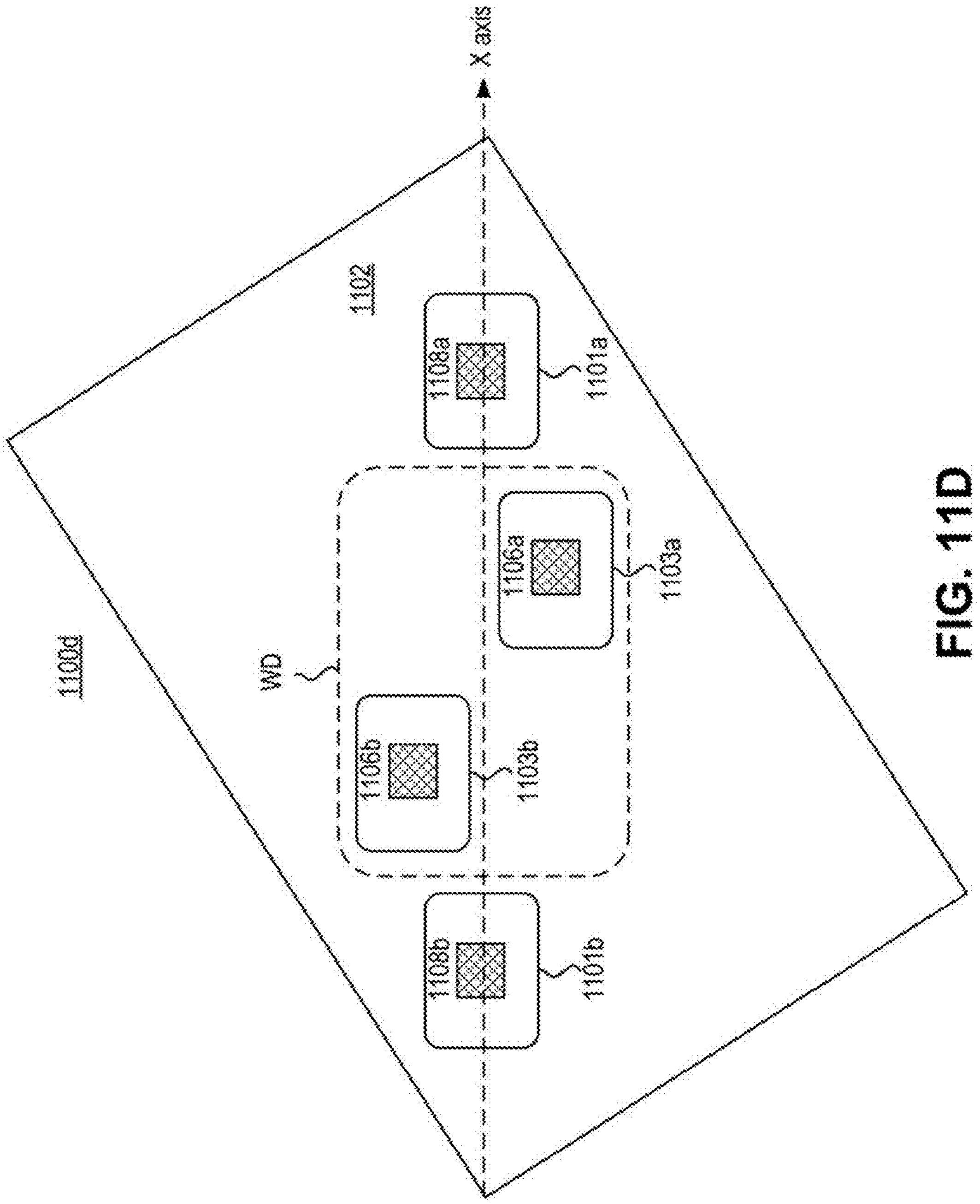

FIG. 11D illustrates a planar view of a photo-detecting apparatus, according to some embodiments. The photo-detecting apparatus in FIG. 11D is similar to that in FIG. 11C, but the germanium-based light absorption material 1102 is rotated so that the axis X axis is in a diagonal direction in the germanium-based light absorption material 1102. It may also reduce the overall area of the photo-detecting apparatus.

Figure 11E:
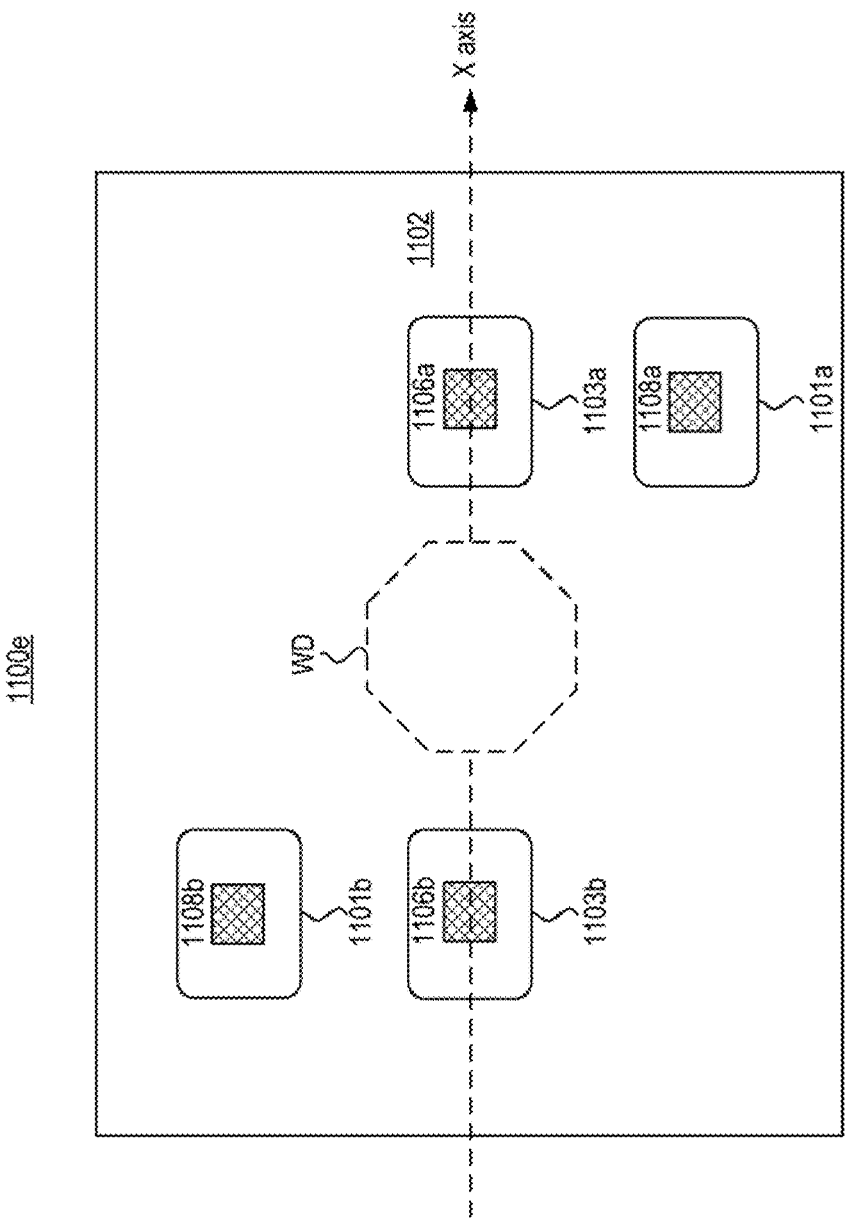

FIG. 11E illustrates a planar view of a photo-detecting apparatus, according to some embodiments. The difference between this embodiment and previous embodiments is the optical window WD can be designed as an Octagon. It can also be designed as other shapes (e.g. circle and hexagon etc.).

FIG. 11A-FIG. 11D illustrates some embodiments by adjusting the layout positions for control metal lines 1106*a*, 1106*b*, readout metal lines 1108*a*, 1108*b*, N-type regions 1001*a*, 1001*b*, and P-type regions 1003*a*, 1003*b*. The implementer can also design different geometric relations for these elements to reduce or minimize the chip area. These alternative embodiments are illustrated as a reference, not a limit.

The photo-detecting apparatuses described above use a single photodetector as an embodiment, which is for single-pixel applications. The photo-detecting apparatuses described below are the embodiments for multiple-pixel applications (e.g., image pixel array or image sensor).

In some implementations, the photo-detecting apparatus can be designed to receive the same or different optical signals, e.g., with the same or different wavelengths, with the same or multiple modulations, or being operated at different time frames.

Figure 12A:
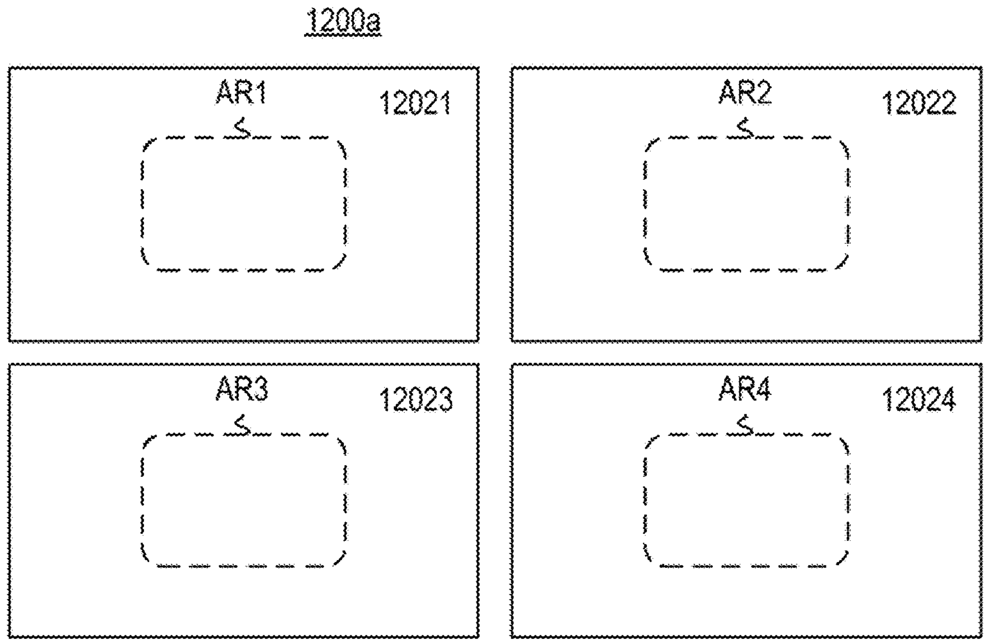
FIGS. 12A-12B illustrate planar views of array configurations of a photo-detecting apparatus, according to some embodiments.

Please refer to FIG. 12A. The photo-detecting apparatus 1200*a* comprises a pixel array, which includes four pixels 12021, 12022, 12023, 12024 as an example. Each pixel is a photodetector in accordance with the embodiments described herein. In one embodiment, optical signal IL that contains optical wavelength $\lambda_1$ is received by the pixels 12021, 12024 in this array, and optical signal IL that contains optical wavelength $\lambda_2$ is received by pixels 12022, 12023 in this array. In an alternative embodiment, there is only one optical wavelength λ but having multiple modulation frequencies $f_{mod1}$ and $f_{mod2}$ (or more). For example, the pixels 12021, 12024 are applied with modulation frequency $f_{mod1}$ to demodulate this frequency component in the optical signal IL, and the pixels 12022, 12023 are applied with modulation frequency $f_{mod2}$ to demodulate this frequency component in the optical signal IL. In an alternative embodiment, similarly, there is only one optical wavelength λ but having multiple modulation frequencies $f_{mod1}$ and $f_{mod2}$ (or more). However, at time $t_1$, the pixels in the array are driven by modulation frequency $f_{mod1}$ to demodulate this frequency component in the optical signal, while at another time $t_2$, the pixels in the array are driven by modulation frequency $f_{mod2}$ to demodulate this frequency component in the optical signal IL, and thus the pixel array 1200*a* is operated under time multiplexing mode.

In an alternative embodiment, optical wavelengths $\lambda_1$ and $\lambda_2$ are respectively modulated by $f_{mod1}$ and $f_{mod2}$, and then collected by pixel array 1200*a*. At time $t_1$, the pixel array 1200*a* is operated at $f_{mod1}$ to demodulate the optical signal in $\lambda_1$; while at time $t_2$, the pixel array 1200*a* is operated at $f_{mod2}$ to demodulate the optical signal in $\lambda_2$. In an alternative embodiment, an optical signal IL with optical wavelength $\lambda_1$ and $\lambda_2$ is modulated by $f_{mod1}$ and $f_{mod2}$, respectively, and the pixels 12021, 12024 are driven by $f_{mod1}$ while the pixels 12022, 12023 are driven by $f_{m0d2}$ to demodulate the incoming modulated optical signal IL simultaneously. Those of skills in the art will readily recognize that other combinations of optical wavelength, modulation scheme and time division may be implemented.

Figure 12B:
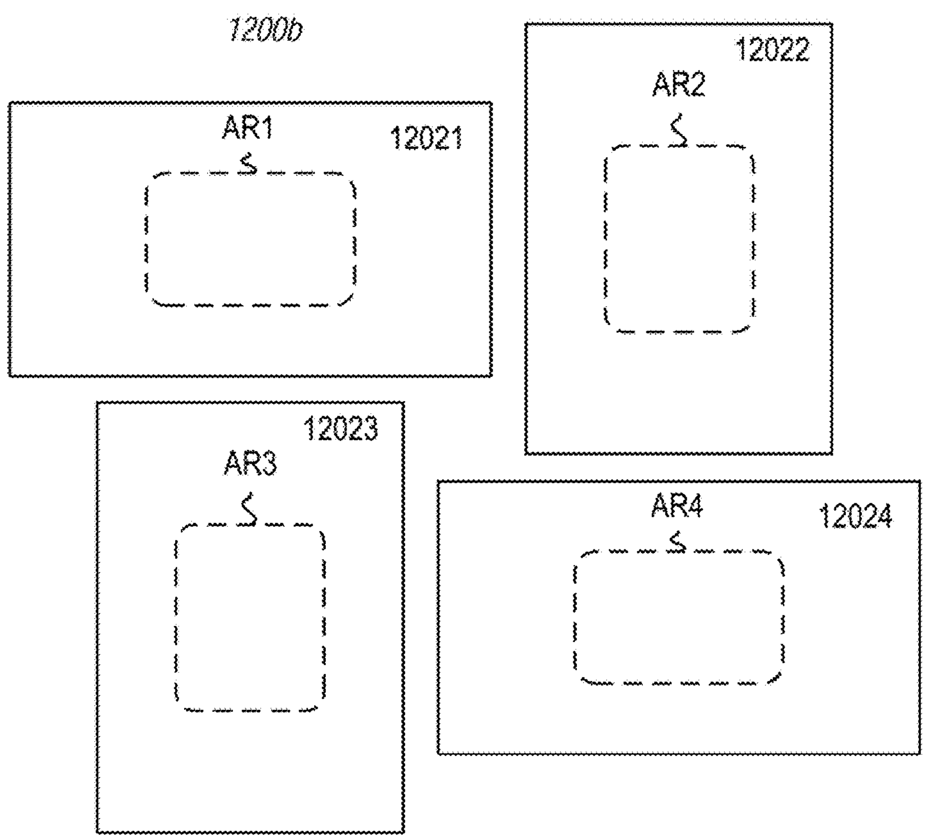

Please refer to FIG. 12B. The photo-detecting apparatus 1200*b* includes four pixels 12021, 12022, 12023, 12024. Each pixel is a photodetector and may use the embodiments disclosed above. In addition to the layout shown in FIG. 12A, the pixels 12021, 12022, 12023, 12024 can be arranged in a staggered layout as shown in FIG. 12B, in which the width and length of each pixel are placed in directions perpendicular to the width and length of the adjacent pixels.

Figure 13A:
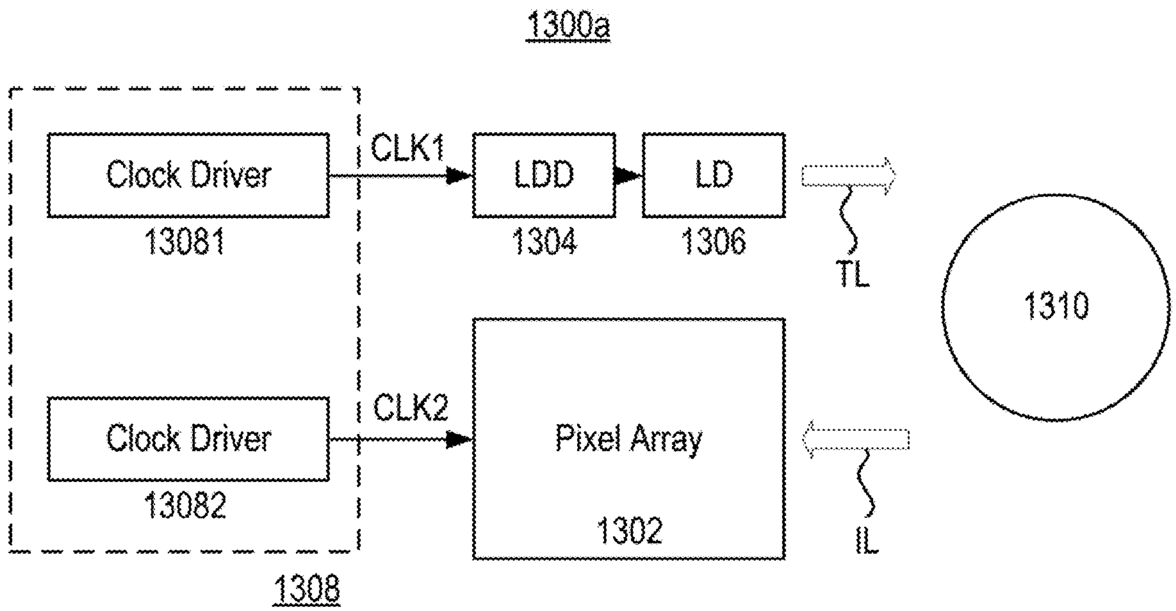
FIG. 13A-13E illustrate blocks and timing diagrams of a photo-detecting apparatus using modulation schemes with phase changes, according to some embodiments.

FIG. 13A illustrates a block diagram of a photo-detecting apparatus 1300*a* using modulation schemes with phase changes, according to some embodiments. The photo-detecting apparatus 1300*a* is an indirect time-of-flight based depth image sensor capable of detecting a distance information with the targeted object 1310. The photo-detecting apparatus 1300*a* includes a pixel array 1302, laser diode driver 1304, laser diode 1306, and clock driving circuit 1308 including clock drivers 13081, 13082. The pixel array 1302 includes a plurality of photodetectors in accordance with the embodiments disclosed herein. In general, the sensor chip generates and sends out the clock signals for 1) modulating the transmitted optical signal by the laser diode driver 1304 and 2) demodulating the received/absorbed optical signal by the pixel array 1302. To obtain the depth information, all photodetectors in an entire pixel array are demodulated by referencing the same clock, which changes to possible four quadrature phases, e.g., 0°, 90°, 180° and 270°, in a temporal sequence and there is no phase change at the transmitter side. However, in this embodiment, the 4-quadrature phase changes are implemented at the transmitter side, and there is no phase change at the receiving side, as explained in the following.

Figure 13B:
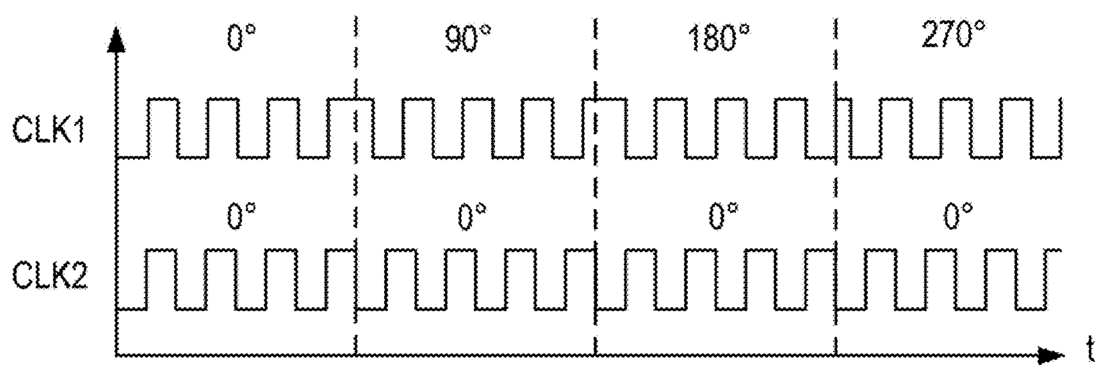

Please refer to FIG. 13B, which depicts a timing diagram of the clock signals CLK1, CLK2 generated by clock drivers 13081, 13082, respectively. The clock signal CLK1 is a modulation signal with 4-quadrature phase changes, e.g., 0°, 90°, 180° and 270°, and clock signal CLK2 is a demodulation signal without phase change. Specifically, the clock signal CLK1 drives the laser diode diver 1304 so that the laser diode 1306 can generate the modulated transmitted light TL. The clock signal CLK2 and its reversed signal CLK2' (not shown in FIG. 13B) are used as the control signal cs1 and control signal cs2 (shown in the above embodiments), respectively, for demodulation. In other words, the control signal cs1 and control signal cs2 in this embodiment are differential signals. This embodiment may avoid the possible temporal coherence inherent in an image sensor due to parasitic resistance-capacitance induced memory effects.

Figure 13C:
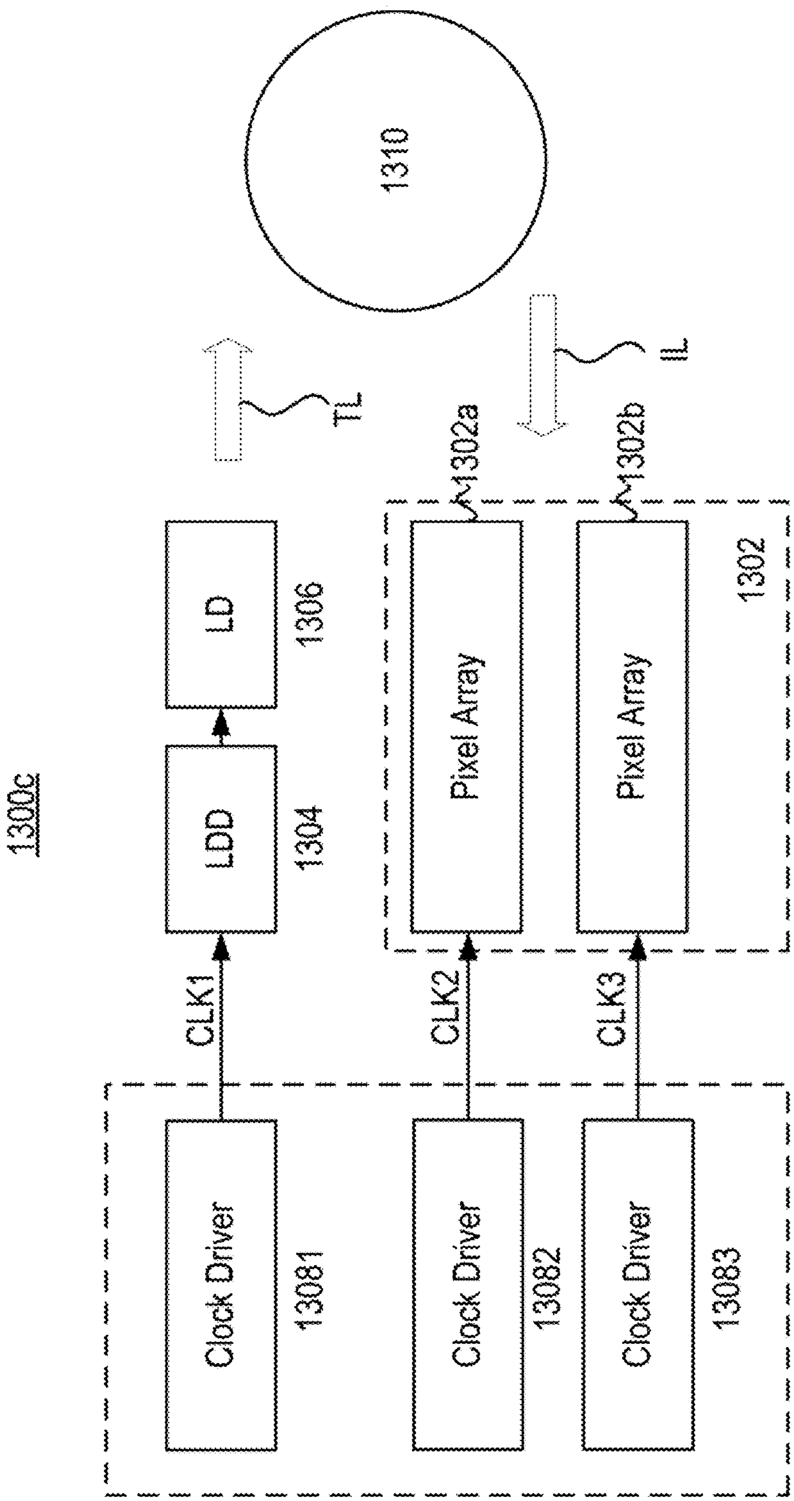
Figure 13D:
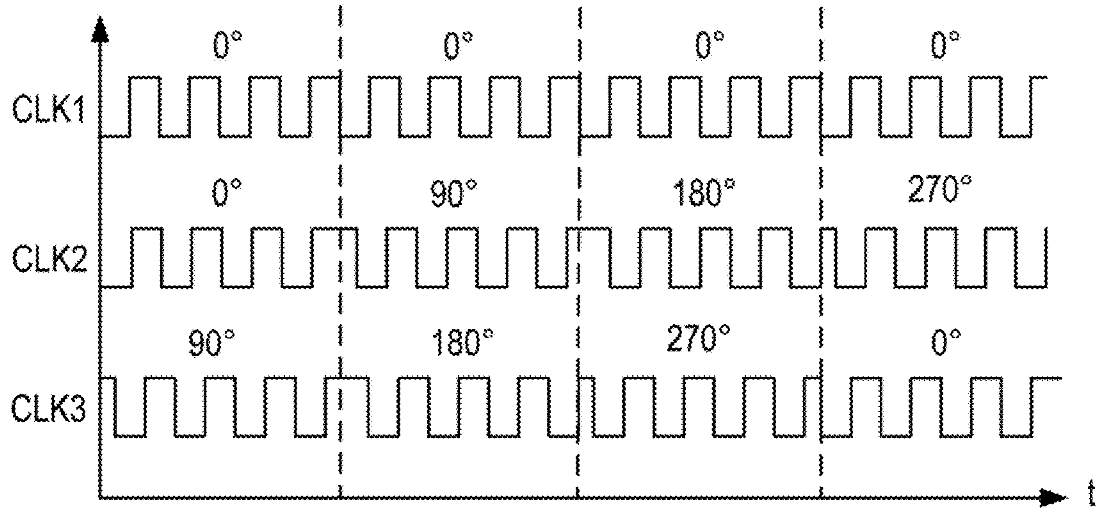

Please refer to FIG. 13C and FIG. 13D. In FIG. 13C, compared to the FIG. 13A, the photo-detecting apparatus 1300*c* uses two demodulation schemes at the receiving side. The pixel array 1302 includes two portions, the first pixel array 1302*a* and the second pixel array 1302*b*. The first demodulation scheme applied to the first pixel array 1302*a* and the second demodulation scheme applied to the second pixel array 1302*b* are different in temporal sequence. For example, the first pixel array 1302*a* is applied with the first demodulation scheme, in which the phase changes in temporal sequence are 0°, 90°, 180° and 270°. The second pixel array 1302*a* is applied with the second demodulation scheme, in which the phase changes in temporal sequence are 90°, 180°, 270° and 0°. The net effect is the phase changes in the first pixel array 1302*a* are in phase quadrature to the phase changes in the second pixel array 1302*b*, while there are no phase changes at the transmitting side. This operation may reduce the max instantaneous current drawn from the power supply if the demodulation waveform is not an ideal square wave.

Figure 13E:
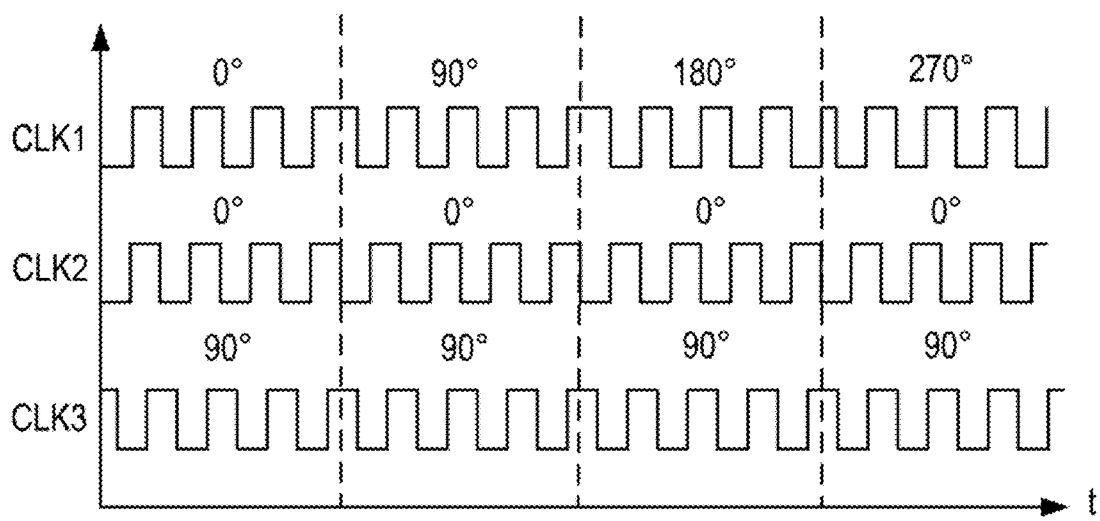

Please refer to FIG. 13E, which shows a modulation scheme using the photo-detecting apparatus 1300*c*. Compared to FIG. 13D, this embodiment applies phase changes to the transmitting side, but does not apply phase changes to the two different pixel arrays 1302*a*, 1302*b* at the receiving side, except setting two different constant phases to the two different pixel arrays 1302*a*, 1302*b*, and the two different constant phases are in phase quadrature to each other. For example, the modulation signal at the transmitting side is the clock signal CLK1, in which the phase changes in temporal sequence are 0°, 90°, 180°, and 270°. The demodulation signals at the receiving side are clock signals CLK2, CLK3. The clock signal CLK2 is used to demodulate the incident optical signal IL absorbed by pixel array 1302*a*, which has a constant phase of 0°. The clock signal CLK3 is used to demodulate the incident optical signal IL absorbed by pixel array 1302*b*, which has a constant phase of 90°.

Although the embodiments illustrated in FIG. 13A-13E use clock signals with a 50% duty cycle as the modulation and demodulation signals, in other possible implementations, the duty cycle can be different (e.g. 30% duty cycle). In some implementations, sinusoidal wave is used as the modulation and demodulation signals instead of square wave.

Figure 14:
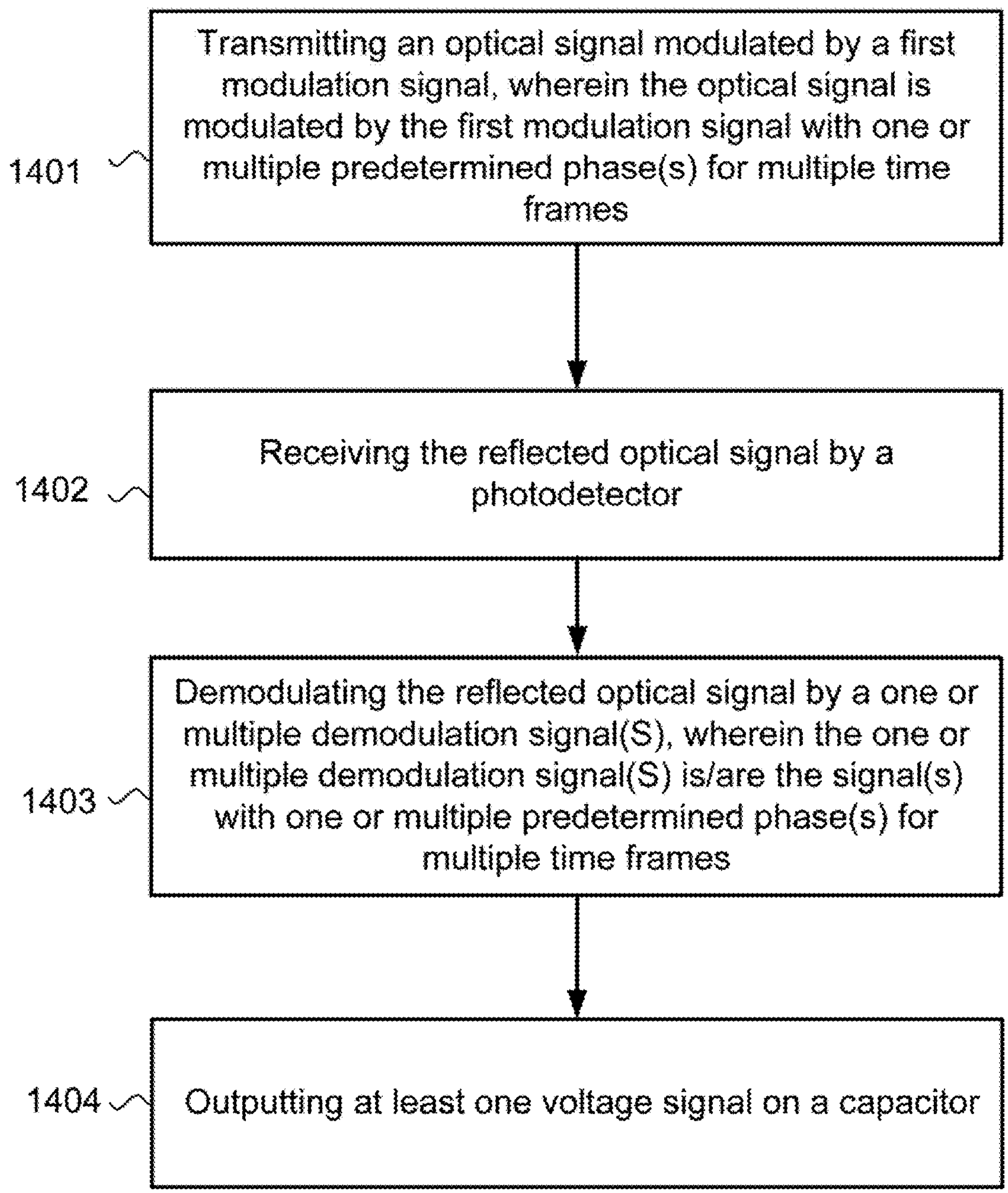
FIG. 14 illustrates a process for using the photo-detecting apparatus using modulation schemes with phase changes, according to some embodiments.

FIG. 14 illustrates a process for using the photo-detecting apparatus using modulation schemes with phase changes, according to some embodiments. Other entities perform some or all of the steps of the process in other embodiments. Likewise, embodiments may include different and/or additional steps, or perform the steps in different orders.

In the embodiment of FIG. 14, the photo-detecting method comprises step 1401: transmitting an optical signal modulated by a first modulation signal, wherein the optical signal is modulated by the first modulation signal with one or multiple predetermined phase(s) for multiple time frames; step 1402: receiving the reflected optical signal by a photodetector; step 1403: demodulating the reflected optical signal by one or multiple demodulation signal(s), wherein the one or multiple demodulation signal(s) is/are the signal(s) with one or multiple predetermined phase(s) for multiple time frames; and step 1404: outputting at least one voltage signal on a capacitor. In this method, the photodetector may use the embodiments mentioned in the present disclosure or its variants.

Figure 15A:
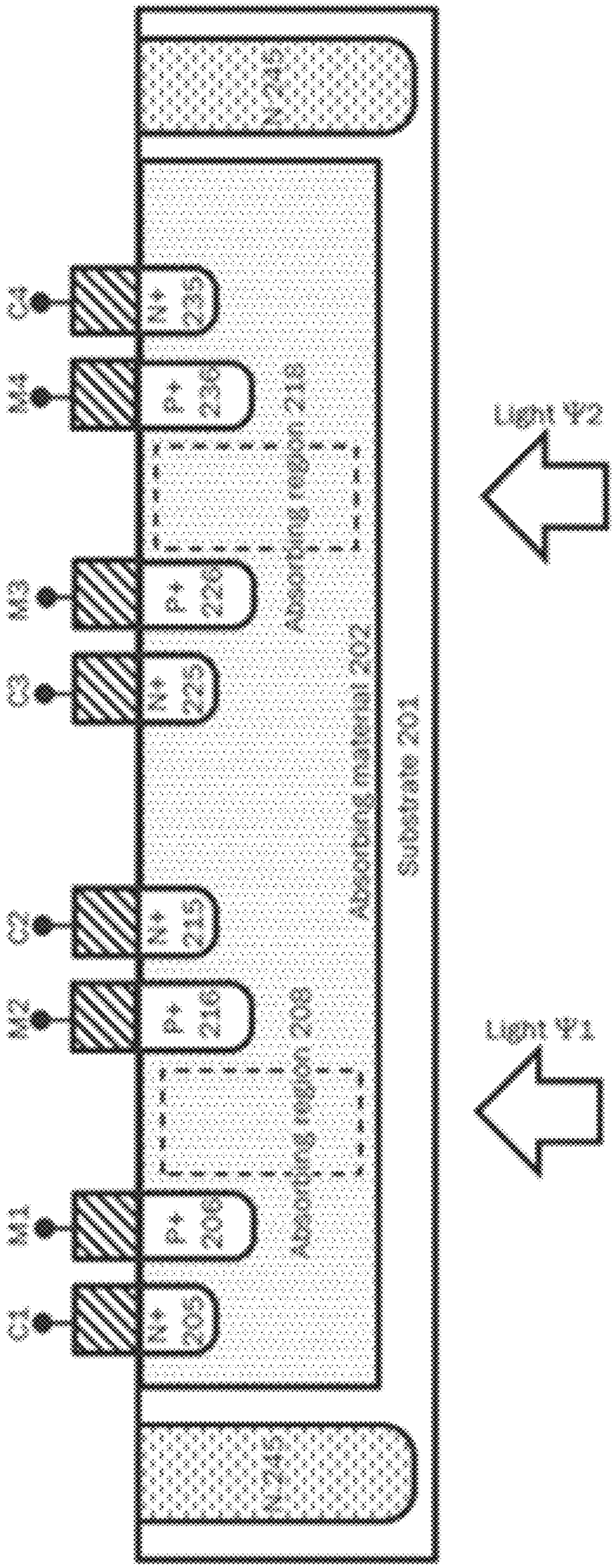
FIG. 15A illustrates a cross-sectional view of a photo-detecting apparatus, according to some embodiments.

In some embodiments, a pixel isolation region, pixel isolation region 924 described with reference to FIGS. 9A-9E, is eliminated in the x-direction, e.g., in a direction that is parallel to a surface of the substrate. By removing the pixel isolation region, the pixel size can be reduced. FIG. 15A illustrates a cross-sectional view of a photo-detecting apparatus, according to some embodiments, of an adjacent pixel structure.

As depicted in FIG. 15A, the photo-detecting apparatus includes a two adjacent pixel structure without isolation in an x-direction that is parallel to the surface of the apparatus. Light signal Ψ1 is focused to an absorbing region 108, e.g., absorbing region 208 in FIG. 15A, where the generated photocurrent will then flow into all electrodes 205, 206, 216, 215. In other words, photo-generated electrons from the absorption region 208 due to light signal Ψ1 will be collected by N+ terminals 205, 215 as well as N+ terminals 225, 235. In some embodiments, the photo-generated electrons generated in the absorption region 208 due to light signal Ψ1 are primarily collected by the N+ terminals 205, 215, and secondarily collected by the N+ terminals 225, 235.

Similarly, a Ψ2 light signal is incident on absorbing region 218, where the generated photocurrent will be collected by the N+ terminals 225, 235 and 205, 215. In some embodiments, the photo-generated electrons from the absorption region 218 are primarily collected by the N+ terminals 225, 235, and secondarily collected by the N+ terminals 205, 215.

In some embodiments, the N+ terminals 215, 225 are biased to provide a depletion region, thereby reducing a number of photo-generated electrons generated in the absorption region 208 due to the Ψ1 light signal that are collected by the N+ terminals 225, 235.

Figure 15B:
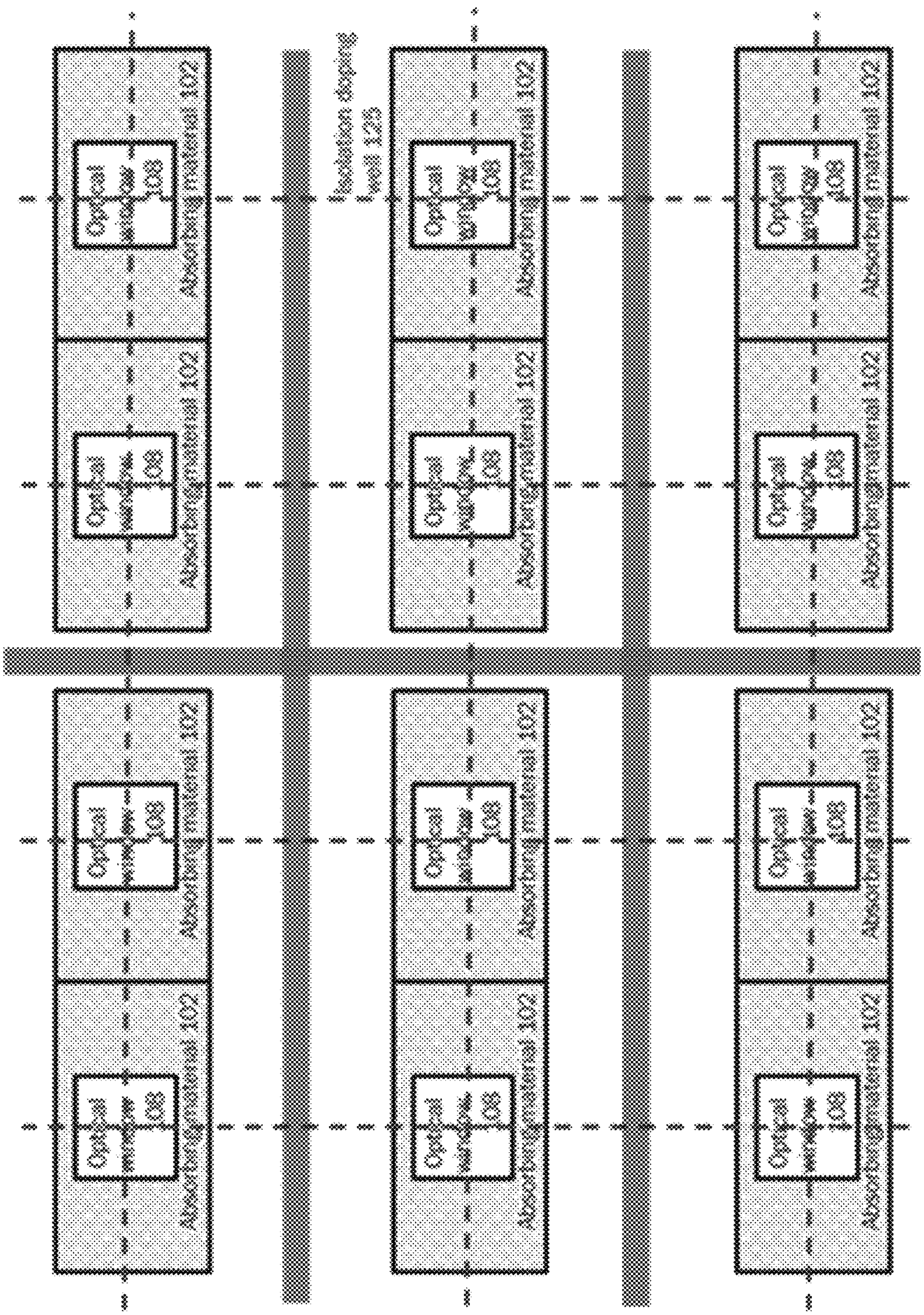
FIG. 15B illustrates a planar view of a photo-detecting apparatus, according to some embodiments.

FIG. 15B illustrates a planar view of a photo-detecting apparatus, according to some embodiments. In the structure depicted in FIG. 15B, the two pixel example depicted in FIG. 15A is along a horizontal line in the plane of the apparatus.

In some embodiments, the system described above with reference to FIGS. 15A and 15B can be generalized to multiple pixels because the system is mathematically linear. For example, the proposed algorithm can be generalized to multiple pixels (>3 pixels) in a horizontal line.

Figure 15C:
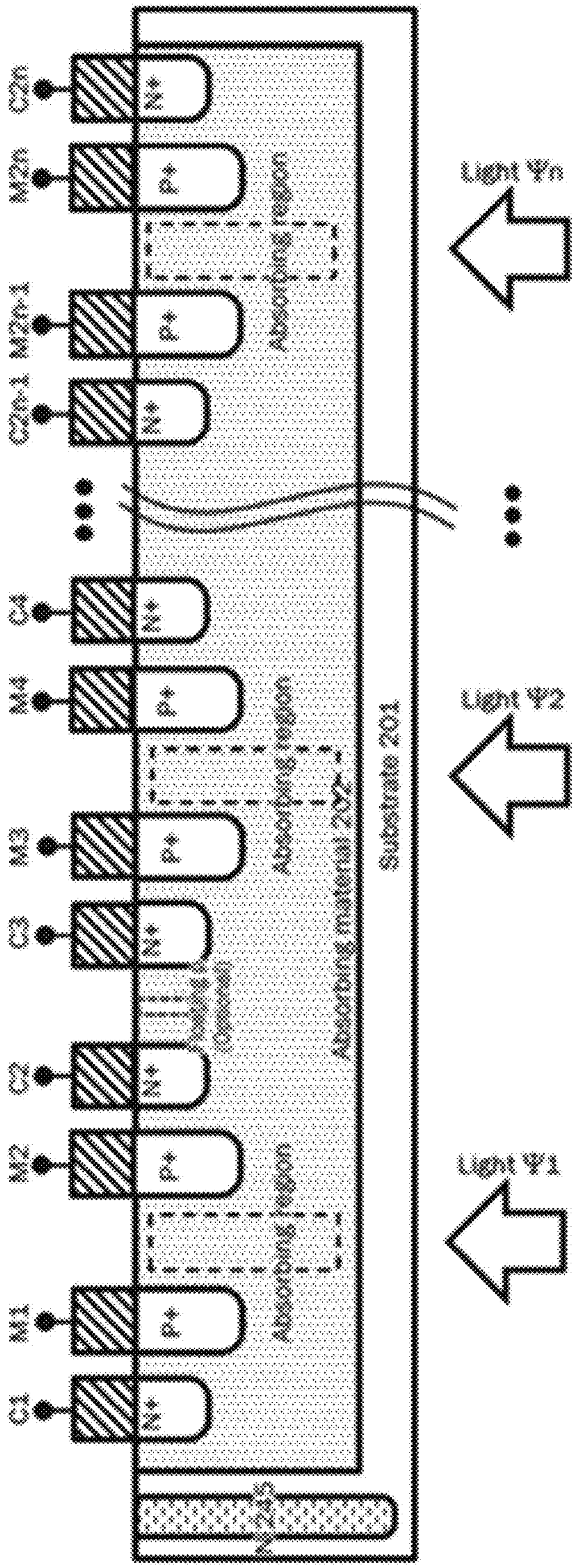
FIG. 15C illustrates a cross-sectional view of a photo-detecting apparatus, according to some embodiments.

FIG. 15C illustrates a cross-sectional view of a photo-detecting apparatus, according to some embodiments. FIG. 15C depicts a structure of an n-pixel without isolation between pixels arranged in a line. Light signals, e.g., light signals Ψ1, Ψ2, Ψn, enter the respective absorbing regions via an arrayed window to prevent light that is shining outside the absorbing window from being absorbed. Optionally, in some embodiments, a floating p region may be inserted in the photo-detecting apparatus between C2 and C3 to reduce crosstalk between pixels.

Figure 15D:
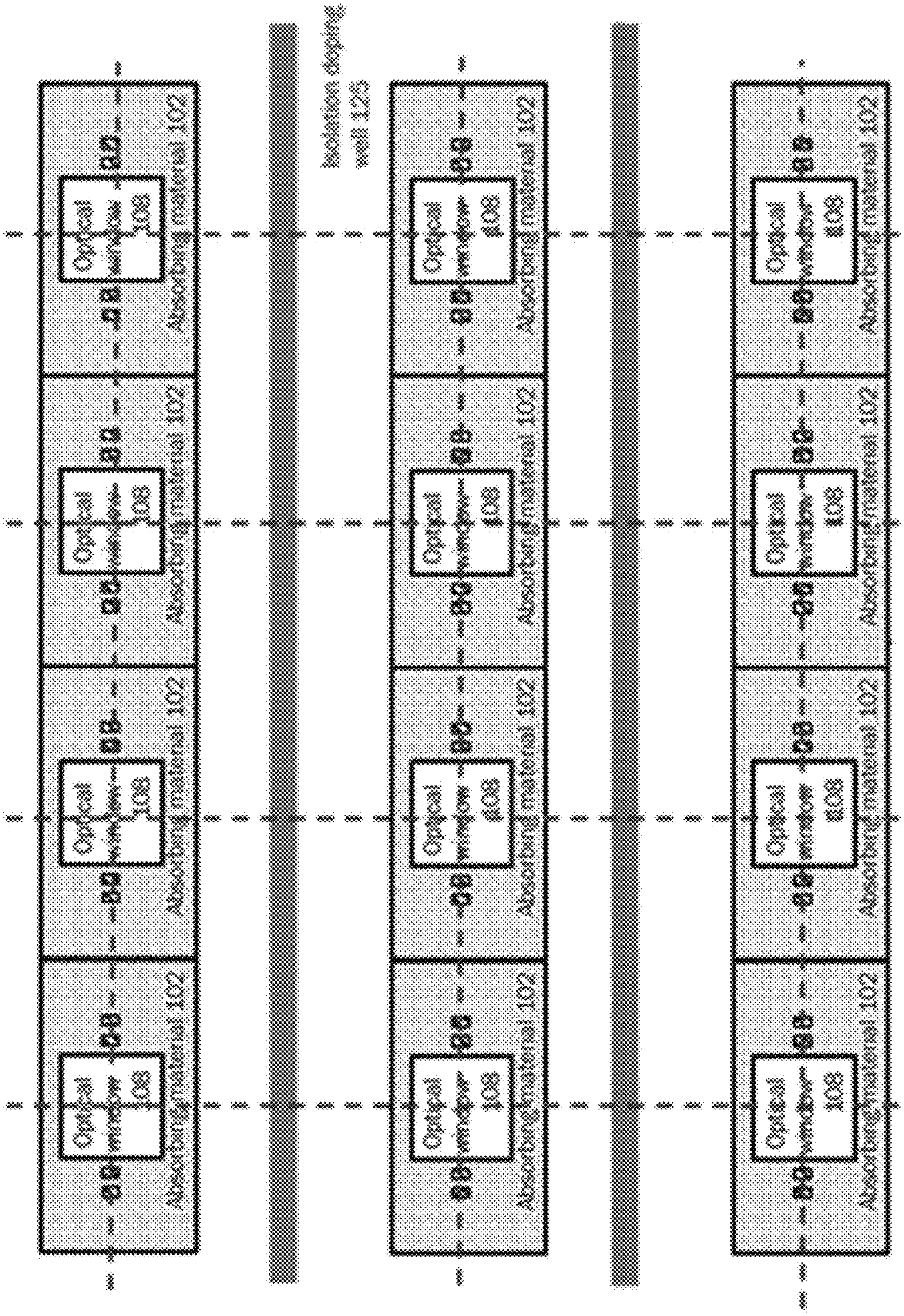
FIGS. 15D-15E illustrate planar views of a photo-detecting apparatus, according to some embodiments.
Figure 15E:
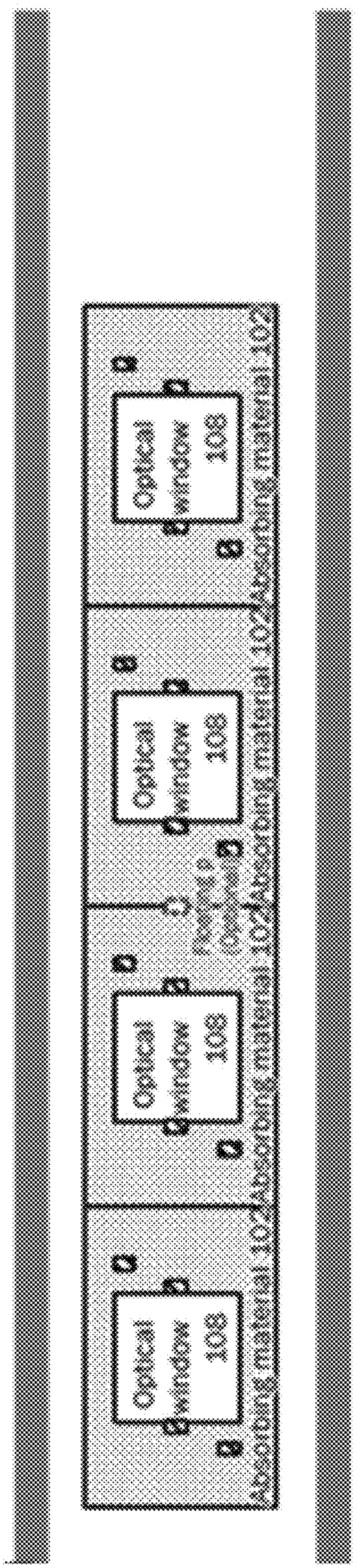

FIGS. 15D-15E illustrate planar views of a photo-detecting apparatus, according to some embodiments. An arrayed layout is shown in FIG. 15D and is an alternative layout to the arrayed layout depicted in FIG. 15B that may reduce more area occupied by the array than the layout shown in FIG. 15B. As depicted in FIG. 15D, the terminals, e.g., terminals C1, M1, M2, C2 from FIG. 15C, are in a same horizontal line.

FIG. 15E is an alternative structure design to FIG. 15D. Here only one line of the array is shown. In this design, the collecting terminals C1 and C2, e.g., terminals C1 and C2 from FIG. 15C, can be shifted in a lateral (y) direction (with respect to the plane of the substrate) and terminals M1 and M2, e.g., terminals M1 and M2 from FIG. 15C, can be moved closer to or into the absorbing region, e.g., closer to or into the optical window 108. This design increases an effective distance between terminals C2 and C3, as compared to FIG. 15D, such that crosstalk between terminals C2 and C3 can be reduced. In some embodiments, the staggered layout of the N+ terminals results in that some of the N+ terminals are not completely blocked by a respective depletion region and thus the generated photocurrent will be collected by more neighboring pixel terminals.

Additionally, a floating p doping region may be implanted to inhibit n-to-n type crosstalk, as described above with reference to FIG. 15D. As compared to FIG. 15D, the layout depicted in FIG. 15E includes additional space in an x-direction, e.g., parallel to the substrate, to place the floating p region.

Similarly, as described above with reference to FIGS. 15A, 15B, the apparatuses of FIGS. 15C-15E can be generalized, e.g., using device symmetry assumptions, to an array of pixels including more than 4-pixel units. For example, a full staggered 2n×2n array can be contemplated without including isolation between pixels. Moreover, device symmetry assumptions can be utilized to calibrate fabrication non-ideality of the array. For example, device shifts or light incident angle tilt between terminals C1 and C2 can be averaged during a modulation scheme, e.g., as described with reference to FIGS. 13A-13E, where the alternative phases of 0° and 180° degrees are in phase (e.g., for a square wave). Similarly, two or n-merged pixels in an n-pixel array can follow a same calibration.

Figure 16A:
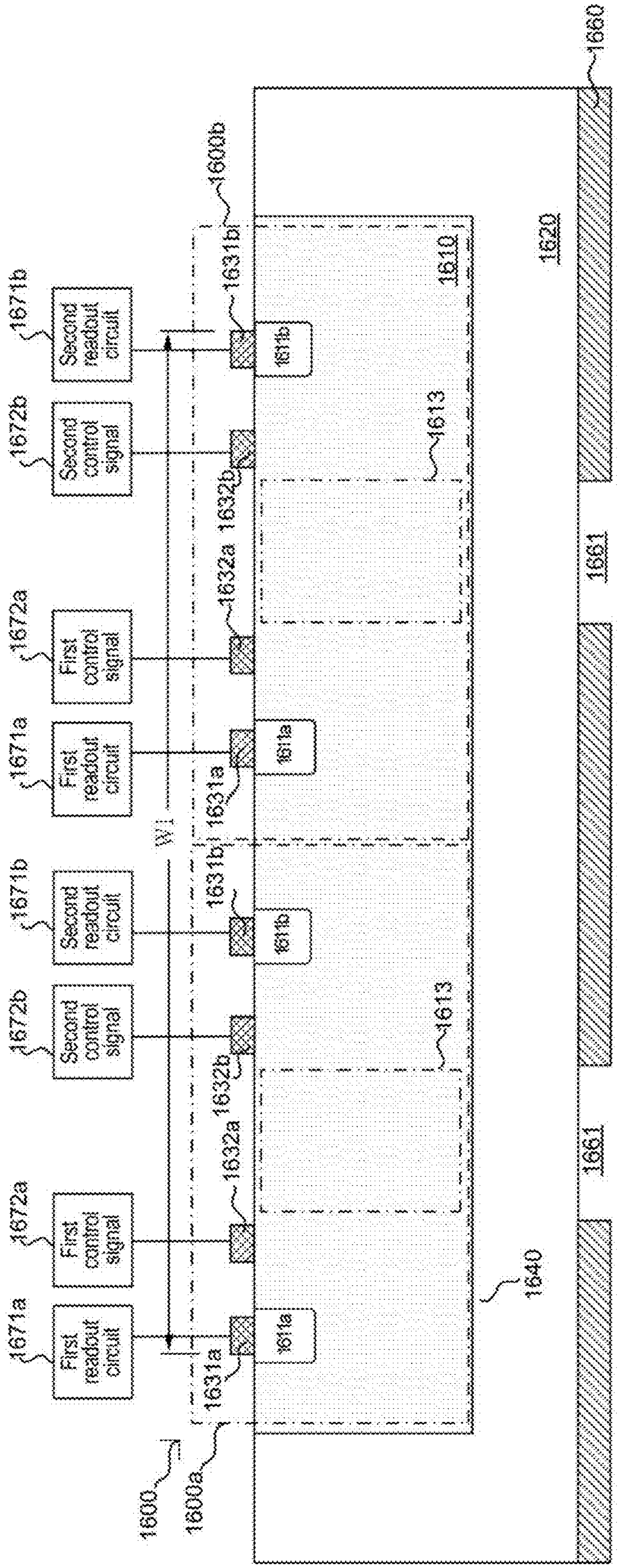
FIG. 16A illustrates a cross-sectional view of a photo-detecting apparatus, according to some embodiments.

FIG. 16A illustrates a cross-sectional view of a photo-detecting apparatus, according to some embodiments. The photo-detecting apparatus includes a pixel 1600 including an absorption region 1610, two subpixels 1600*a*, 1600*b* coupled to the same absorption region 1610. In some embodiments, the number of the subpixels is positive integer and is ≥2. The photo-detecting apparatus further includes a substrate 1620 supporting the absorption region 1610. Each of the subpixels 1600*a*, 1600*b* includes a detection region 1613 and two switches (not labeled) sandwiching the detection region 1613. Each of the switches include a first conductive contact and a second conductive contact. For example, as shown in FIG. 16A, a first switch (not labeled) of the subpixel 1600*a* or 1600*b* includes a first conductive contact 1631*a* and a second conductive contact 1632*a*. A second switch (not labeled) of the subpixel 1600*a* or 1600*b* includes a first conductive contact 1631*b* and a second conductive contact 1632*b*. The collection of the charges by the two switches of a subpixel may be altered over time, such that the imaging system may determine phase information of the sensed light. The imaging system may use the phase information to analyze characteristics associated with the three-dimensional object including depth information or a material composition. The imaging system may also use the phase information to analyze characteristics associated with facial recognition, eye-tracking, gesture recognition, 3-dimensional model scanning/video recording, motion tracking, and/or augmented/virtual reality applications.

In some embodiments, the detection region 1613 is between the two second conductive contacts 1632*a*,1632*b*. The two second conductive contacts 1632*a*,1632*b* are nearer to the detection region 1613 than the first conductive contacts 1631*a*, 1631*b*. In some embodiments, the two detection regions 1613 of the two subpixels 1600*a*, 1600*b* are in the same absorption region 1610. The first conductive contacts 1631*a*,1631*b* and the second conductive contact 1632*a*, 1632*b* are formed on the same absorption region 1610.

In some embodiments, the pixel 1600 includes multiple readout circuits and multiple control signals. For example, the pixel 1600 may include four readout circuits and four control signals. For example, the pixel 1600 includes two first readout circuits 1671*a* and two second readout circuits 1671*b*. The pixel 1600 includes two first control signal 1672*a*, and two second control signal 1672*b*. A group of the first control signal 1672*a* and the second control signal 1672*b* is electrically coupled to the two switches and for controlling the two switches in a single subpixel. A group of the first readout circuit 1671*a* and the second readout circuit 1671*b* is electrically coupled to the two switches and for processing the collected charges. In other words, the first control signal 1672*a* and the second control signal 1672*b* control the electrons or the holes generated by the absorbed photons in the detection region 1613 to be processed by the first readout circuit 1671*a* or the second readout circuit 1671*b* in a single subpixel 1600*a* or 1600*b*. In some embodiments, the first control signal 1672*a* may be fixed at a voltage value Vi, and the second control signal 1672*b* may alternate between voltage values Vi±ΔV. In some embodiments, the first control signal 1672*a* and the second control signal 1672*b* may be voltages that are differential to each other. In some embodiments, one of the control signals is a constant voltage signal (e.g., 0.5 v) and the other control signal is a time-varying voltage signal (e.g., sinusoid signal, clock signal or pulse signal operated between 0V and 1V). The direction of the bias value determines the drift direction of the charges generated from the absorption region 1610.

The two first readout circuits 1671*a* are electrically coupled to the two first conductive contacts 1631*a* of the subpixels 1600*a*, 1600*b* in a one-to-one correlation. The two second readout circuits 1671*b* are electrically coupled to the two first conductive contacts 1631*b* of the subpixels 1600*a*, 1600*b* in a one-to-one correlation. The first conductive contacts 1631*a*, 1631*b* may be readout contacts. The two first control signals 1672*a* are electrically coupled to the two second conductive contacts 1632*a* of the subpixels 1600*a*, 1600*b* in a one-to-one correlation. The two second control signals 1672*b* are electrically coupled to the two second conductive contacts 1632*b* of the subpixels 1600*a*, 1600*b* in a one-to-one correlation. The second conductive contacts 1632*a*, 1632*b* may be control contacts.

In some embodiments, the portions of the absorption region 1610 right under the second conductive contacts 1632*a*, 1632*b* may be intrinsic or include a dopant having a peak concentration below approximately $1\times10^{15}$ $cm^{-3}$. The term "intrinsic" means that the portions of the semiconductor material right under the second conductive contacts 1632*a*, 1632*b* are without intentionally added dopants. In some embodiments, the second conductive contacts 1632*a*, 1632*b* on the absorption region 1610 may lead to formation of a Schottky contact, an Ohmic contact, or a combination thereof having an intermediate characteristic between the two, depending on various factors including the material of the absorption region 1610, the second conductive contacts 1632*a*, 1632*b*, and the impurity or defect level of the absorption region 1610.

The first control signal 1672*a* and the second control signal 1672*b* are used to control the collection of electrons generated by the absorbed photons from the detection region 1613. For example, when voltages are used, if the first control signal 1672*a* is biased against the second control signal 1672*b*, an electric field is created between the two portions right under the second conductive contacts 1632*a*, 1632*b*, and free charges drift towards one of the two portions right under the second conductive contacts 1632*a*, 1632*b* depending on the direction of the electric field.

In some embodiments, each of the switches of the subpixels 1600*a*, 1600*b* includes two first doped regions 1611*a*, 1611*b* under the first conductive contacts 1631*a*, 1631*b* respectively and formed in the same absorption region 1610. In other words, the four first doped regions 1611*a*,1611*b* of the two subpixels 1600*a*, 1600*b* are formed in the same absorption region 1610. In some embodiments, a minimum width $w_1$ between the first conductive contacts of the two adjacent subpixels is less than a width of the absorption region 1610. For example, a minimum width between the first conductive contact 1631*a* of the subpixel 1600*a* and the first conductive contact 1631*b* of the subpixel 1600*b* is less than a width of the absorption region 1610.

In some embodiments, the first doped region 1611*a*,1611*b* are of a first conductivity type. In some embodiments, the first doped region 1611*a*,1611*b* include a dopant. The peak concentrations of the dopants of the first doped regions 1611*a*,1611*b* depend on the material of the first conductive contact 1631*a*, 1631*b* and the material of the absorption region 1610, for example, between $5\times10^{18}$ $cm^{-3}$ to $5\times10^{20}$ $cm^{-3}$. The first doped regions 1611*a*, 1611*b* are for collecting the carriers generated from the absorption region 1610, which are further processed by the first readout circuit 1671*a* and the second readout circuit 1671*b* respectively based on the control of the first control signal 1672*a* and the second control signal 1672*b*.

In the present disclosure, in a same photo-detecting apparatus, the type of the carriers collected by the first doped region 1611*a* and the type of the carriers collected by the first doped regions 1611*b* are the same. For example, when the photo-detecting apparatus is configured to collects electrons, when the first switch of a single subpixel is switched on and the second switch of the same subpixel is switched off, the first doped region 1611*a* collects electrons of the photo-carriers generated from the detection region 1613, and when the second switch is switched on and the first switch is switched off, the first doped region 1611*b* also collects electrons of the photo-carriers generated from the detection region 1613.

In some embodiments, the photo-detecting apparatus may include a light shield 1660 having multiple windows 1661 for defining the position of the detection region 1613 of each of the subpixels 1600*a*, 1600*b*. In other words, the window 1661 is for allowing the incident optical signal enter into the absorption region 1610 and defining the detection regions 1613. In some embodiments, the light shield is on a bottom surface of the substrate 1620 distant from the absorption region 1610 when an incident light enters the absorption region 1610 from the bottom surface of the substrate 1620. In some embodiments, a shape of the window 1661 can be ellipse, circle, rectangular, square, rhombus, octagon or any other suitable shape from a top view of the window 1661.

In some embodiments, the photo-detecting apparatus further includes multiple optical elements (not shown) over the multiple subpixels in a one-to-one correlation. The optical element converges an incoming optical signal to enter the detection regions 1613.

In some embodiments, since multiple subpixels 1600*a*, 1600*b* are integrated with a single absorption region 1610, the photo-detecting apparatus is downsized and the dark current from the generation current occurring at the interface of the substrate 1620 and the absorption region 1610 is reduced. Furthermore, the spatial resolution of the photo-detecting apparatus is improved and the size of a single photo-detecting apparatus unit 1600 is reduced.

Figure 16B:
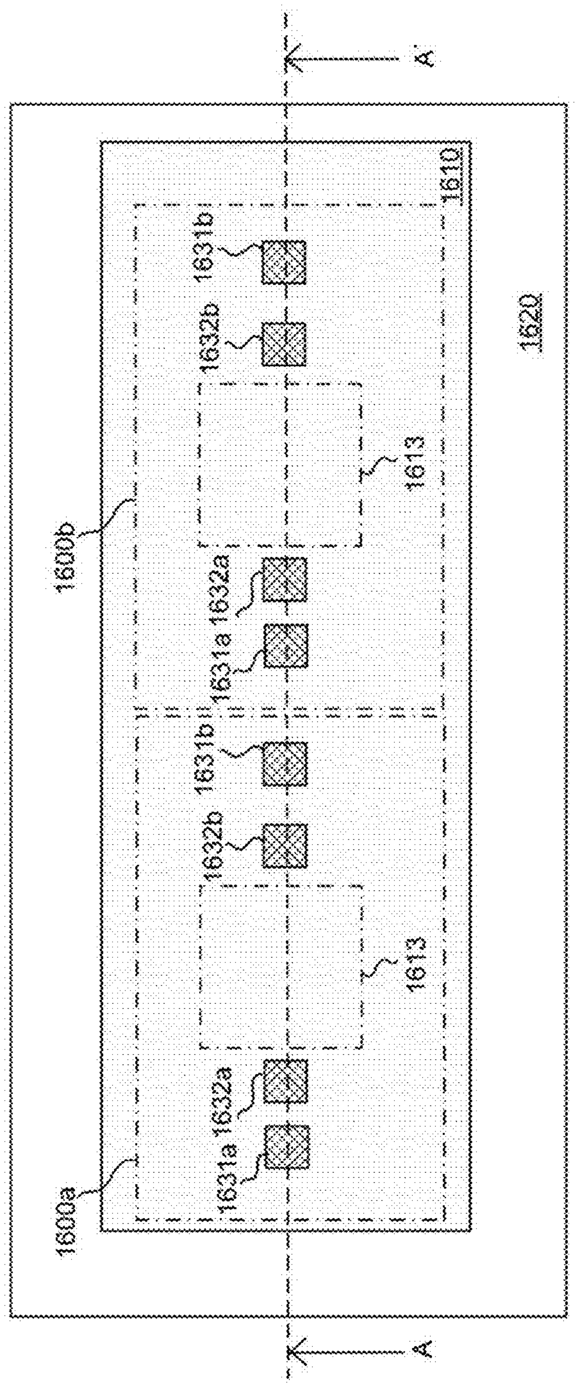
FIG. 16B illustrates a top view of a photo-detecting apparatus, according to some embodiments.

FIG. 16B illustrates a top view of a photo-detecting apparatus, according to some embodiments. In some embodiments, FIG. 16A illustrates a cross-sectional view along an A-A' line in FIG. 16B. In some embodiments, the first conductive contacts 1631*a*,1631*b* and the second conductive contacts 1632*a*, 1632*b* of the two subpixels 1600*a*, 1600*b* are aligned along a longer side of the absorption region 1610.

Figure 16C:
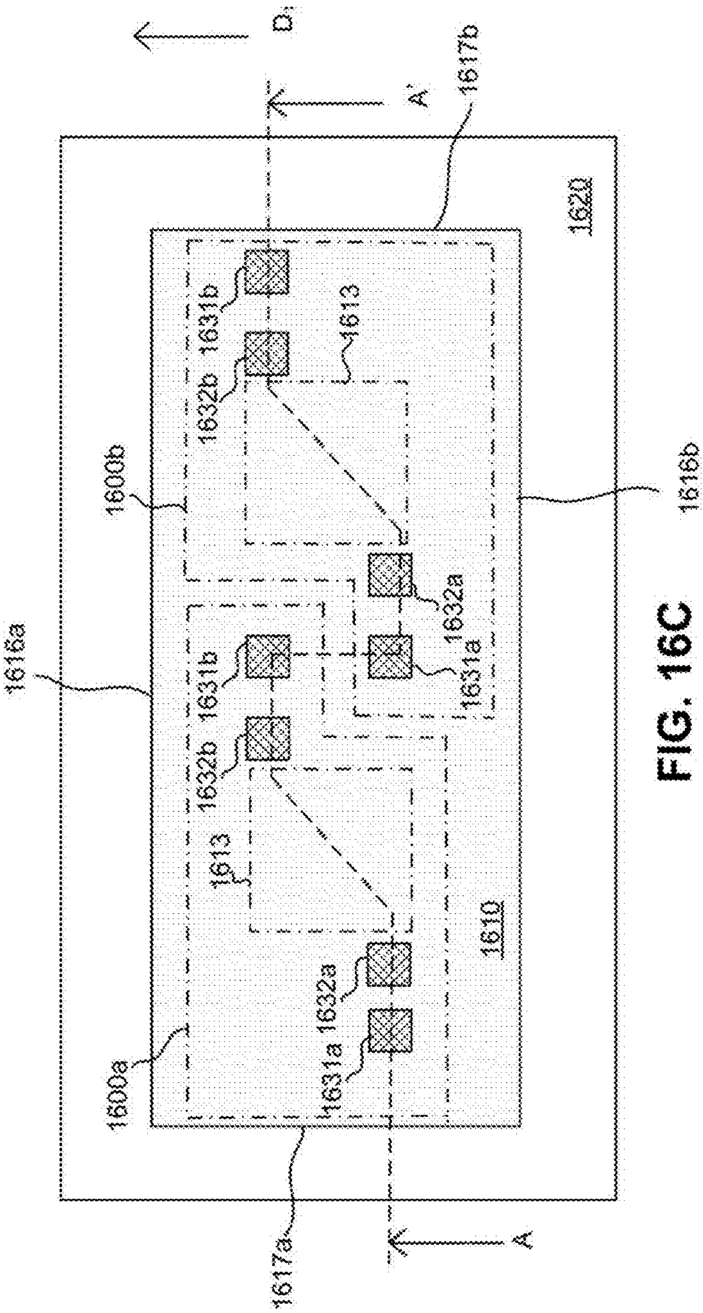
FIG. 16C illustrates a top view of a photo-detecting apparatus, according to some embodiments.

FIG. 16C illustrates a top view of a photo-detecting apparatus, according to some embodiments. In some embodiments, FIG. 16A illustrates a cross-sectional view along an A-A' line in FIG. 16C. In some embodiments, the cross-sectional view shown in FIG. 16A may be a cross-sectional view along any possible cross sectional line of a photo-detecting apparatus. In some embodiments, the two first conductive contacts 1631*a*,1631*b* of one of the two subpixels 1600*a* are arranged diagonally to the detection region 1613. In some embodiments, the absorption region 1610 includes two first sides 1616*a*,1616*b* and two second sides 1617*a*,1617*b*. Each of the first sides 1616*a*,1616*b* has a length longer than a length of each of the second sides 1617*a*,1617*b*. The first conductive contact 1631*b* of the subpixels 1600*a* is closer to the first side 1616*a* than the first conductive contact 1631*a* of the subpixels 1600*b*. The first conductive contact 1631*a* of the subpixels 1600*b* is closer to the first side 1616*b* than the first conductive contact 1631*b* of the subpixels 1600*a*. In some embodiments, the first conductive contact 1631*b* of the subpixels 1600*a* is between the first side 1616*a* and the first conductive contact 1631*a* of the subpixels 1600*b*. In some embodiments, the first conductive contact 1631*a* of the subpixels 1600*b* is between the first side 1616*b* and the first conductive contact 1631*b* of the subpixels 1600*a*. In some embodiments, the second conductive contact 1631*b* of the subpixels 1600*a* is aligned with the first conductive contact 1631*a* of the subpixels 1600*b* along a horizontal direction $D_1$. As a result, the photo-detecting apparatus can be further downsized.

Figure 16D:
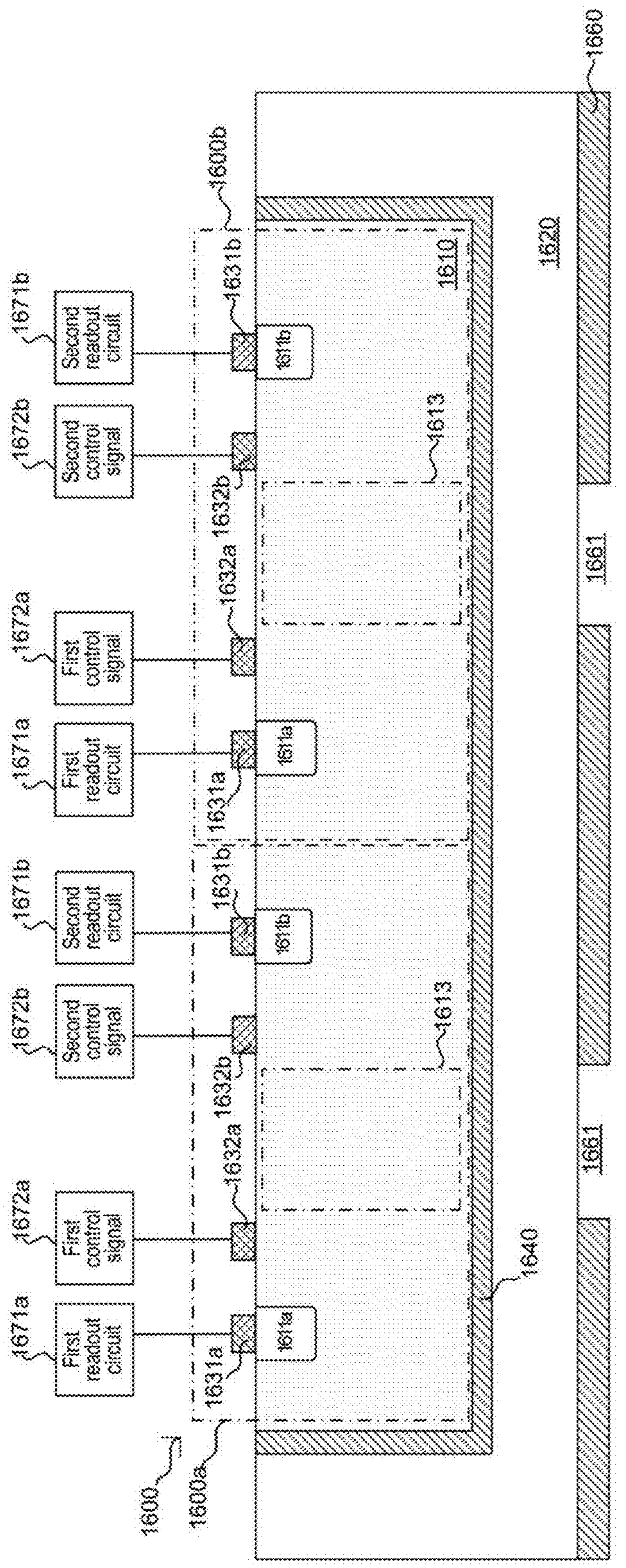
FIG. 16D illustrates a cross-sectional view of a photo-detecting apparatus, according to some embodiments.

FIG. 16D illustrates a cross-sectional view of a photo-detecting apparatus, according to some embodiments. The photo-detecting apparatus in FIG. 16D is similar to the photo-detecting apparatus in FIG. 16A, the difference is described below.

In some embodiments, the pixel 1600 further includes a blocking layer 1640 surrounding the absorption region 1610, that is, the detection regions 1613 of the subpixels 1600*a*, 1600*b* are surrounded by the same blocking layer 1640. In some embodiments, the blocking layer 1640 is of a conductivity type different from the first conductivity type of each of the first doped regions 1611*a*,1611*b*. The blocking layer 1640 may block photo-generated charges in the absorption region 1610 from reaching the substrate 1620, which increases the collection efficiency of photo-generated carriers of the subpixels 1600*a*,1600*b*. The blocking layer 1640 may also block photo-generated charges in the substrate 1620 from reaching the absorption region 1610, which increases the speed of photo-generated carriers of the subpixels. The blocking layer 1640 may include a material the same as the material of the absorption region 1610, the same as the material of the substrate 1620, or different from the material of the absorption region 1610 and the material of the substrate 1620. In some embodiments, the shape of the blocking layer 1640 can be, but is not limited to a ring.

In some embodiments, the blocking layer 1640 includes a dopant having a peak concentration ranging from $10^{15}$ $cm^{-3}$ to $10^{20}$ $cm^{-3}$. The blocking layer 1640 may reduce the cross talk between two adjacent pixels 1600.

In some embodiments, photo-detecting apparatus may further include a third conductive contact (not shown) electrically connected to the blocking layer 1640. The blocking layer 1640 may be biased through the third conductive contact by a bias voltage to discharge carriers not collected by the first doped regions 1611*a*,1611*b* of the subpixels 1600*a*,1600*b*.

Figure 16E:
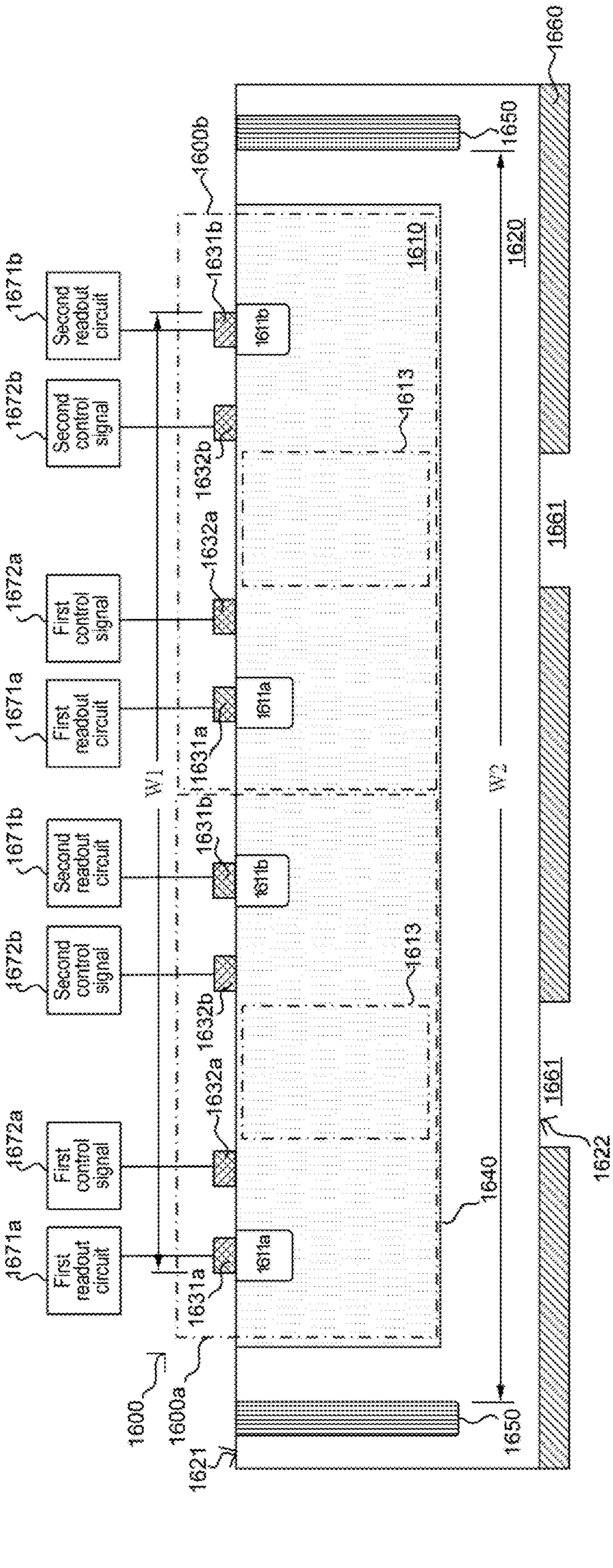
FIG. 16E illustrates a cross-sectional view of a photo-detecting apparatus, according to some embodiments.

FIG. 16E illustrates a cross-sectional view of a photo-detecting apparatus, according to some embodiments. The photo-detecting apparatus in FIG. 16E is similar to the photo-detecting apparatus in FIG. 16A, the difference is described below.

In some embodiments, the photo-detecting apparatus further includes an isolation region 1650 disposed at two opposite sides of the absorption region 1610 from a cross-sectional view of the photo-detecting apparatus. The isolation region 1650 is outside of the absorption region 1610 and physically separated from the absorption region 1610. In some embodiments, the detection regions 1613 of the subpixels 1600*a*,1600*b* are surrounded by the same isolation region 1650. In some embodiments, a minimum width $w_1$ between the first conductive contacts of the two adjacent subpixels is less than a width of the isolation region 1650. For example, a minimum width between the first conductive contact 1631*a* of the subpixel 1600*a* and the first conductive contact 1631*b* of the subpixel 1600*b* is less than a width w2 of the isolation region 1650. In some embodiments, the isolation region 1650 is a trench filled with a dielectric material or an insulating material to serve as a region of electrical resistance between the two adjacent pixels, impeding a flow of current across the isolation region 1650 and improving electrical isolation between the adjacent pixels 1600. The dielectric material or an insulating material may include, but is not limited to oxide material including $SiO_2$ or nitride material including $Si_3N_4$. In some embodiments, the trench is filled with Si.

In some embodiments, the isolation region 1650 extends from an upper surface 1621 of the substrate 1620 and extends into a predetermined depth from the upper surface 1621. In some embodiments, the isolation region 1650 extends from a bottom surface 1622 of the substrate 1620 and extends into a predetermined depth from the bottom surface 1622. In some embodiments, the isolation region 1650 penetrates though the substrate 1620 from the upper surface 1621 and the bottom surface 1622.

In some embodiments, the isolation region 1650 is a doped region having a conductivity type. The conductivity type of the isolation region 1650 can be different from or the same as the first conductivity type of the first doped regions 1611*a*, 1611*b*. The peak concentration of the isolation region 1650 may range from $10^{15}$ $cm^{-3}$ to $10^{20}$ $cm^{-3}$.

The doping of the isolation region 1650 may create a bandgap offset-induced potential energy barrier that impedes a flow of current across the isolation region 1650 and improving electrical isolation between the adjacent pixels 1600. In some embodiments, the isolation region 1650 includes a semiconductor material that is different from the material of the substrate 1620. An interface between two different semiconductor materials formed between the substrate 1620 and the isolation region 1650 may create a bandgap offset-induced energy barrier that impedes a flow of current across the isolation region 1650 and improving electrical isolation between the adjacent pixels 1600. In some embodiments, the shape of the isolation region 1650 may be a ring. In some embodiments, the isolation region 1650 may include two discrete regions disposed at the at two opposite sides of the absorption region 1610.

Figure 16F:
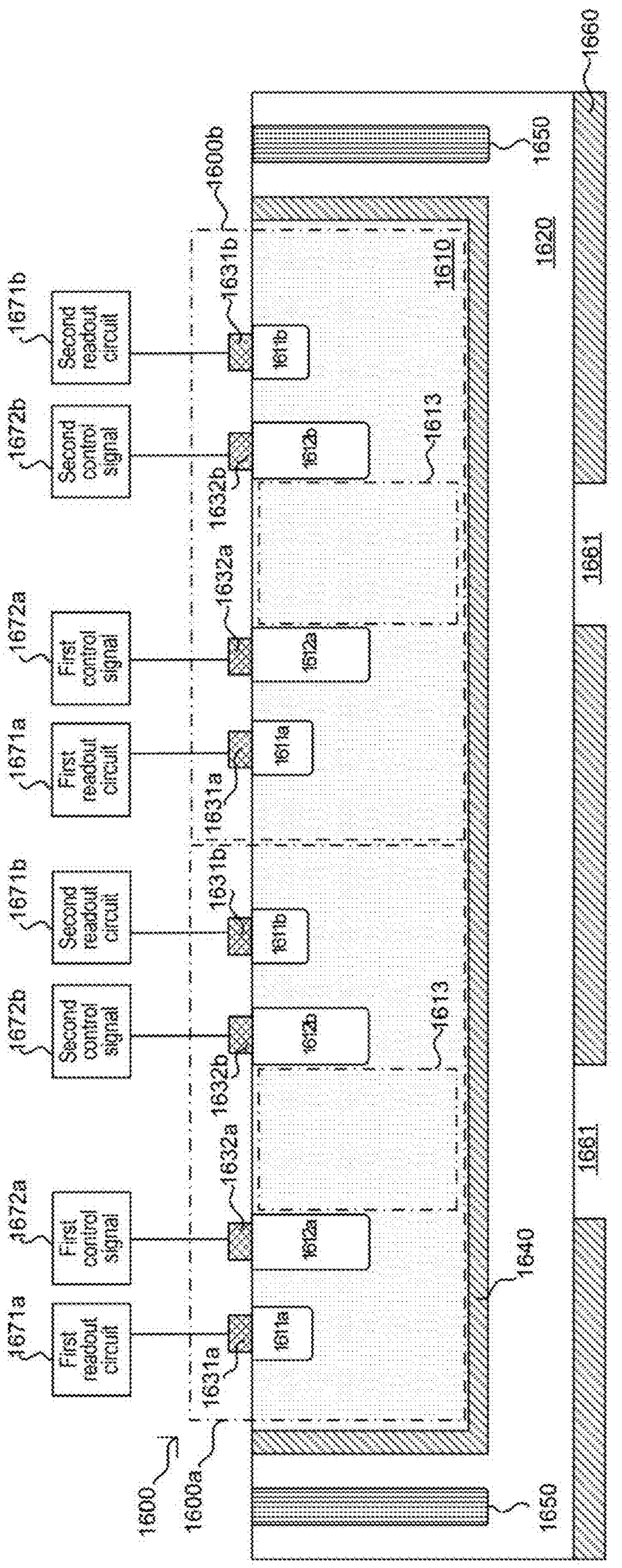
FIG. 16F illustrates a cross-sectional view of a photo-detecting apparatus, according to some embodiments.

FIG. 16F illustrates a cross-sectional view of a photo-detecting apparatus, according to some embodiments. The photo-detecting apparatus in FIG. 16F is similar to the photo-detecting apparatus in FIG. 16E, the difference is described below.

In some embodiments, the photo-detecting apparatus includes both the blocking layer 1640 in FIG. 16D and the isolation region 1650 FIG. 16E. The conductivity type of the isolation region 1650 is different from the conductivity type of the blocking layer 1640. For example, when the conductivity type of the blocking layer 1640 is p-type, the conductivity type of the isolation region 1650 is n-type.

In some embodiments, each of the switches of the subpixels 1600*a*, 1600*b* includes two second doped regions 1612*a*,1612*b* under the second conductive contacts 1632*a*, 1632*b* respectively and formed in the same absorption region 1610. In other words, the four second doped regions 1612*a*,1612*b* of the two subpixels 1600*a*, 1600*b* are formed in the same absorption region 1610.

In some embodiments, the second doped regions 1612*a*, 1612*b* are of a second conductivity type different from the first conductivity type. In some embodiments, each of the second doped regions 1612*a*,1612*b* is doped with a dopant. The peak concentrations of the dopants of the second doped regions 1612*a*,1612*b* depend on the material of the second conductive contact 1632*a*, 1632*b* and the material of the absorption region 1610, for example, between $1\times10^{17}$ $cm^{-3}$ to $5\times10^{20}$ $cm^{-3}$. The second doped regions 1612*a*,1612*b* forms a Schottky or an Ohmic contact with the second conductive contacts 1632*a*,1632*b*. The second doped regions 1612*a*,1612*b* are for modulating the carriers generated from the absorption region 1610 based on the control of the first control signal 1672*a* and the second control signal 1672*b*.

Figure 16G:
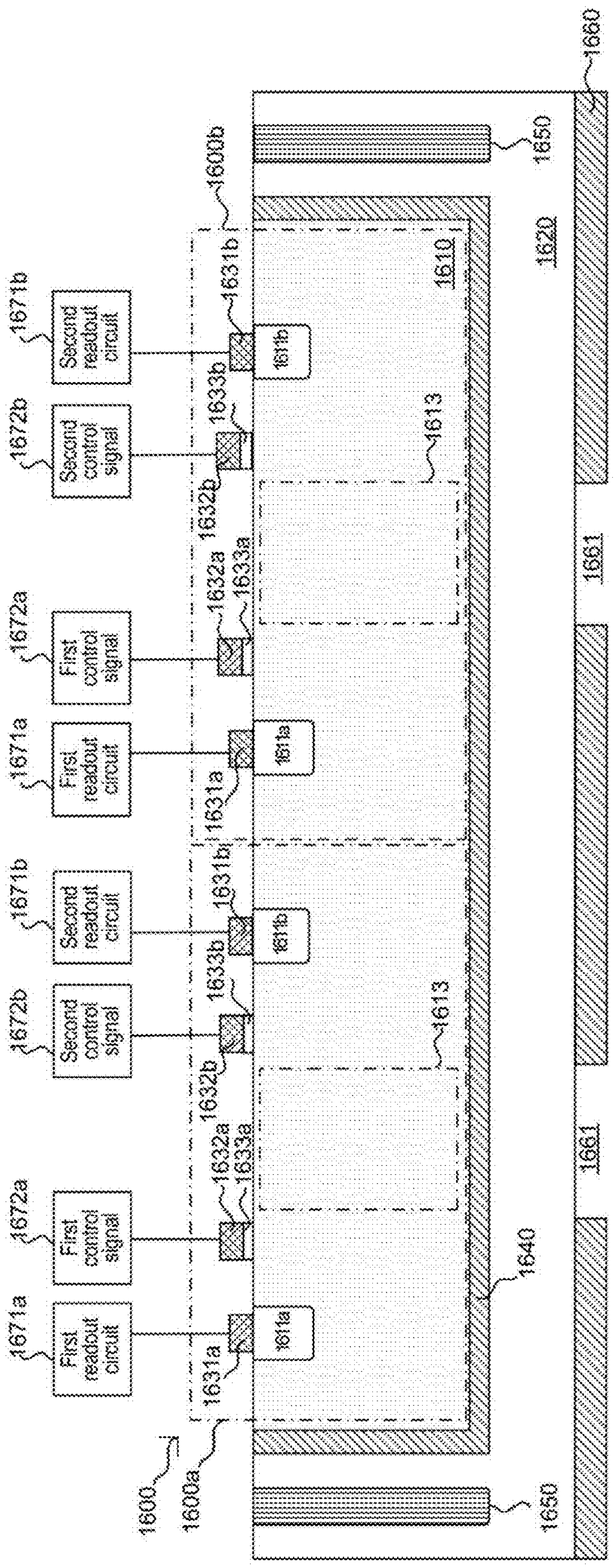
FIG. 16G illustrates a cross-sectional view of a photo-detecting apparatus, according to some embodiments.

FIG. 16G illustrates a cross-sectional view of a photo-detecting apparatus, according to some embodiments. The photo-detecting apparatus in FIG. 16G is similar to the photo-detecting apparatus in FIG. 16E, the difference is described below.

In some embodiments, the photo-detecting apparatus includes both the blocking layer 1640 in FIG. 16D and the isolation region 1650 FIG. 16E.

In some embodiments, each of the subpixel may further include a first dielectric layer 1633*a* between the absorption region 1610 and the second conductive contacts 1632*a* of the two subpixels 1600*a*, 1600*b*. Each of the subpixel may further include a second dielectric layer 1633*b* between the absorption region 1610 and the second conductive contacts 1632*b* f the two subpixels 1600*a*, 1600*b*.

The first dielectric layer 1633*a* prevents direct current conduction from the second conductive contacts 1632*a* to the absorption region 1610, but allows an electric field to be established within the absorption region 1610 in response to an application of a voltage to the second conductive contacts 1632*a*. The second dielectric layer 1633*b* prevents direct current conduction from the second conductive contacts 1632*b* to the absorption region 1610 but allows an electric field to be established within the absorption region 1610 in response to an application of a voltage to the second conductive contacts 1632*b*. The established electric field may attract or repel charge carriers within the absorption region 1610.

Figure 16H:
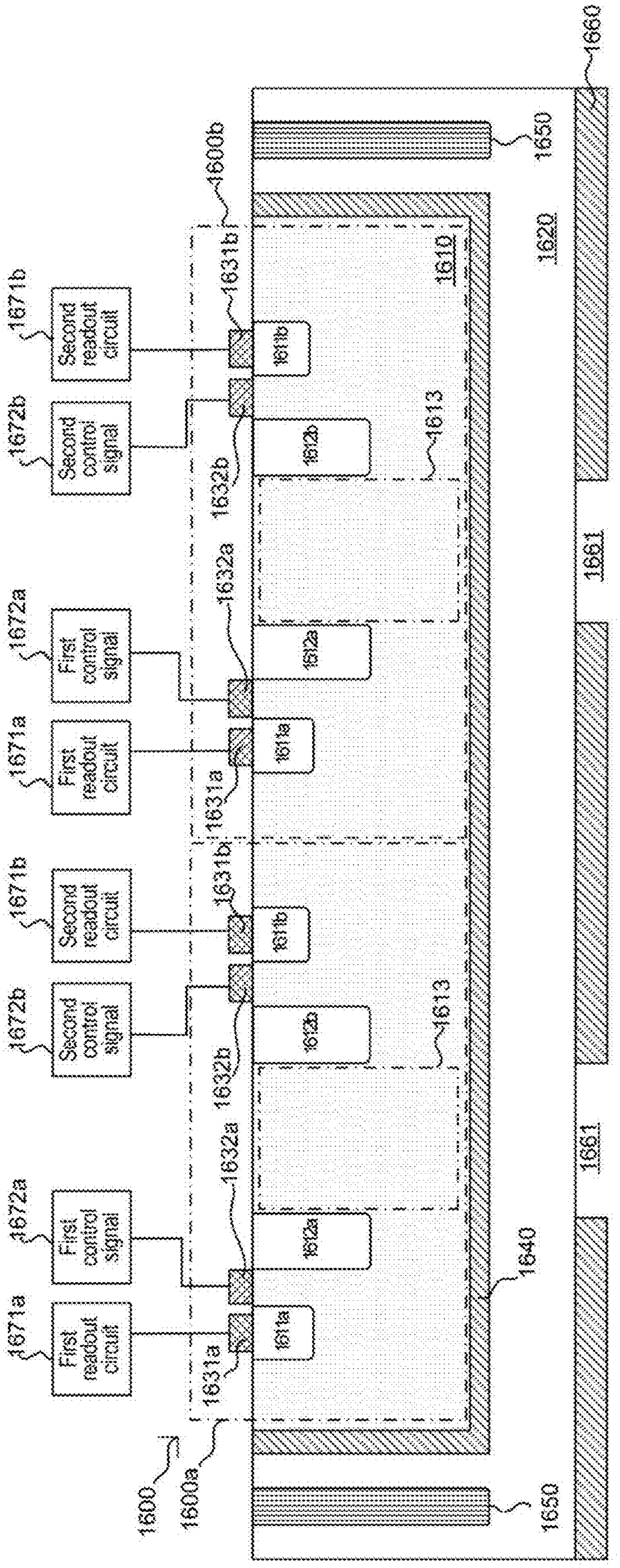
FIG. 16H illustrates a cross-sectional view of a photo-detecting apparatus, according to some embodiments.

FIG. 16H illustrates a cross-sectional view of a photo-detecting apparatus, according to some embodiments. The photo-detecting apparatus in FIG. 16H is similar to the photo-detecting apparatus in FIG. 16F, the difference is described below.

The first conductivity type of each of the first doped regions 1611*a*, 1611*b* and the second conductivity type of each of the second doped regions 1612*a*, 1612*b* are the same.

In some embodiment, the second conductive contact 1632*a* is between the first doped region 1611*a* and the second doped region 1612*a* of a switch in a single subpixel. In some embodiments, the second conductive contact 1632*b* is between the first doped region 1611*b* and the second doped region 1612*b* of another switch in a single subpixel.

In some embodiments, when the second conductive contact 1632*a* is Schottky contacting to the absorption region 1610, the first doped region 1611*a*, the second doped region 1612*a* and the second conductive contact 1632*a* are referred as a first MESFET (metal semiconductor field effect transistor). In some embodiments, when the second conductive contact 1632*b* is Schottky contacting to the absorption region 1610, the first doped region 1611*b*, the second doped region 1612*b* and the second conductive contact 1632*b* are referred as a second MESFET (metal semiconductor field effect transistor).

Figure 16I:
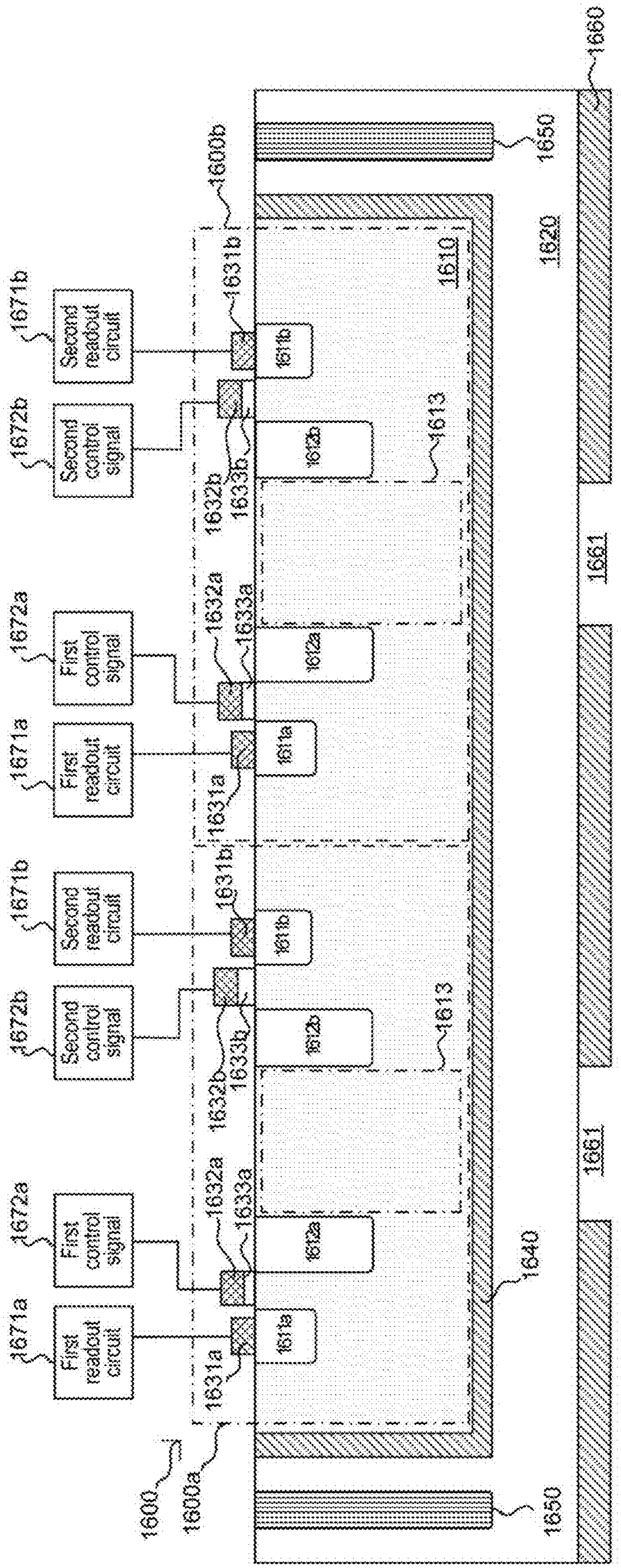
FIG. 16I illustrates a cross-sectional view of a photo-detecting apparatus, according to some embodiments.

FIG. 16I illustrates a cross-sectional view of a photo-detecting apparatus, according to some embodiments. The photo-detecting apparatus in FIG. 16I is similar to the photo-detecting apparatus in FIG. 16G, the difference is described below.

The first conductivity type of each of the first doped regions 1611*a*, 1611*b* and the second conductivity type of each of the second doped regions 1612*a*, 1612*b* are the same.

In some embodiments, the first dielectric layer 1633*a* is between the absorption region 1610 and the second conductive contact 1632*a*. The second dielectric layer 1633*b* is between the absorption region 1610 and the second conductive contact 1632*b*.

The first dielectric layer 1633*a* and the second dielectric layer 1633*b* prevent direct current conduction from the second conductive contact 1632*a* to the absorption region 1610 and from the second conductive contact 1632*b* to the absorption region 1610 respectively, but allows an electric field to be established within the absorption region 1610 in response to an application of a voltage to the second conductive contact 1632*a* and the second conductive contact 1632*b* respectively. The established electric field attracts or repels charge carriers within the absorption region 1610. In some embodiments, the second conductive contact 1632*a*, the first dielectric layer 1633*a*, the first doped region 1611*a*, and the second doped region 1612*a* are referred to as a first MOSFET (metal oxide semiconductor field-effect transistor). In some embodiments, the second conductive contact 1632*b*, the second dielectric layer 1633*b*, the first doped region 1611*b*, and the second doped region 1612*b* are referred to as a second MOSFET. In some embodiments, the first MOSFET and the second MOSFET can be enhancement mode. In some embodiments, the first MOSFET and the second MOSFET can be depletion mode.

Figure 16J:
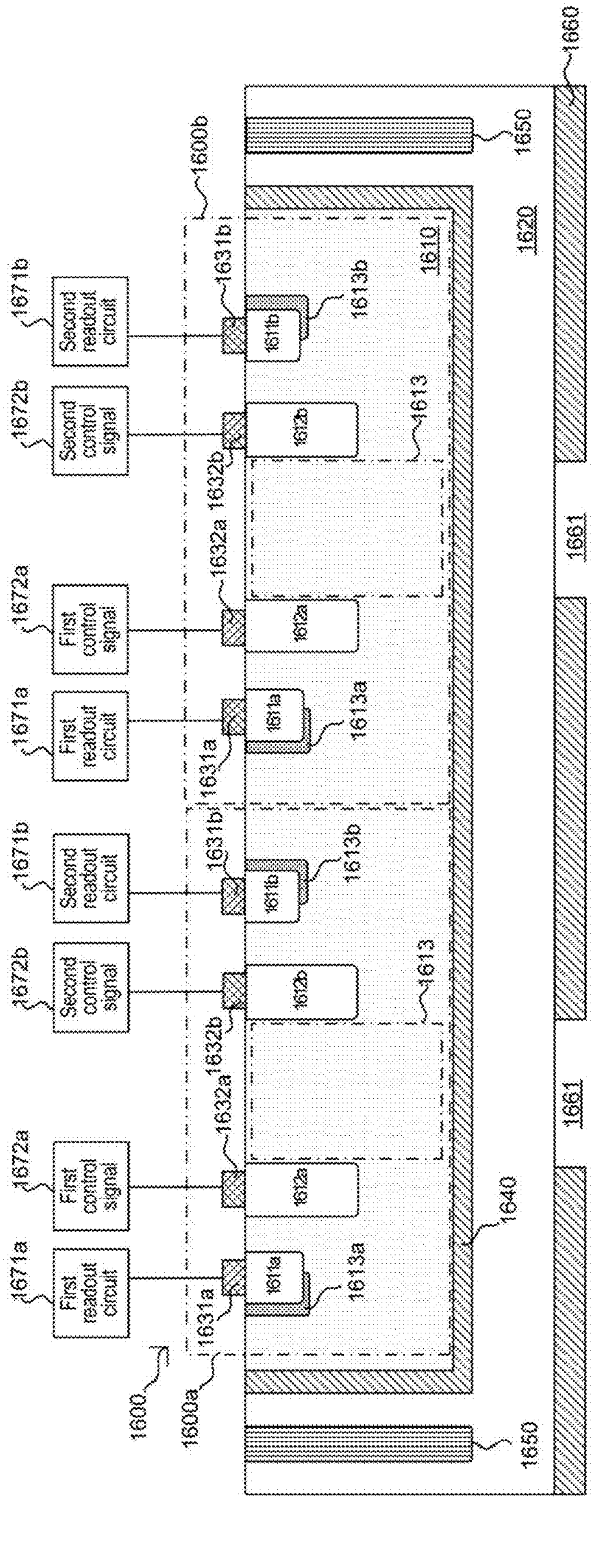
FIG. 16J illustrates a cross-sectional view of a photo-detecting apparatus, according to some embodiments.

FIG. 16J illustrates a cross-sectional view of a photo-detecting apparatus, according to some embodiments. The photo-detecting apparatus in FIG. 16J is similar to the photo-detecting apparatus in FIG. 16F, the difference is described below.

In some embodiments, each of the subpixel 1600*a*, 1600*b* further includes two counter-doped regions 1613*a*, 1613*b*. Each of the counter-doped regions 1613*a*, 1613*b* has a conductivity type different from the first conductivity type of the first doped region 1611*a*, 1611*b*. For example, if the photo-detecting apparatus is configured to process the collected electrons for further application, the first doped region 1611*a*, 1611*b* are of n-type, the second doped regions 1612*a*,1612*b* are of p-type, and the counter-doped regions 1613*a*, 1613*b* are of p-type. In some embodiments, the counter-doped regions 1613*a*, 1613*b* surround or overlapped with a portion of the first doped region 1611*a*, 1611*b* father from the second doped region 1612*a*,1612*b* respectively, and the other portion of the first doped region 1611*a*, 1611*b* is not surrounded or not overlapped with the counter-doped region 1613*a*, 1613*b*. In some embodiments, the first doped region 1611*a*, 1611*b* are entirely overlapped with or surrounded by the counter-doped region 1613*a*, 1613*b* respectively. In some embodiments, the counter-doped regions 1613*a*, 1613*b* serve as dark-current reduction regions for reducing the dark current of the subpixels 1600*a*, 1600*b*. Compared to a photo-detecting apparatus devoid of counter-doped region 1613*a*, 1613*b* overlapped with the first doped region 1611*a*, 1611*b* respectively, the photo-detecting apparatus including counter-doped region 1613*a*, 1613*b* overlapped with the first doped region 1611*a*, 1611*b* has a thinner depletion, which reduces the dark current of the photo-detecting apparatus.

In some embodiments, the counter-doped regions 1613*a*, 1613*b* may reduce the crosstalk between the two subpixels 1600*a*, 1600*b*. For example, the counter-doped region 1613*b* of the subpixel 1600*a*, which is nearer to the subpixel 1600*b* than the counter-doped region 1613*a* of the subpixel 1600*a*, and the counter-doped region 1613*a* of the subpixel 1600*b*, which is nearer to the subpixel 1600*a* than the counter-doped region 1613*b* of the subpixel 1600*b*, may enhance the resistance between the first doped regions 1611*b* of the subpixel 1600*a* and the first doped regions 1611*a* of the subpixel 1600*b*, which reduces the crosstalk between the two subpixels 1600*a*, 1600*b*.

In some embodiments, each of the counter-doped regions 1613*a*, 1613*b* is doped with a dopant having a peak concentration. The peak concentration is not less than $1\times10^{16}$ $cm^{-3}$. In some embodiment, the peak concentrations of the dopants of the counter-doped regions 1613*a*, 1613*b* are lower than the peak concentrations of the dopants of the first doped regions 331. In some embodiments, the peak concentration of the dopants of the counter-doped regions 1613*a*, 1613*b* is between $1\times10^{16}$ $cm^{-3}$ and $1\times10^{18}$ $cm^{-3}$.

Figure 16K:
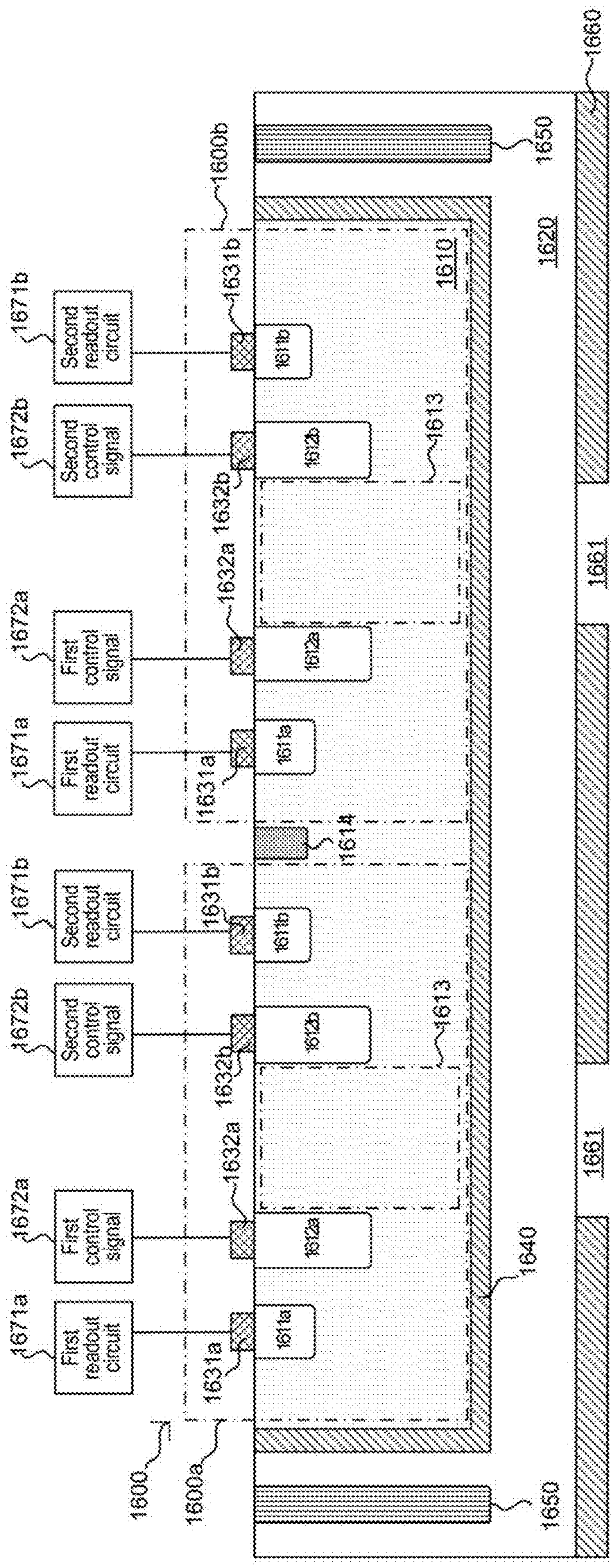
FIG. 16K illustrates a cross-sectional view of a photo-detecting apparatus, according to some embodiments.

FIG. 16K illustrates a cross-sectional view of a photo-detecting apparatus, according to some embodiments. The photo-detecting apparatus in FIG. 16K is similar to the photo-detecting apparatus in FIG. 16F, the difference is described below.

In some embodiments, the pixel further includes a third doped region 1614 in the absorption region 1610 and between two adjacent subpixels 1600*a*,1600*b*, and the third doped region 1614 is physically separated from the first doped region 1611*b* of the subpixel 1600*a* and the first doped region 1611*a* of the subpixel 1600*b*. The third doped region 1614 has a conductivity type different from the first conductivity type of each of the first doped regions 1611*a*, 1611*b*. In some embodiments, the third doped region 1614 include a dopant having a peak concentration. The peak concentration is not less than $1\times10^{16}$ $cm^{-3}$. In some embodiment, the peak concentrations of the dopants of the third doped region 1614 is lower than the peak concentrations of the dopants of the first doped regions 331. In some embodiments, the peak concentration of the dopants of the third doped region 1614 is between $1\times10^{18}$ $cm^{-3}$ and $5\times10^{20}$ $cm^{-3}$.

In some embodiments, the third doped region 1614 may reduce the crosstalk between the two subpixels 1600*a*, 1600*b*.

In some embodiments, the photo-detecting apparatus may include both the third doped region 1614 and the counter-doped regions 1613*a*, 1613*b* as described in FIG. 16J.

Figure 16L:
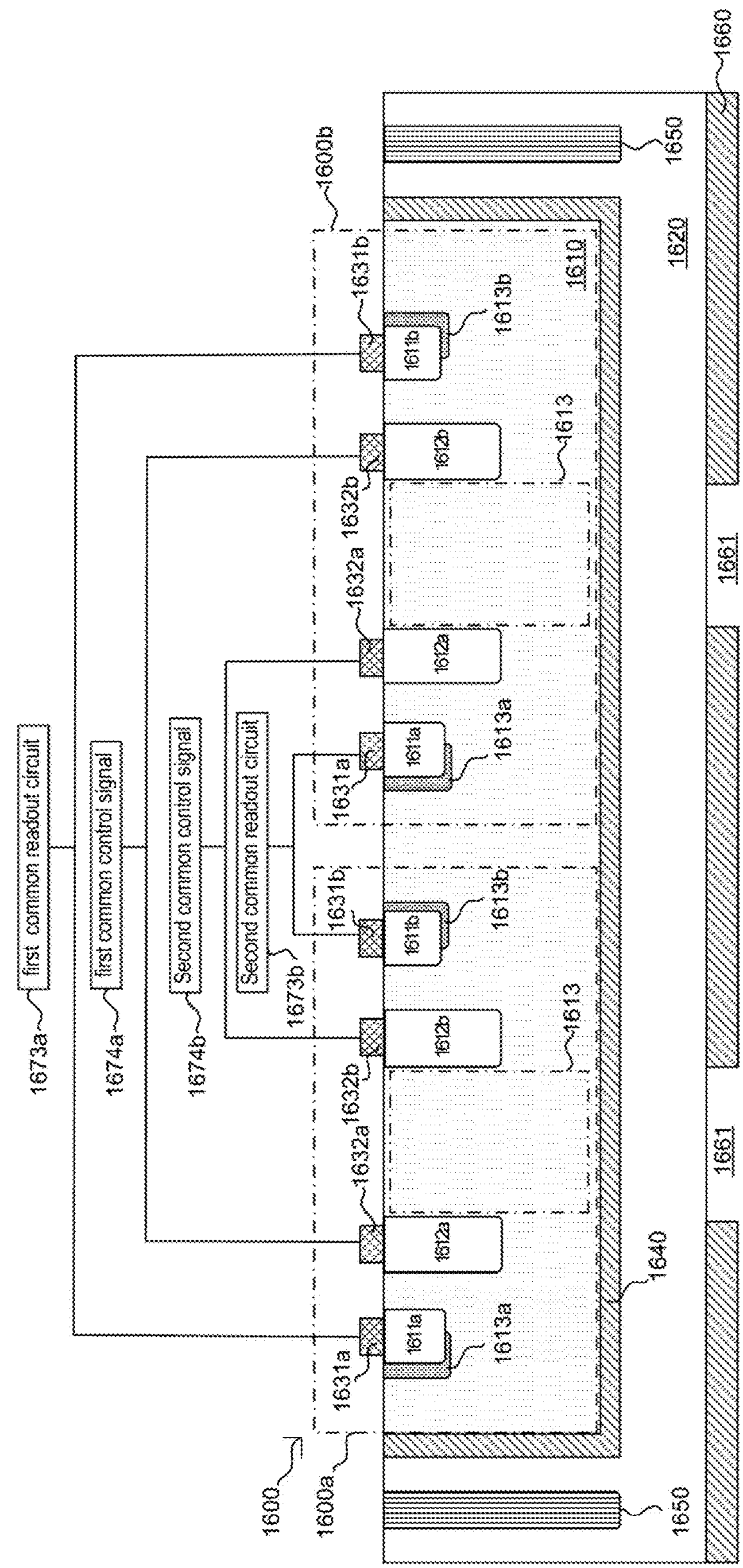
FIG. 16L illustrates a cross-sectional view of a photo-detecting apparatus, according to some embodiments.

FIG. 16L illustrates a cross-sectional view of a photo-detecting apparatus, according to some embodiments. The photo-detecting apparatus in FIG. 16L is similar to the photo-detecting apparatus in FIG. 16J, the difference is described below.

In some embodiments, the pixel 1600 includes two common readout circuits and two common control signals. For example, the pixel 1600 includes a first common readout circuit 1673*a*, a second common readout circuits 1673*b*, a first common control signal 1674*a*, and a second common control signal 1674*b*. The first common readout circuit 1673*a* is electrically coupled to both of the first conductive contact 1631*a* of the subpixel 1600*a* and the first conductive contact 1631*b* of the subpixel 1600*b*. As a result, the charges collected by the first doped region 1611*a* of the subpixel 1600*a* and the first doped region 1611*b* of the subpixel 1600*b* can be processed by the same first common readout circuit 1673*a*. The second common readout circuit 1673*b* is electrically coupled to both of the first conductive contact 1631*b* of the subpixel 1600*a* and the first conductive contact 1631*a* of the subpixel 1600*b*. As a result, the charges collected by the first doped region 1611*b* of the subpixel

1600*a* and the first doped region 1611*a* of the subpixel 1600*b* can be processed by the same second common readout circuits 1673*b*.

The first common control signal 1674*a* is electrically coupled to both of the second conductive contact 1632*a* of the subpixel 1600*a* and the second conductive contact 1632*b* of the subpixel 1600*b*. As a result, the first switch of the subpixel 1600*a* and the second switch of the subpixel 1600*b* can be controlled simultaneously by the same first common control signal 1674*a*. The second common control signal 1674*b* is electrically coupled to both of the second conductive contact 1632*b* of the subpixel 1600*a* and the second conductive contact 1632*a* of the subpixel 1600*b*. As a result, the second switch of the subpixel 1600*a* and the first switch of the subpixel 1600*b* can be controlled simultaneously by the same second common control signal 1674*b*.

The first common control signal 1674*a* may be fixed at a voltage value Vi, and the second common control signal 1674*b* may alternate between voltage values Vi±ΔV. In some embodiments, the first common control signal 1674*a* and the second common control signal 1674*b* may be voltages that are differential to each other. In some embodiments, one of the control signals is a constant voltage signal (e.g., 0.5*v*) and the other control signal is a time-varying voltage signal (e.g., sinusoid signal, clock signal or pulse signal operated between 0V and 1V).

Figure 16M:
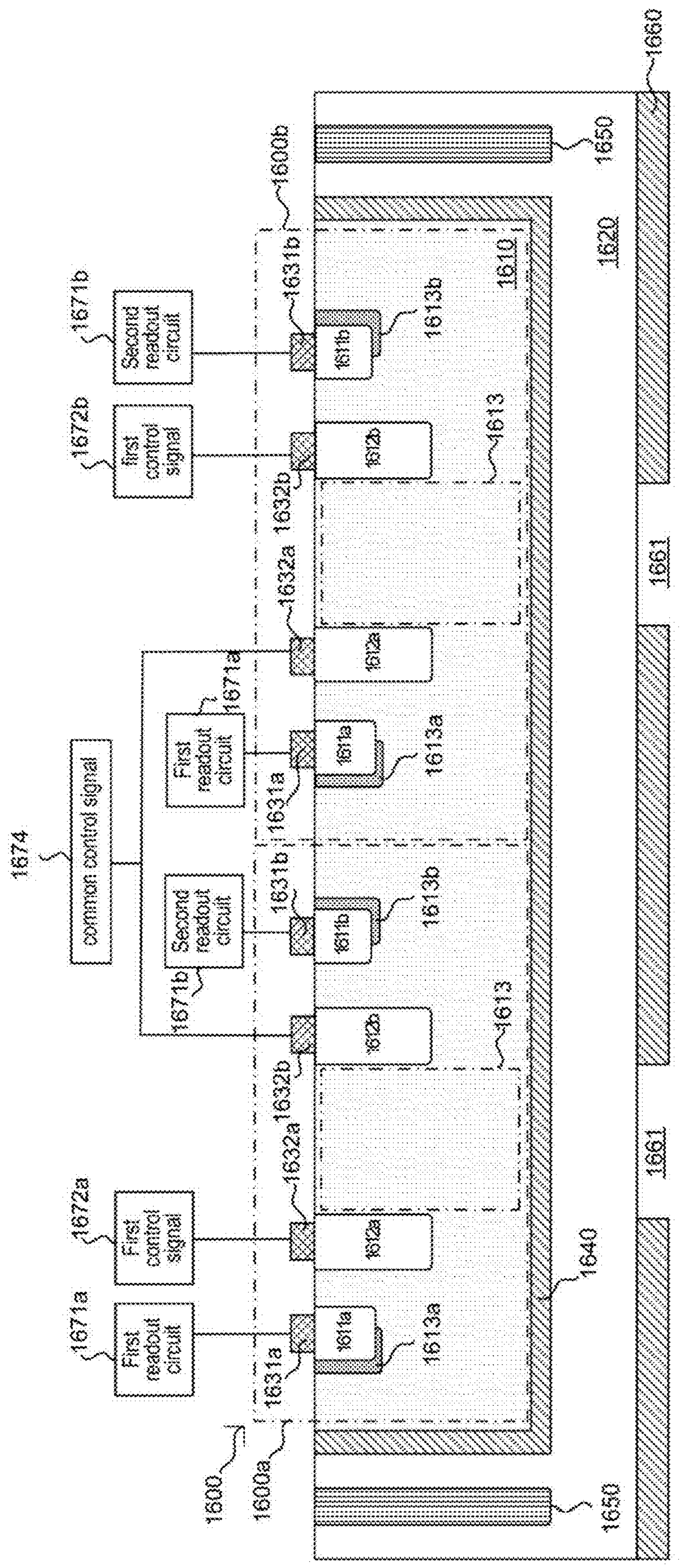
FIG. 16M illustrates a cross-sectional view of a photo-detecting apparatus, according to some embodiments.

FIG. 16M illustrates a cross-sectional view of a photo-detecting apparatus, according to some embodiments. The photo-detecting apparatus in FIG. 16M is similar to the photo-detecting apparatus in FIG. 16J, the difference is described below.

In some embodiments, the pixel 1600 includes a common control signal 1674 electrically coupled to both of the second conductive contact 1632*b* of the subpixel 1600*a* and the second conductive contact 1632*a* of the subpixel 1600*b*. As a result, the second switch of the subpixel 1600*a* and the first switch of the subpixel 1600*b* can be controlled simultaneously by the same second common control signal 1674*a*. The first switch of the subpixel 1600*a* is independently controlled by the first control signal 1672*a*. The second switch of the subpixel 1600*b* is independently controlled by the first control signal 1672*b*.

Figure 16N:
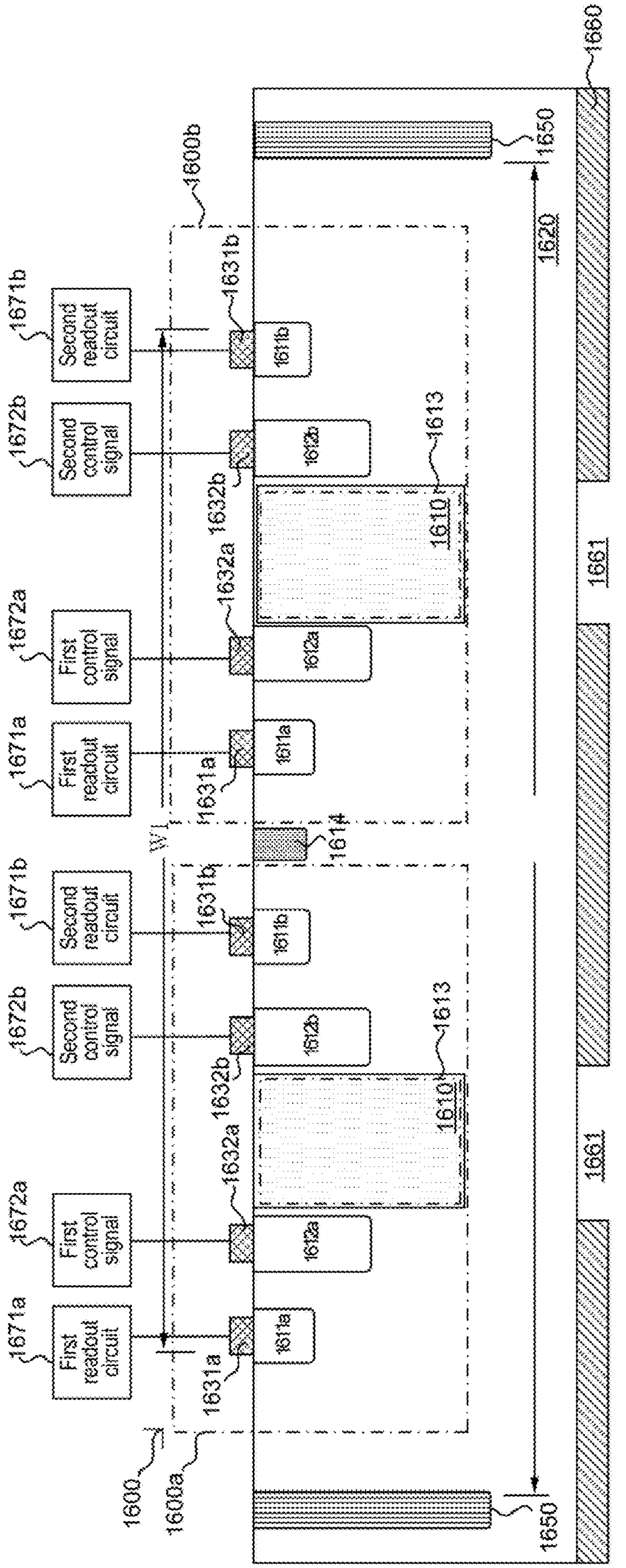
FIG. 16N illustrates a cross-sectional view of a photo-detecting apparatus, according to some embodiments.

FIG. 16N illustrates a cross-sectional view of a photo-detecting apparatus, according to some embodiments. The photo-detecting apparatus in FIG. 16N is similar to the photo-detecting apparatus in FIG. 16K, the difference is described below.

In some embodiments, the first conductive contacts 1631*a*,1631*b*, the second conductive contacts 1632*a*,1632*b* are formed on the upper surface of the substrate 1620. The first doped regions 1611*a*, 1611*b* and the second doped regions 1612*a*,1612*b* are formed in the substrate 1620. Each of the subpixel 1600*a*, 1600*b* includes an absorption region 1610 separated from each other. The detection regions 1613 defined by the windows 1661 corresponds to the absorption regions 1610 respectively. In some embodiments, a minimum width $w_1$ between the first conductive contacts of the two adjacent subpixels is less than a width of the isolation region 1650. For example, a minimum width $w_1$ between the first conductive contact 1631*a* of the subpixel 1600*a* and the first conductive contact 1631*b* of the subpixel 1600*b* is less than a width $w_2$ of the isolation region 1650.

The photo-detecting apparatus in FIG. 16N is devoid of the blocking layer 1640 as described in FIG. 16K.

The photo-detecting apparatus is with lower dark current since the two switches of each of the subpixels are formed outside of the absorption region 1610.

Figure 16O:
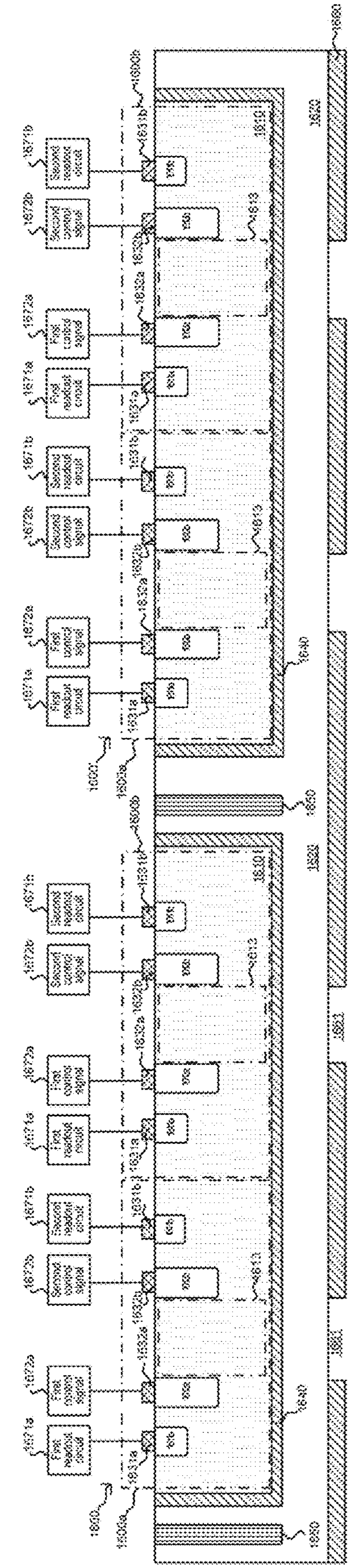
FIG. 16O illustrates a cross-sectional view of a photo-detecting apparatus, according to some embodiments.

FIG. 16O illustrates a cross-sectional view of a photo-detecting apparatus, according to some embodiments. The pixels 1600, 1600' can be any embodiments of the present disclosure.

Figure 16P:
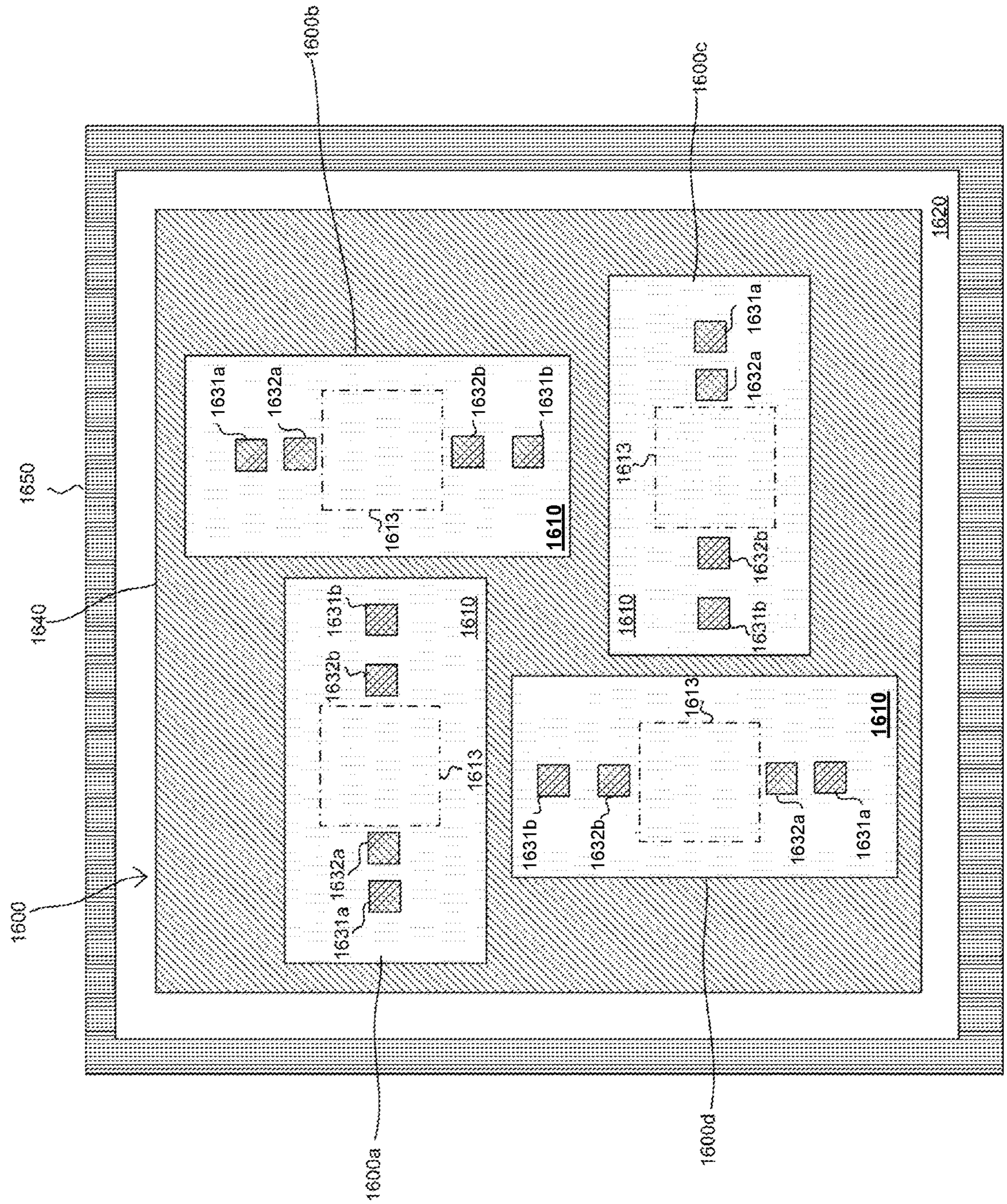
FIG. 16P illustrates a top view of a photo-detecting apparatus, according to some embodiments.
Figure 16Q:
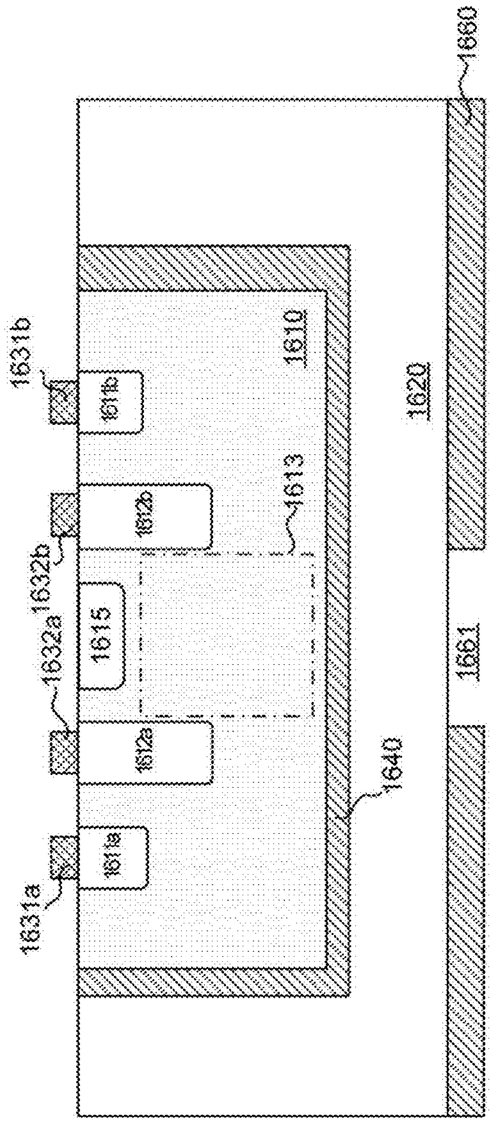
FIG. 16Q illustrates a cross-sectional view of one of the subpixels in the photo-detecting apparatus shown in FIG. 16P.

FIG. 16P illustrates a top view of a photo-detecting apparatus, according to some embodiments. The photo-detecting apparatus includes a pixel 1600 including four subpixels 1600*a*,100*b*, 1600*c* and 1600*d*. FIG. 16Q illustrates a cross-sectional view of one of the subpixels in the photo-detecting apparatus shown in FIG. 16P. Each of the subpixels 1600*a*,1600*b*, 1600*c* and 1600*d* includes an absorption region 1610 separated from another absorption region 1610. The second conductive contacts 1632*a* of the subpixels 1600*a*,1600*b*, 1600*c* and 1600*d* are electrically coupled to a first common control signal, as described in FIG. 16L. That is, the first switches of the subpixels 1600*a*, 1600*b*, 1600*c* and 1600*d* are controlled simultaneously by the first common control signal, as described in FIG. 16L. The second conductive contacts 1632*b* of the subpixels 1600*a*,1600*b*, 1600*c* and 1600*d* are electrically coupled to a second common control signal, as described in FIG. 16L. That is, the second switches of the subpixels 1600*a*,1600*b*, 1600*c* and 1600*d* are controlled simultaneously by the second common control signal, as described in FIG. 16L.

The first conductive contacts 1631*a* of the subpixels 1600*a*,1600*b*, 1600*c* and 1600*d* are electrically coupled to a first common readout circuit, as described in FIG. 16L. That is, the charges collected by the first doped regions 1611*a* of all the subpixel 1600*a* 1600*b*, 1600*c* and 1600*d* can be processed by the same first common readout circuit 1673*a*. The first conductive contacts 1631*b* of the subpixels 1600*a*, 1600*b*, 1600*c* and 1600*d* are electrically coupled to a second common readout circuit, as described in FIG. 16L. That is, the charges collected by the first doped regions 1611*b* of all the subpixel 1600*a* 1600*b*, 1600*c* and 1600*d* can be processed by the same second common readout circuit 1673*b*.

In some embodiments, one of the subpixels may further include a fourth doped region 1615 between the two second doped regions 1612*a*,1612*b*. The fourth doped region 1615 has a conductivity type different from the conductivity type of the blocking layer 1640. The fourth doped region 1615 and the blocking layer 1640 can be a PN-junction and thus a vertical electrical field is established between the fourth doped region 1615 and the blocking layer 1640. The holes and the electrons of the photo-carriers generated from the absorption region 1610 can be separated by the vertical electrical field between the fourth doped region 1615 and the blocking layer 1640, and the carriers to be collected can be gathered toward the fourth doped region 1615, and then move toward the first doped region 1611*a* or the first doped region 1611*b* based on the control of the first common control signal or the second common control signal. As a result, the photo-detecting apparatus is with improved demodulation contrast.

Figure 17A:
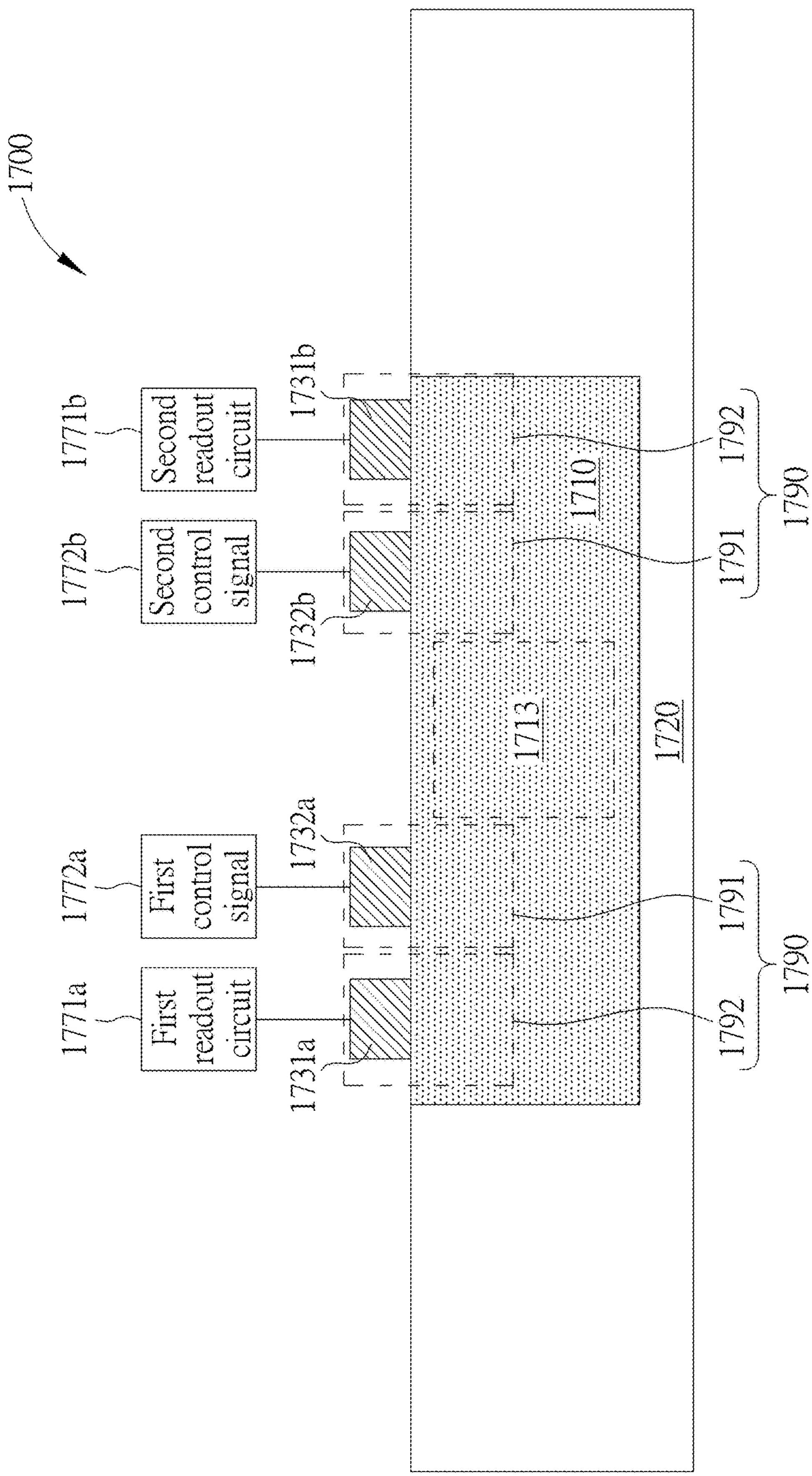
FIG. 17A illustrates a cross-sectional view of a photo-detecting apparatus, according to some embodiments.

FIG. 17A illustrates a cross-sectional view of a photo-detecting apparatus, according to some embodiments. The photo-detecting apparatus includes a pixel 1700 including an absorption region 1710. The photo-detecting apparatus further includes a substrate 1720 supporting the absorption region 1710. The pixel 1700 includes a detection region 1713 and two switches 1790 sandwiching the detection region 1713. Each of the switches 1790 include a control region 1791 and a readout region 1792. In this embodiment, each readout region 1792 includes a first conductive contact 1731*a*,1731*b* over a first surface of the absorption region 1710, and each control region 1791 includes a second conductive contact 1732a, 1732b over a first surface of the absorption region 1710.

In some embodiments, the pixel 1700 includes two readout circuits and two control signals. For example, the pixel 1700 includes a first readout circuit 1771a and a second readout circuit 1771b. The pixel 1700 includes a first control signal 1772a, and a second control signal 1772b. The first control signal 1772a and the second control signal 1772b are electrically coupled to the two control regions 1791 of the two switches 1790 and for controlling the two switches in the pixel. The first readout circuit 1771a and the second readout circuit 1771b are electrically coupled to the readout regions 1792 of the two switches and for processing the collected charges. In other words, the first control signal 1772a and the second control signal 1772b control the electrons or the holes generated by the absorbed photons in the detection region 1713 to be processed by the first readout circuit 1771a or the second readout circuit 1771b in the pixel 1700. In some embodiments, the first control signal 1772a may be fixed at a voltage value Vi, and the second control signal 1772b may alternate between voltage values Vi±ΔV. In some embodiments, the first control signal 1772a and the second control signal 1772b may be voltages that are differential to each other. In some embodiments, one of the control signals is a constant voltage signal (e.g., 0.5v) and the other control signal is a time-varying voltage signal (e.g., sinusoid signal, clock signal or pulse signal operated between 0V and 1V). The direction of the bias value determines the drift direction of the charges generated from the absorption region 1710.

In some embodiments, the detection region 1713 is between the second conductive contacts 1732a,1732b. The two second conductive contacts 1732a,1732b are nearer to the detection region 1713 than the first conductive contacts 1731a,1731b. The first conductive contacts 1731a,1731b and the second conductive contact 1732a, 1732b are formed on the same absorption region 1710.

The first readout circuit 1771a is electrically coupled to the first conductive contact 1731a of the pixel 1700 in a one-to-one correlation. The second readout circuit 1771b is electrically coupled to the first conductive contact 1731b of the pixel 1700 in a one-to-one correlation. The first conductive contact 1731a, 1731b may function as readout contacts. The first control signal 1772a is electrically coupled to the second conductive contact 1732a of the pixel 1700 in a one-to-one correlation. The second control signal 1772b is electrically coupled to the second conductive contact 1732b of the pixels 1700 in a one-to-one correlation. The second conductive contacts 1732a, 1732b may function as control contacts.

In some embodiments, the portions of the absorption region 1710 right under the second conductive contacts 1732a, 1732b may be intrinsic or include a dopant having a peak concentration below approximately $1\times10^{15}$ $cm^{-3}$. The term "intrinsic" means that the portions of the semiconductor material right under the second conductive contacts 1732a, 1732b are without intentionally added dopants. In some embodiments, the second conductive contacts 1732a, 1732b on the absorption region 1710 may lead to formation of a Schottky contact, an Ohmic contact, or a combination thereof having an intermediate characteristic between the two, depending on various factors including the material of the absorption region 1710, the second conductive contacts 1732a, 1732b, and the impurity or defect level of the absorption region 1710.

The first control signal 1772a and the second control signal 1772b are used to control the collection of electrons generated by the absorbed photons from the detection region 1713. For example, when voltages are used, if the first control signal 1772a is biased against the second control signal 1772b, an electric field is created between the two portions right under the second conductive contacts 1732a, 1732b, and free charges drift towards one of the two portions right under the second conductive contacts 1732a, 1732b depending on the direction of the electric field.

In some embodiments, the photo-detecting apparatus may include a light shield (not shown) having multiple windows (not shown) for defining the position of the detection region 1713 of each of the pixel 1700. In other words, the window is for allowing the incident optical signal enter into the absorption region 1710 and defining the detection region 1713. In some embodiments, the light shield is on a bottom surface of the substrate 1720 distant from the absorption region 1710 when an incident light enters the absorption region 1710 from the bottom surface of the substrate 1720. In some embodiments, a shape of the window can be ellipse, circle, rectangular, square, rhombus, octagon or any other suitable shape from a top view of the window.

In some embodiments, the photo-detecting apparatus further includes multiple optical elements (not shown) over the multiple pixels in a one-to-one correlation. The optical element converges an incoming optical signal to enter the detection regions 1713.

In this embodiment, the conductive contact 1731a and the conductive contact 1732a are similar to the first conductive contacts 1631a and the second conductive contact 1632a mentioned in FIG. 16A. Other characteristics of the components will not be described in detail.

Figure 17B:
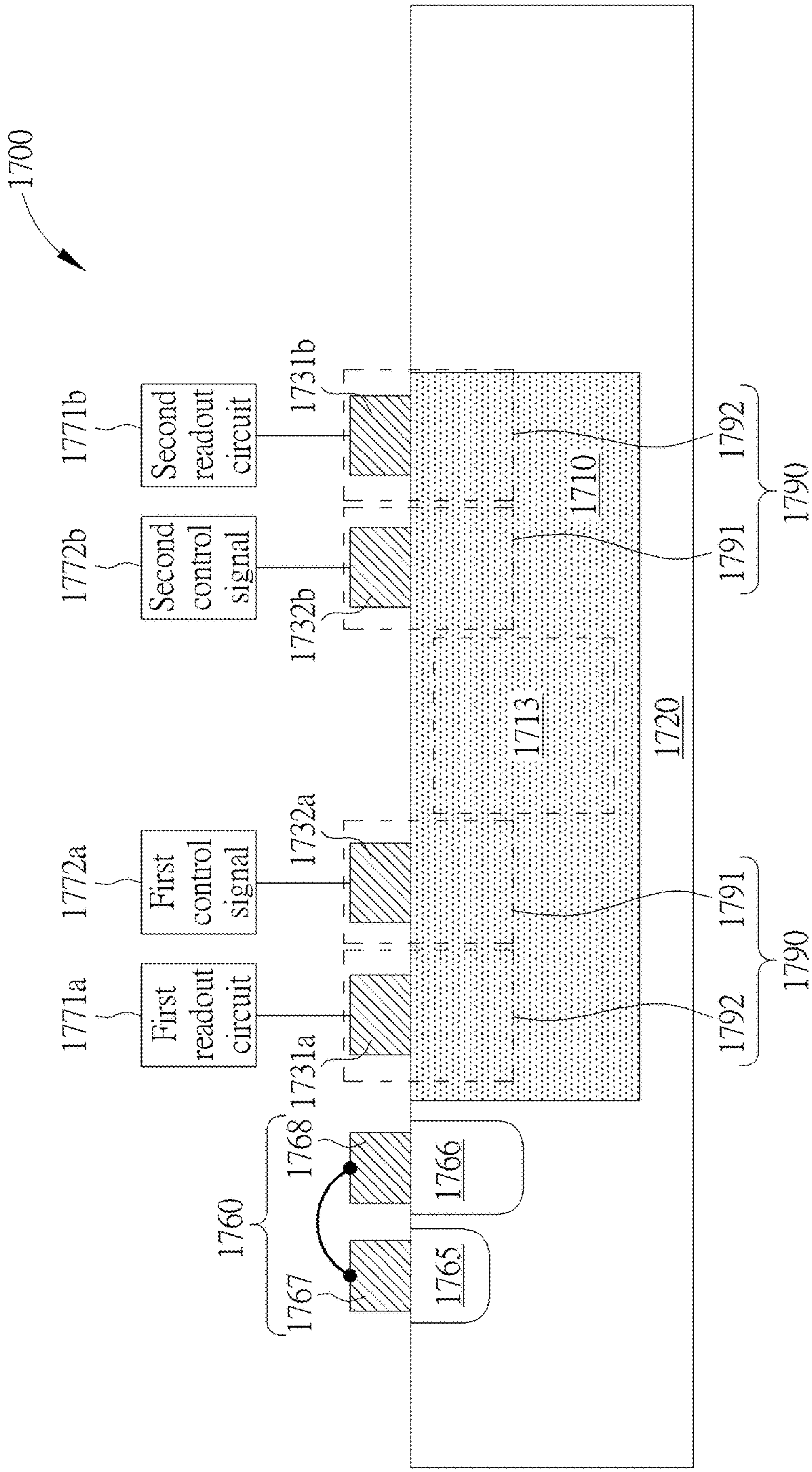
FIG. 17B illustrates a cross-sectional view of a photo-detecting apparatus, according to some embodiments.

FIG. 17B illustrates a cross-sectional view of a photo-detecting apparatus, according to some embodiments. The photo-detecting apparatus in FIG. 17B is similar to the photo-detecting apparatus in FIG. 17A, the difference is described below.

In some embodiments, the pixel 1700 further includes an first well region 1765 and a second well region 1766 in the substrate 1720 and disposed beside the absorption region 1710. The first well region 1765 is of a conductivity type different from a conductivity type of the second well region 1766. A conductive contact 1767 is formed and disposed on the first well region 1765 and electrically connected to the first well region 1765, a conductive contact 1768 is formed and disposed on the second well region 1766 and electrically connected to the second well region 1766. In addition, the conductive contact 1767 and the conductive contact 1768 are electrically connected to each other (that means the first well region 1765 and the second well region 1766 are electrically connected to each other too). In some implementations, the doping level of the first well region 1765 may range from $10^{16}$ $cm^{-3}$ to $10^{20}$ $cm^{-3}$. The doping level of the second well region 1766 may range from $10^{16}$ $cm^{-3}$ to $10^{20}$ $cm^{-3}$.

In some implementation, the absorption region 1710 may not completely absorb the incoming photons in the optical signal. For example, if the absorption region 1710 does not completely absorb the incoming photons in the NIR optical signal (not shown), the NIR optical signal may penetrate into the substrate 1720, where the substrate 1720 may absorb the penetrated photons and generate photo-carriers deeply in the substrate 1720 that are slow to recombine. These slow photo-carriers negatively affect the operation speed of the photo-detecting apparatus.

To further remove the slow photo-carriers, the pixel 1700 may include connections that short the first well region 1765 with the second well region 1766. For example, the connections may be formed by a silicide process or a deposited metal pad, such as the conductive contact 1767 and the conductive contact 1768, that connects the first well region 1765 with the second well region 1766. The shorting between the first well region 1765 and the second well region 1766 allows the photo-carriers generated in the substrate 1720 to be recombined at the shorted node, and therefore improves the operation speed of the pixel.

In this embodiment, the structure in which an first well region 1765 and a second well region 1766 are connected together can be simply referred to as a "shorting structure" 1760, in the subsequent embodiments, if the "shorting structure" is mentioned, it means that such a structure exists (at least including one first well region and one second well region with different conductivity types that are electrically connected to each other).

Besides, in this embodiment, only one shorting structure 1760 is disclosed, but in other embodiments, the pixel may include two or more shorting structures disposed on two sides of the absorption region 1710 respectively. The two shorting structures 1760 can be arranged along the long axis symmetry of the absorption region 1710, or the two shorting structures 1760 can be arranged along the short axis symmetry of the absorption region 1710, it should also be within the scope of the present disclosure.

Figure 17C:
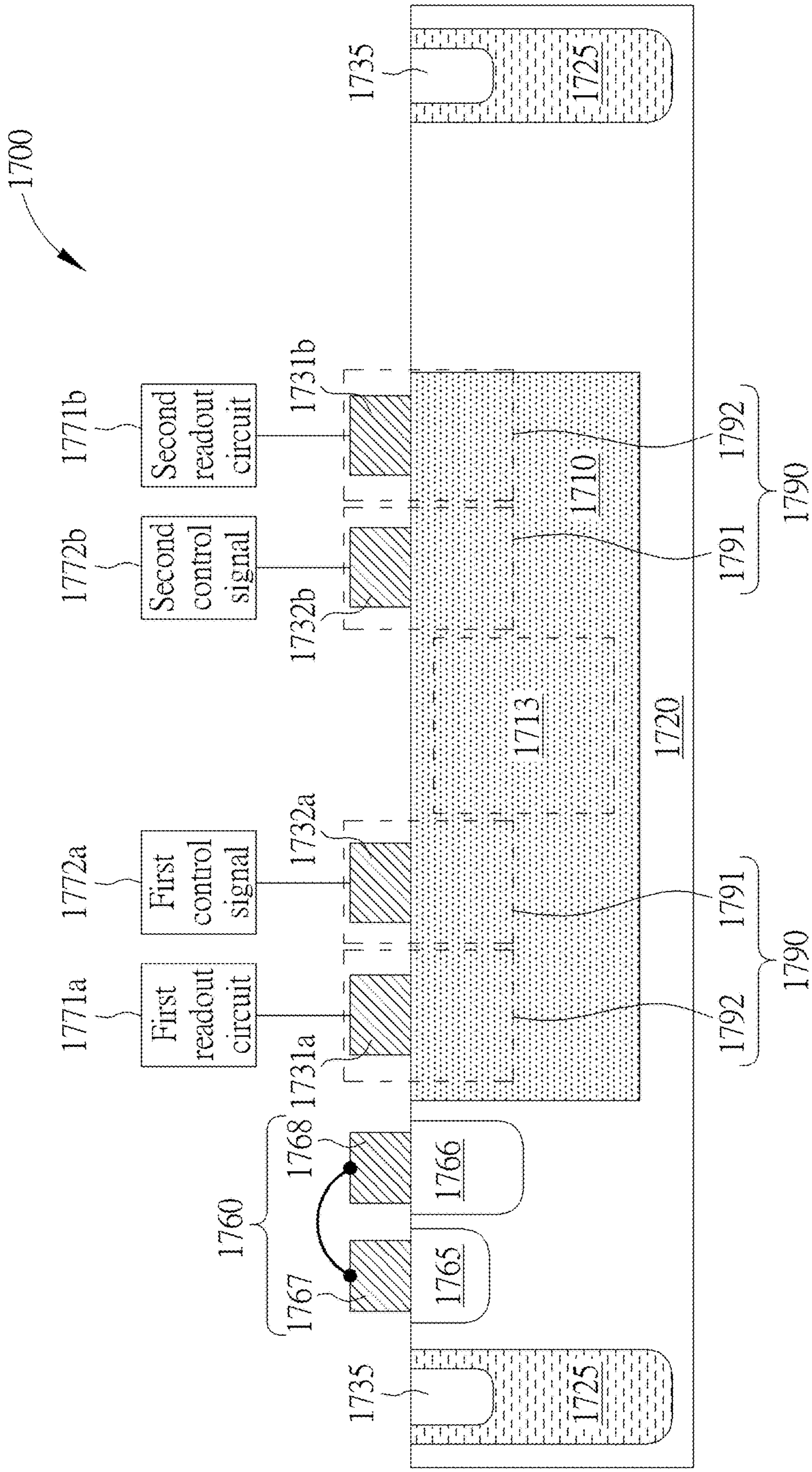
FIG. 17C illustrates a cross-sectional view of a photo-detecting apparatus, according to some embodiments.

FIG. 17C illustrates a cross-sectional view of a photo-detecting apparatus, according to some embodiments. The photo-detecting apparatus in FIG. 17C is similar to the photo-detecting apparatus in FIG. 17B, the difference is described below.

In some embodiments, the photo-detecting apparatus further includes an isolation region 1725 disposed at two opposite sides of the absorption region 1710 from a cross-sectional view of the photo-detecting apparatus. The isolation region 1725 is outside of the absorption region 1710 and physically separated from the absorption region 1710. In some embodiments, the shorting structure 1760 is between the isolation region 1725 and the absorption region 1710. In some embodiments, the isolation region 1725 is a trench filled with a dielectric material or an insulating material to serve as a region of high electrical resistance between the two adjacent pixels, impeding a flow of current across the isolation region 1725 and improving electrical isolation between the pixel 1700 and other adjacent pixels (not shown). The dielectric material or an insulating material may include, but is not limited to oxide material including $SiO_2$ or nitride material including $Si_3N_4$. In some embodiments, the trench is filled with Si.

In some embodiments, the isolation region 1725 extends from an upper surface of the substrate 1720 and extends into a predetermined depth from the upper surface. In some embodiments, the isolation region 1725 extends from a bottom surface of the substrate 1720 and extends into a predetermined depth from the bottom surface. In some embodiments, the isolation region 1725 penetrates though the substrate 1720 from the upper surface and the bottom surface.

In some embodiments, the isolation region 1725 is a doped region having a conductivity type. The peak concentration of the isolation region 1650 may range from $10^{15}$ $cm^{-3}$ to $10^{20}$ $cm^{-3}$ In some embodiment, a narrow and shallow isolation region 1735 is formed inside the isolation region 1725. The peak concentration of the shallow isolation region 1735 and the peak concentration of the isolation region 1725 are different. This may be applied to inhibit the crosstalk through surface conduction paths.

The doping of the isolation region 1725 may create a bandgap offset-induced potential energy barrier that impedes a flow of current across the isolation region 1725 and improving electrical isolation between the pixel 1700 and other adjacent pixels (not shown). In some embodiments, the isolation region 1725 includes a semiconductor material that is different from the material of the substrate 1720. An interface between two different semiconductor materials formed between the substrate 1720 and the isolation region 1725 may create a bandgap offset-induced energy barrier that impedes a flow of current across the isolation region 1725 and improving electrical isolation between the pixel 1700 and other adjacent pixels (not shown). In some embodiments, the shape of the isolation region 1725 may be a ring. In some embodiments, the isolation region 1725 may include two discrete regions disposed at the at two opposite sides of the absorption region 1710. In some embodiments, the two discrete regions may both extend from the upper surface of the substrate 1720 and extends into a predetermined depth from the upper surface. In some embodiments, the two discrete regions may both extend from a bottom surface of the substrate 1720 and extends into a predetermined depth from the bottom surface.

Figure 17D:
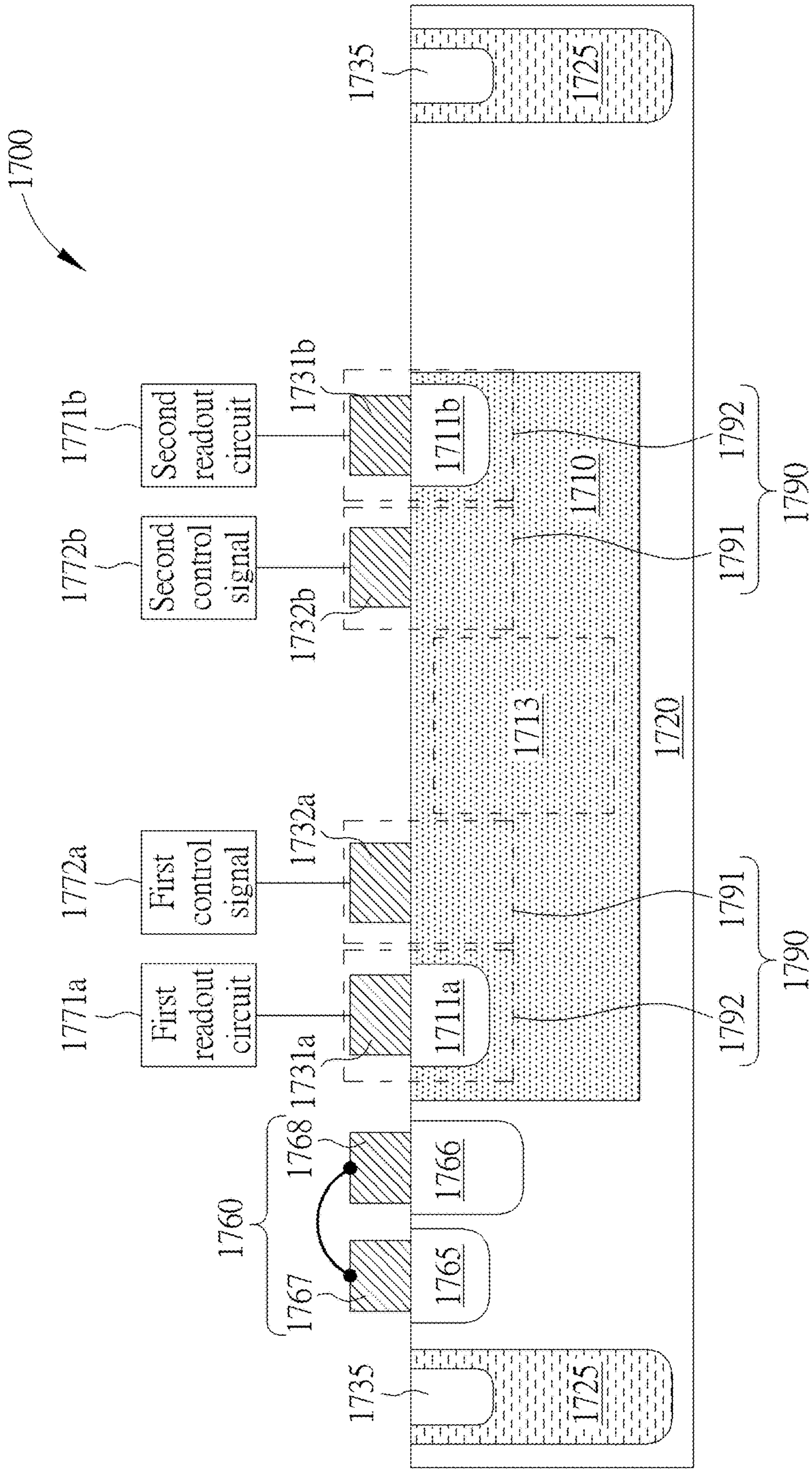
FIG. 17D illustrates a cross-sectional view of a photo-detecting apparatus, according to some embodiments.

FIG. 17D illustrates a cross-sectional view of a photo-detecting apparatus, according to some embodiments. The photo-detecting apparatus in FIG. 17D is similar to the photo-detecting apparatus in FIG. 17C, the difference is described below.

In some embodiments, each of the switches 1790 of the pixel 1700 includes two first doped regions 1711*a*,1711*b* under the first conductive contacts 1731*a*,1731*b* respectively and formed in the absorption region 1710. In other words, the two first doped regions 1711*a*,1711*b* of the pixel 1700 are formed in the absorption region 1710.

In some embodiments, the first doped regions 1711*a*, 1711*b* are of a first conductivity type. In some embodiments, each of the first doped regions 1711*a*,1711*b* is doped with a dopant. The peak concentration of the dopant of each of the first doped regions 1711*a*,1711*b* depends on the material of the first conductive contacts 1731*a*, 1731*b* respectively and the material of the absorption region 1710, for example, between $5\times10^{18}$ $cm^{-3}$ to $5\times10^{20}$ $cm^{-3}$. The first doped regions 1711*a*, 1711*b* are for collecting the carriers generated from the absorption region 1710, which are further processed by the first readout circuit 1771*a* and the second readout circuit 1771*b* respectively based on the control of the first control signal 1772*a* and the second control signal 1772*b*.

In the present disclosure, in a same photo-detecting apparatus, the type of the carriers collected by the first doped region 1711*a* and the type of the carriers collected by the first doped region 1711*b* are the same. For example, when the photo-detecting apparatus is configured to collects electrons, when the first switch of one pixel is switched on and the second switch of the same pixel is switched off, the first doped region 1711*a* collects electrons of the photo-carriers generated from the detection region 1713, and when the second switch is switched on and the first switch is switched off, the first doped region 1711*b* also collects electrons of the photo-carriers generated from the detection region 1713.

Figure 17E:
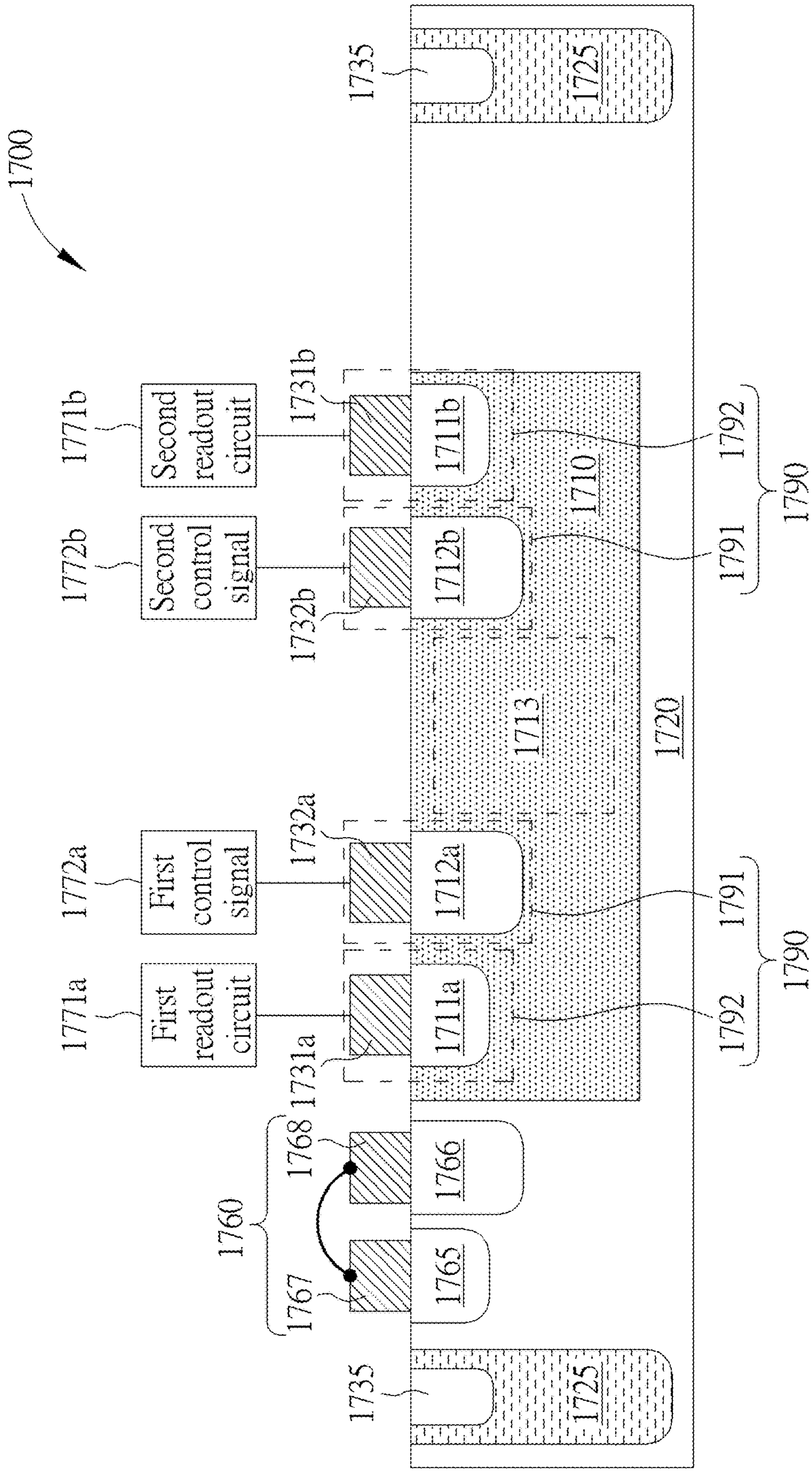
FIG. 17E illustrates a cross-sectional view of a photo-detecting apparatus, according to some embodiments.

FIG. 17E illustrates a cross-sectional view of a photo-detecting apparatus, according to some embodiments. The photo-detecting apparatus in FIG. 17E is similar to the photo-detecting apparatus in FIG. 17D, the difference is described below.

In some embodiments, each of the switches 1790 of the pixel 1700 includes two second doped regions 1712*a*,1712*b* under the second conductive contacts 1732*a*,1732*b* respectively and formed in the absorption region 1710.

In some embodiments, the second doped regions 1712*a*, 1712*b* are of a second conductivity type different from the first conductivity type of the first doped region 1711*a*,1711*b*. In some embodiments, the second doped regions 1712*a*, 1712*b* include a dopant. The peak concentration of the dopant of each of the second doped regions 1712*a*,1712*b* depends on the material of the second conductive contact 1732*a*, 1732*b* respectively and the material of the absorption region 1710, for example, between $1\times10^{17}$ $cm^{-3}$ to $5\times10^{20}$ $cm^{-3}$. The second doped regions 1712*a*,1712*b* forms a Schottky or an Ohmic contact with the second conductive contacts 1732*a*,1732*b*. The second doped regions 1712*a*, 1712*b* are for modulating the carriers generated from the absorption region 1710 based on the control of the first control signal 1772*a* and the second control signal 1772*b*.

Figure 17F:
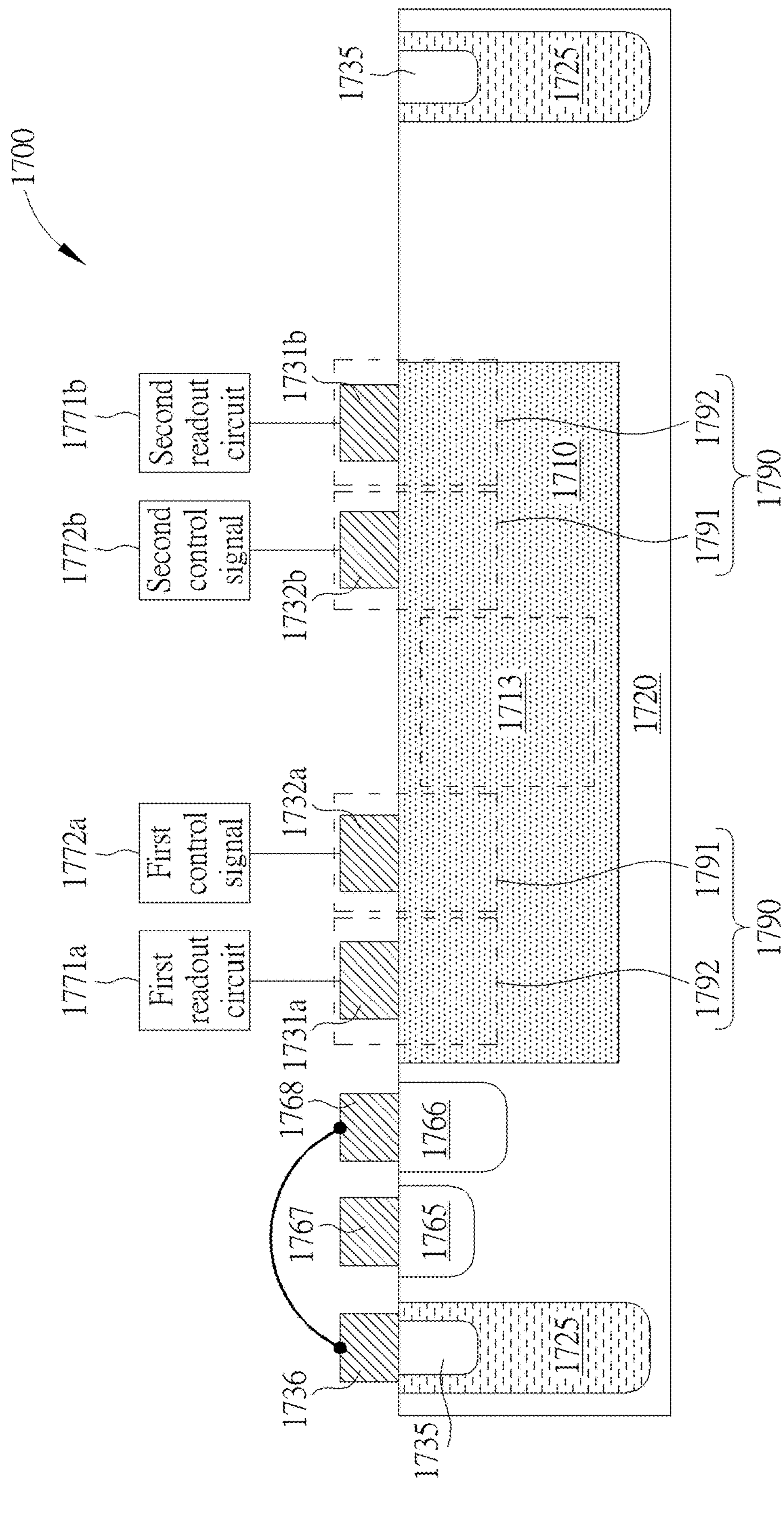
FIG. 17F illustrates a cross-sectional view of a photo-detecting apparatus, according to some embodiments.

FIG. 17F illustrates a cross-sectional view of a photo-detecting apparatus, according to some embodiments. The photo-detecting apparatus in FIG. 17F is similar to the photo-detecting apparatus in FIG. 17C, the difference is described below.

In some embodiments, if the isolation region 1725 is a doped region having a conductivity type (such as n-type), the isolation region 1725 can be used to replace the first well region 1765 mentioned in FIG. 17B, and the isolation region 1725 and the second well region 1766 can be electrically connected to each other to form the shorting structure. More precisely, in this embodiment, a conductive contact 1736 is formed on the isolation region 1725 (or on the shallow isolation region 1735), and the conductive contact 1736 and the conductive contact 1768 are electrically connected to each other (that means the n-type doped isolation region 1725 and the second well region 1766 (such as p-type), are electrically connected to each other too). In this embodiment, the first well region 1765 can be omitted.

Figure 17G:
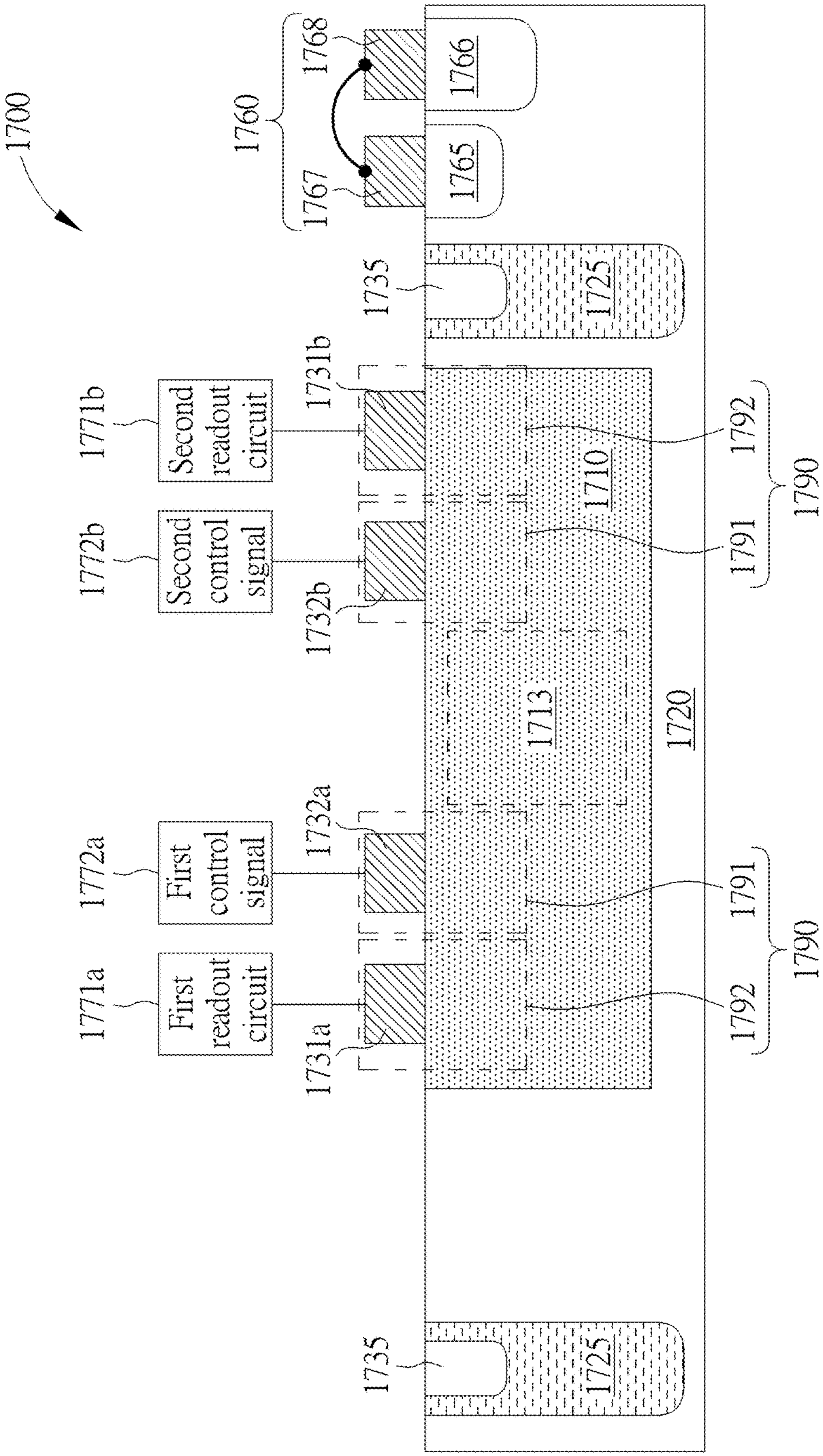
FIG. 17G illustrates a cross-sectional view of a photo-detecting apparatus, according to some embodiments.
Figure 17H:
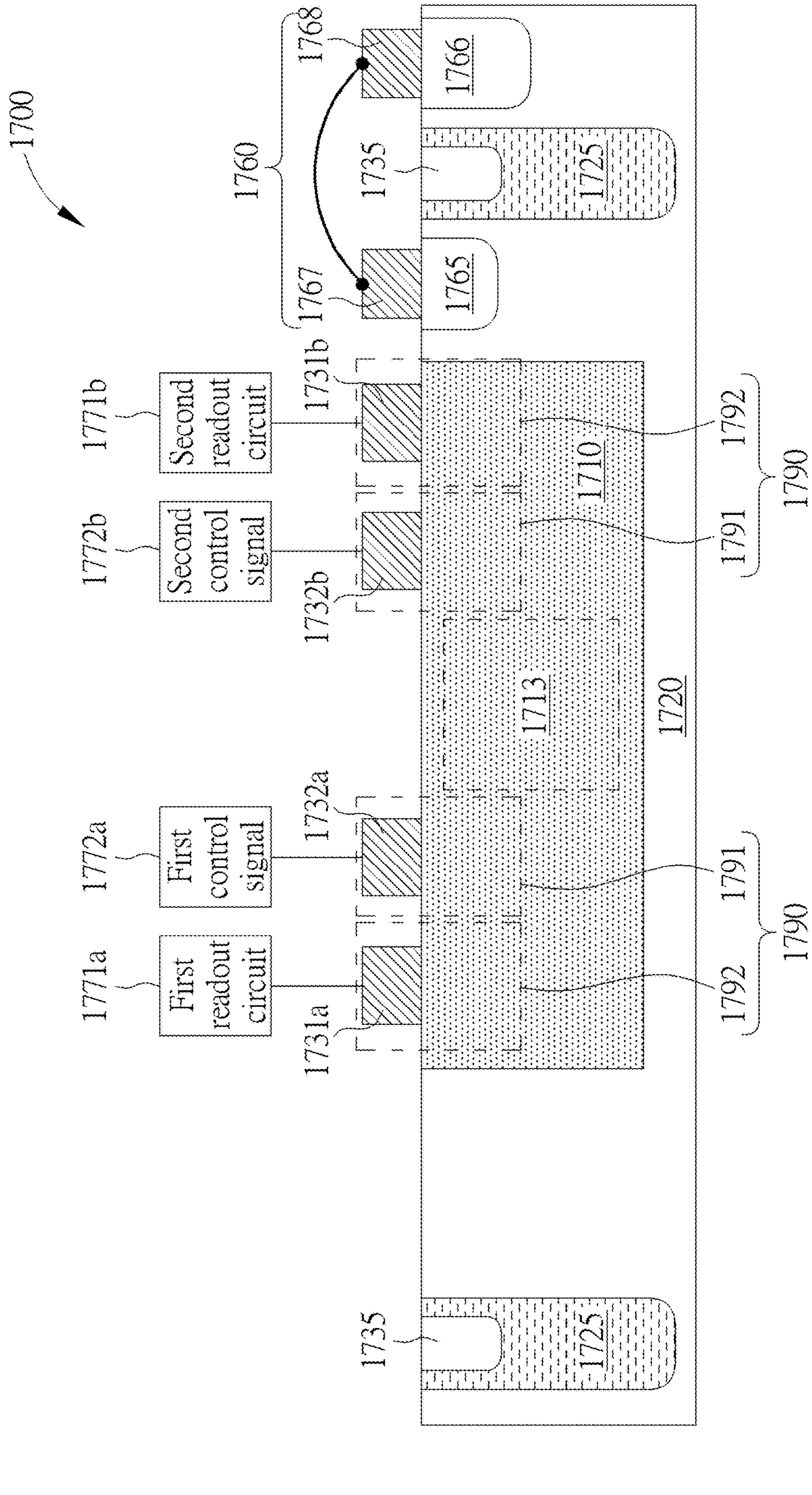
FIG. 17H illustrates a cross-sectional view of a photo-detecting apparatus, according to some embodiments.

FIGS. 17G-17H illustrates cross-sectional views of a photo-detecting apparatus, according to some embodiments. The photo-detecting apparatus in FIGS. 17G-17H are similar to the photo-detecting apparatus in FIG. 17C, the difference is described below.

In some embodiments, the positions of the isolation region 1725 (with or without the shallow isolation region 1735), the first well region 1765 and the second well region 1766 can be adjusted. For example, as shown in FIG. 17G, the isolation region 1725 (with or without the shallow isolation region 1735) can be disposed between the absorption region 10 and the shorting structure 1760. In some embodiment, the first well region 1765 is between the second well region 1766 and the isolation region 1725. In some embodiments, both the first well region 1765 and the second well region 1766 are disposed out of the ring-shaped isolation region 1725.

In some embodiments, as shown in FIG. 17H, the isolation region 1725 (with or without the shallow isolation region 1735) can be disposed between the first well region 1765 and the second well region 1766. In other words, the first well region 1765 is disposed between the absorption region 1710 and the isolation region 1725. In some embodiment, the second well region 1766 is disposed between the absorption region 1710 and the isolation region 1725.

Figure 17I:
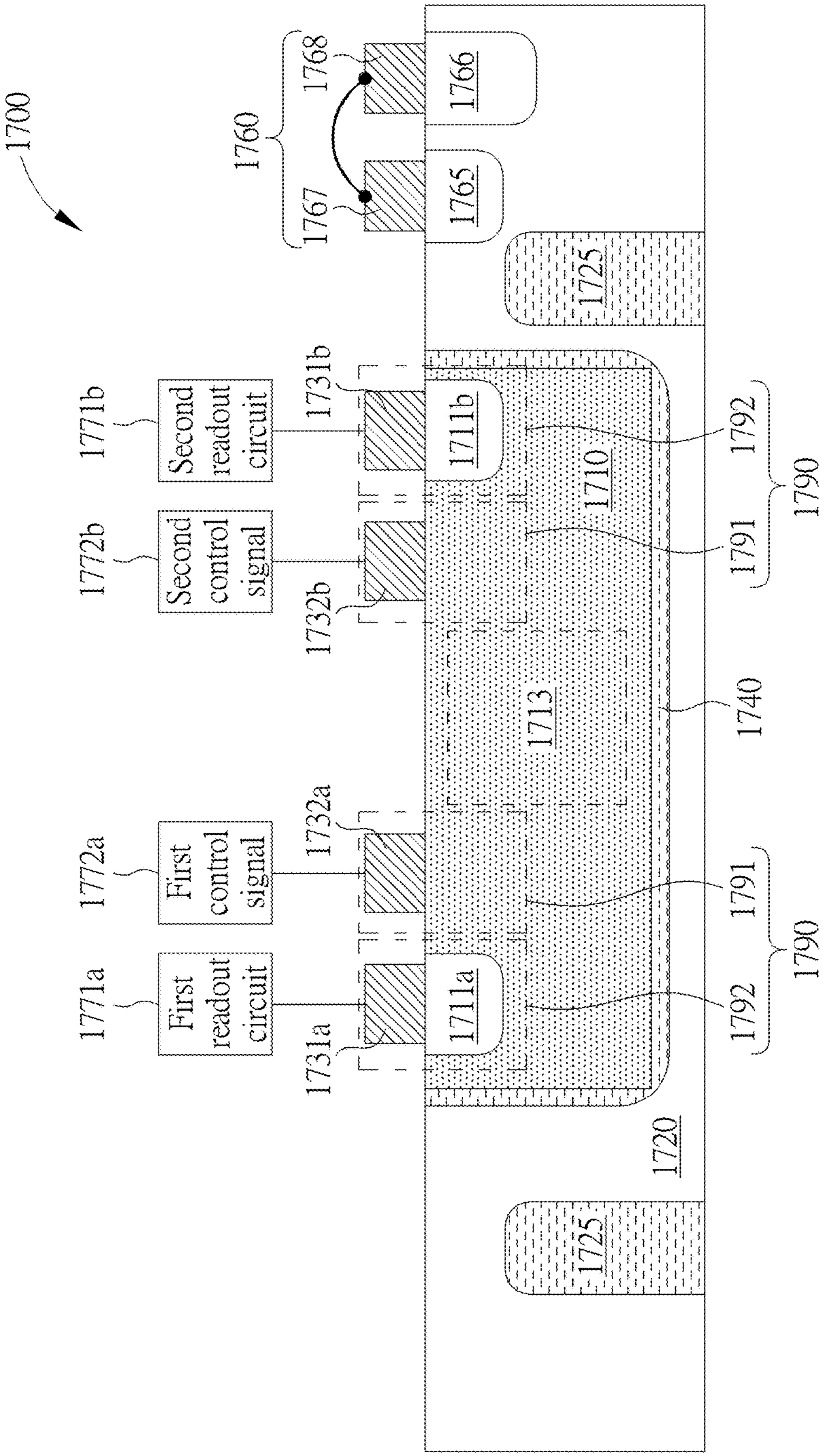
FIG. 17I illustrates a cross-sectional view of a photo-detecting apparatus, according to some embodiments.
Figure 17J:
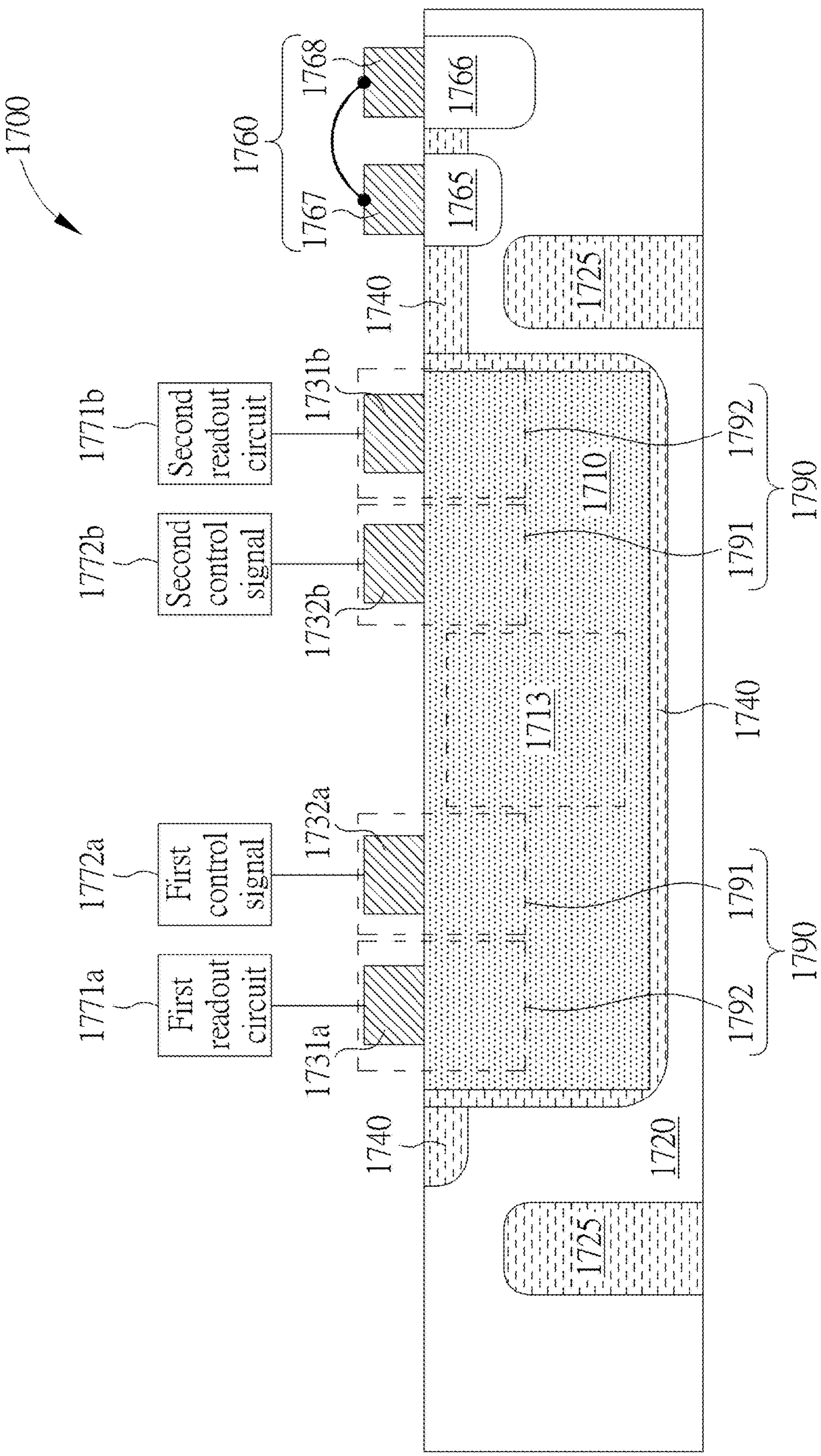
FIG. 17J illustrates a cross-sectional view of a photo-detecting apparatus, according to some embodiments.

FIGS. 17I-17J illustrates cross-sectional views of a photo-detecting apparatus, according to some embodiments. The photo-detecting apparatus in FIGS. 17I-17J are similar to the photo-detecting apparatus in FIG. 17B, the difference is described below.

The photo-detecting apparatus in FIGS. 17I-17J further includes an isolation region 1725 similar to the isolation region 1725 described in FIG. 17C. In some embodiments, the isolation region 1725 extends from a bottom surface of the substrate 1720 and extends into a predetermined depth from the bottom surface. That is, the isolation region 1725 does not penetrate through the upper surface of the substrate 1720. In some embodiments, the shorting structure 1760 can be closer to the absorption region 1710 than the isolation region 1725 is along a direction substantially parallel to the upper surface of the substrate 1720. In some embodiments, the isolation region 1725 can be closer to the absorption region 1710 than the shorting structure 1760 is along a direction substantially parallel to the upper surface of the substrate 1720.

In some embodiments, the pixel 1700 further includes a blocking layer 1740 surrounding the absorption region 1710, wherein the blocking layer is of a conductivity type (such as p-type) different from the first conductivity type of each of the first doped regions 1711*a*,1711*b* (such as n-type). The blocking layer 1740 may block photo-generated charges in the absorption region 1710 from reaching the substrate 1720, which increases the collection efficiency of photo-generated carriers of the pixel. The blocking layer 1740 may also block photo-generated charges in the substrate 1720 from reaching the absorption region 1710, which increases the speed of photo-generated carriers of the pixel. The blocking layer 1740 may include a material the same as the material of the absorption region 1710, the same as the material of the substrate 1720, or different from the material of the absorption region 1710 and the material of the substrate 1720. In some embodiments, the shape of the blocking layer 1740 is, but is not limited to a ring. In some embodiment, as shown in FIG. 17J, the blocking layer 1740 may extend to the upper surface of the substrate 1720. In some embodiments, the blocking layer 1740 may overlap with the first well region 1765 and the second well region 1766 since the isolation region 1725 extends from the bottom surface of the substrate 1720 and does not penetrate through the upper surface of the substrate 1720.

In some embodiments, the blocking layer 1740 is doped with a dopant having a peak concentration ranging from $10^{15}$ $cm^{-3}$ to $10^{20}$ $cm^{-3}$. The blocking layer 1740 may reduce the cross talk between a pixel 1700 and the adjacent other pixels (not shown).

In some embodiments, photo-detecting apparatus may further include a third conductive contact (not shown) electrically connected to the blocking layer 1740. The blocking layer 1740 may be biased through the third conductive contact by a bias voltage to discharge carriers not collected by the first doped regions 1711*a*,1711*b*.

Figure 17K:
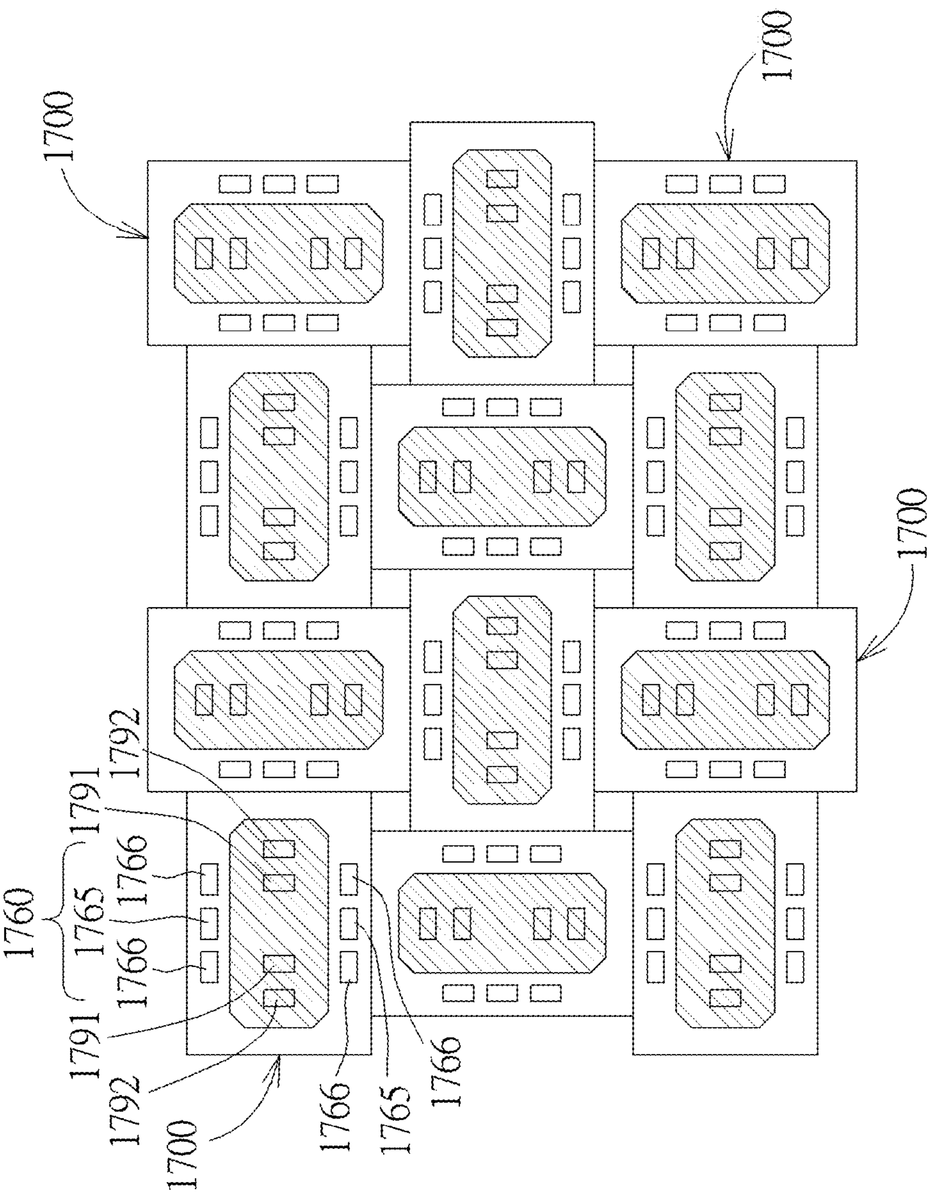
FIG. 17K illustrates a top view of photo-detecting apparatus, according to some embodiments.
Figure 17L:
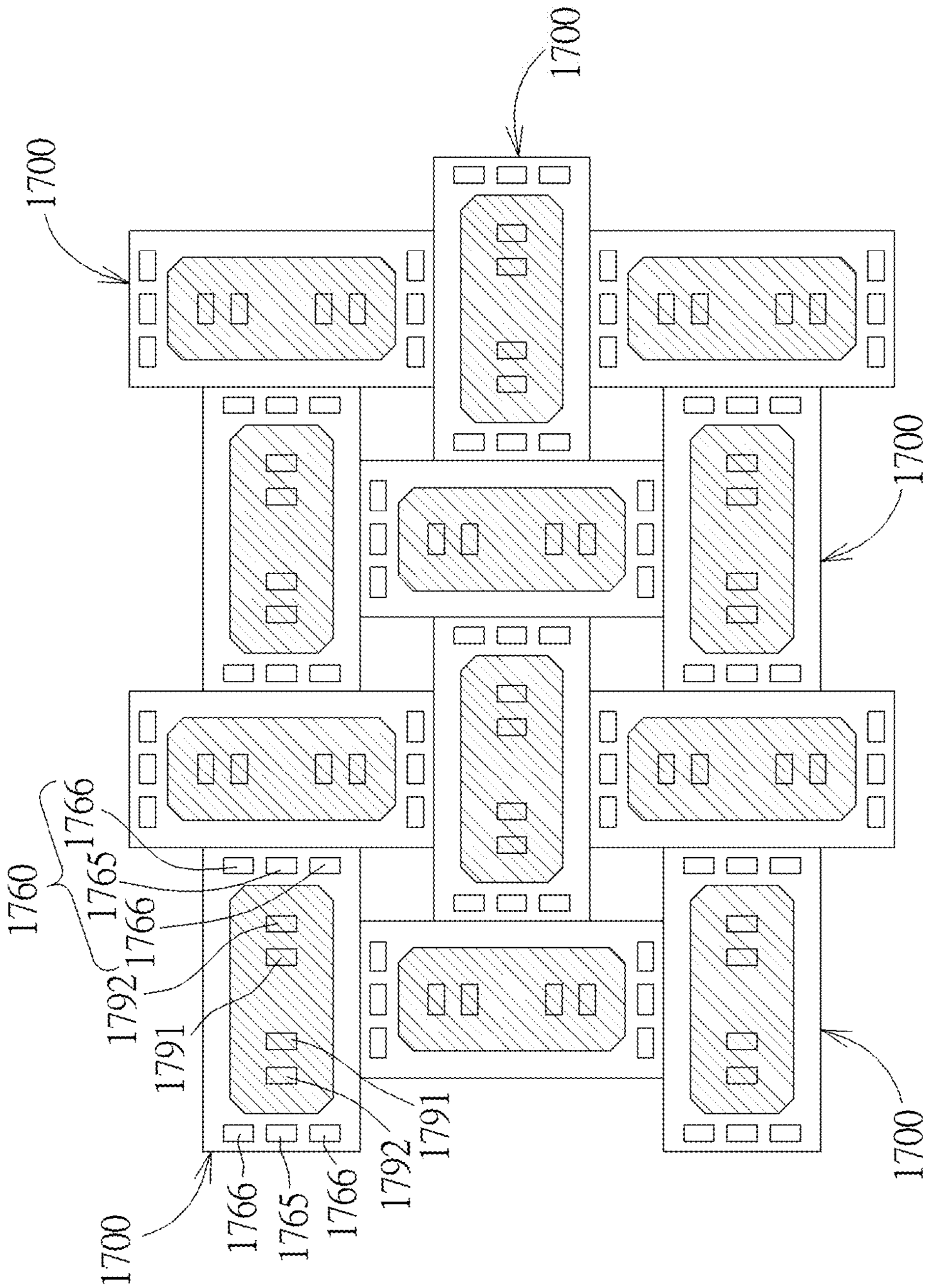
FIG. 17L illustrates a top view of photo-detecting apparatus, according to some embodiments.
Figure 17M:
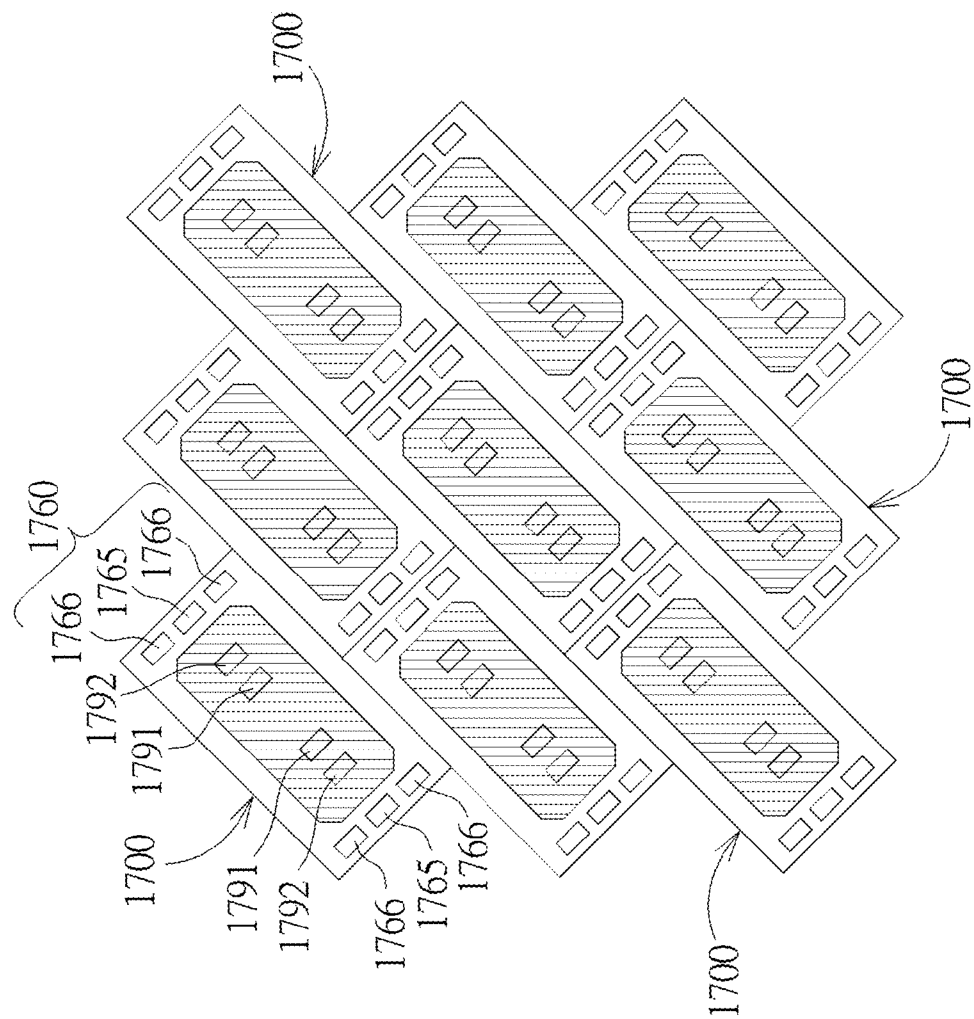
FIG. 17M illustrates a top view of photo-detecting apparatus, according to some embodiments.

Please refer to FIG. 17K, FIG. 17L and FIG. 17M. FIGS. 17K-17M illustrates top views of photo-detecting apparatus, according to some embodiments. In some embodiments, the photo-detecting apparatus includes a plurality of pixels 1700, that is a pixel-array including multiple repeating pixels. In some embodiments, the pixel-array may be a one-dimensional or a two-dimensional array of pixels. Each pixel is a photodetector and may use the embodiments disclosed above. Referring to the layout shown in FIG. 17K and FIG. 17L, the pixels 1700 can be arranged in a staggered layout, in which the width and length of each pixel are placed in directions perpendicular to the width and length of the adjacent pixels. As shown in FIG. 17M, the pixels 1700 can be arranged along an inclined direction (such as arranged along the 45-degrees). The pixel layout shown in FIGS. 17K-17M may be benefit from reduction in pixel pitch.

Besides, in some embodiments mentioned above (such as the embodiments mentioned in FIGS. 17B-17H), the shorting structure 1760 includes one first well region 1765 and one second well region 1766 which are connected with each other. However, in some embodiments, the shorting structure 1760 can also include one first well region 1765 and two second well regions 1766 which are connected with each other, and the first well region 1765 is disposed between the two second well regions 1766.

Besides, as mentioned above, in some embodiments, each pixel 1700 may include more than one shorting structure 1760, as shown in FIG. 17K, FIG. 17L and FIG. 17M, each pixel 1700 includes two shorting structures 1760.

In FIG. 17K, the two shorting structures 1760 are arranged symmetrically along the long axis of the absorption region 1710, in other words, the two shorting structures 1760 are arranged besides the two long edges of the absorption region 1710 respectively.

In FIG. 17L, the two shorting structures 1760 are arranged symmetrically along the short axis of the absorption region 1710, in other words, the two shorting structures 1760 are arranged besides the two short edges of the absorption region 1710 respectively.

In FIG. 17M, the pixels 1700 can be arranged along an inclined direction (such as arranged along the 45-degrees). The two shorting structures 1760 are arranged symmetrically along the short axis of the absorption region 1710 as an example. However, in other embodiments, the two shorting structures 1760 can also be arranged symmetrically along the long axis of the absorption region 1710.

In some embodiments mentioned above, each of the switches 1790 includes a control region 1791 and a readout region 1792, and the control region 1791 may include different components disposed therein. In this disclosure, the control region 1791 can include different elements or components to form different embodiments.

Figure 17N:
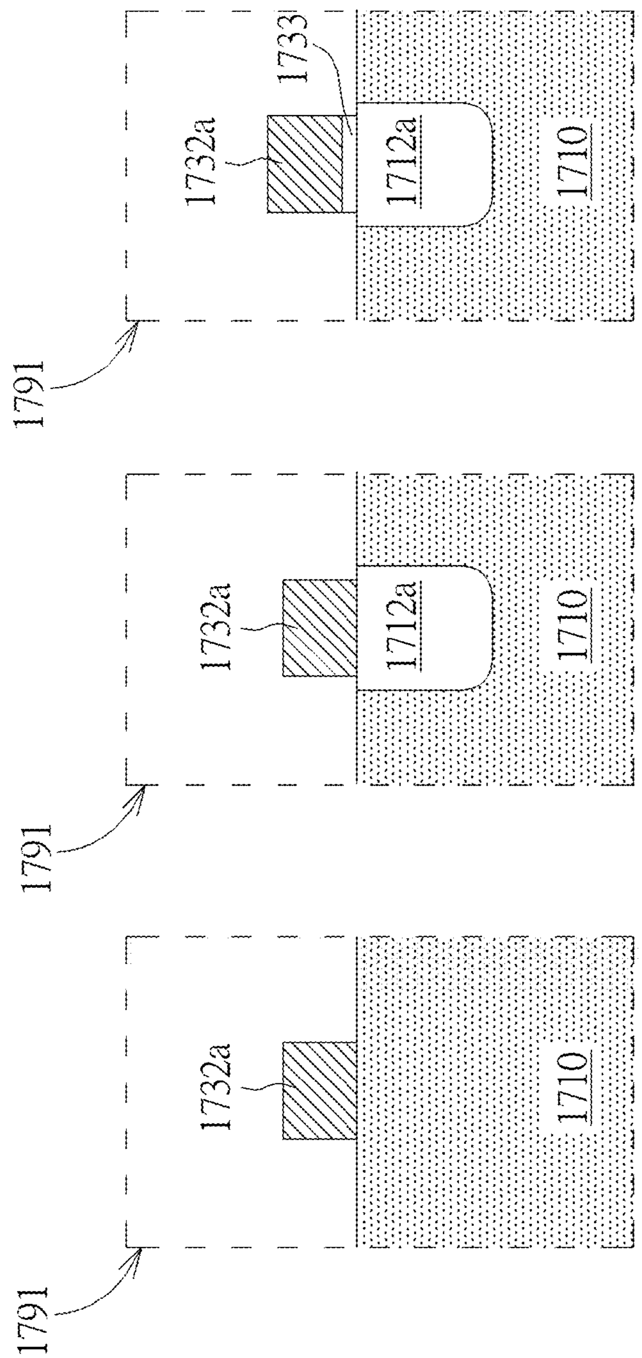
FIG. 17N shows the cross-sectional structural schematic diagrams of the control region in three different embodiments according to the present disclosure.

FIG. 17N shows the cross-sectional structural schematic diagrams of the control region 1791 in three different embodiments according to the present disclosure. In some embodiments, please refer to the left part of FIG. 17O, the second conductive contact 1732*a* is disposed over the upper surface of the absorption region 1710. This structure is similar to the structure shown in FIG. 17A, and will not be described again.

In some embodiments, please refer to the middle part of FIG. 17O, in addition to the second conductive contact 1732*a*, the control region 1791 further include a second doped region 1712*a* disposed under the second conductive contact 1732*a*. This structure is similar to the structure shown in FIG. 17E, and will not be described again.

In some embodiments, please refer to the right part of FIG. 17O, in addition to the second conductive contact 1732*a* and the second doped region 1712*a*, the control region 1791 further include an dielectric layer 1733 disposed between the second conductive contact 1732*a* and the second doped region 1712*a*. The dielectric layer 1733 prevents direct current conduction from the second conductive contacts 1732*a* to the absorption region, but allows an electric field to be established within the absorption region in response to an application of a voltage to the second conductive contacts 1732*a*. The established electric field may attract or repel charge carriers within the absorption region.

In some embodiments, the photo-detecting apparatus described in FIG. 16A through 16Q may also include a shorting structure 1760. Taking the photo-detecting apparatus described in FIG. 16E as an example, the photo-detecting apparatus may also include a shorting structure including a first well region and a second well region in the substrate 1620. In some embodiments, the shorting structure is between the isolation region 1650 and one of the subpixels 1600*a*, 1600*b*. In some embodiments, the isolation region 1650 is between the shorting structure and one of the subpixels 1600*a*, 1600*b*.

In some embodiments, the photo-detecting apparatus described in FIG. 16A through 16Q may also include multiple shorting structures 1760. In some embodiments, each of the shorting structures is between one of the outermost subpixels and the isolation region. In some embodiments, the isolation region is between the shorting structures and the outermost subpixel. Taking the photo-detecting apparatus described in FIG. 16E as an example, the photo-detecting apparatus may also include two shorting structure in the substrate 1620. In some embodiments, the two shorting structures is between the respective subpixel 1600*a*, 1600*b* and the isolation region 1650. In some embodiments, the isolation region is between the shorting structures and the respective subpixel 1600*a*, 1600*b*.

Figure 18:
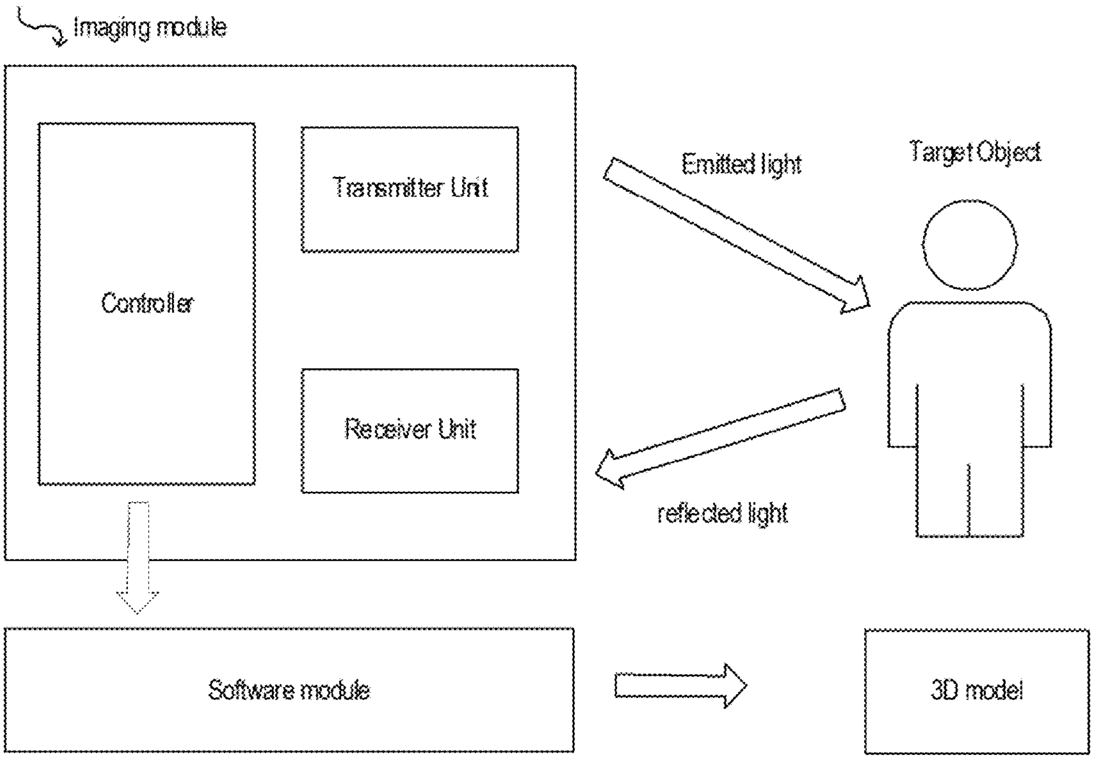
FIG. 18 is a block diagram of an example embodiment of an imaging system.

FIG. 18 is a block diagram of an example embodiment of an imaging system. The imaging system may include an imaging module and a software module configured to reconstruct a three-dimensional model of a detected object. The imaging system or the imaging module may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The imaging module includes a transmitter unit, a receiver unit, and a controller. During operation, the transmitter unit may emit an emitted light toward a target object. The receiver unit may receive reflected light reflected from the target object. The controller may drive at least the transmitter unit and the receiver unit. In some implementations, the receiver unit and the controller are implemented on one semiconductor chip, such as a system-on-a-chip (SoC). In some cases, the transmitter unit is implemented by two different semiconductor chips, such a laser emitter chip on III-V substrate and a Si laser driver chip on Si substrate.

The transmitter unit may include one or more light sources, control circuitry controlling the one or more light sources, and/or optical structures for manipulating the light emitted from the one or more light sources. In some embodiments, the light source may include one or more LEDs or VCSELs emitting light that can be absorbed by the absorption region in the photo-detecting apparatus. For example, the one or more LEDs or VCSEL may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structure. For example, the optical structure may include one or more collimating lens.

The receiver unit may include one or more photo-detecting apparatus according to any embodiments as mentioned above. The receiver unit may further include a control circuitry for controlling the control circuitry and/or optical structures for manipulating the light reflected from the target object toward the one or more photo-detecting apparatus. In some implementations, the optical structure includes one or more lens that receives a collimated light and focuses the collimated light towards the one or more photo-detecting apparatus.

In some embodiments, the controller includes a timing generator and a processing unit. The timing generator receives a reference clock signal and provides timing signals to the transmitter unit for modulating the emitted light. The timing signals are also provided to the receiver unit for controlling the collection of the photo-carriers. The processing unit processes the photo-carriers generated and collected by the receiver unit and determines raw data of the target object. The processing unit may include control circuitry, one or more signal processors for processing the information output from the photo-detecting apparatus, and/or computer storage medium that may store instructions for determining the raw data of the target object or store the raw data of the target object. As an example, the controller in an i-ToF sensor determines a distance between two points by using the phase difference between light emitted by the transmitter unit and light received by the receiver unit.

The software module may be implemented to perform in applications such as facial recognition, eye-tracking, gesture recognition, 3-dimensional model scanning/video recording, motion tracking, autonomous vehicles, and/or augmented/virtual reality.

Figure 19:
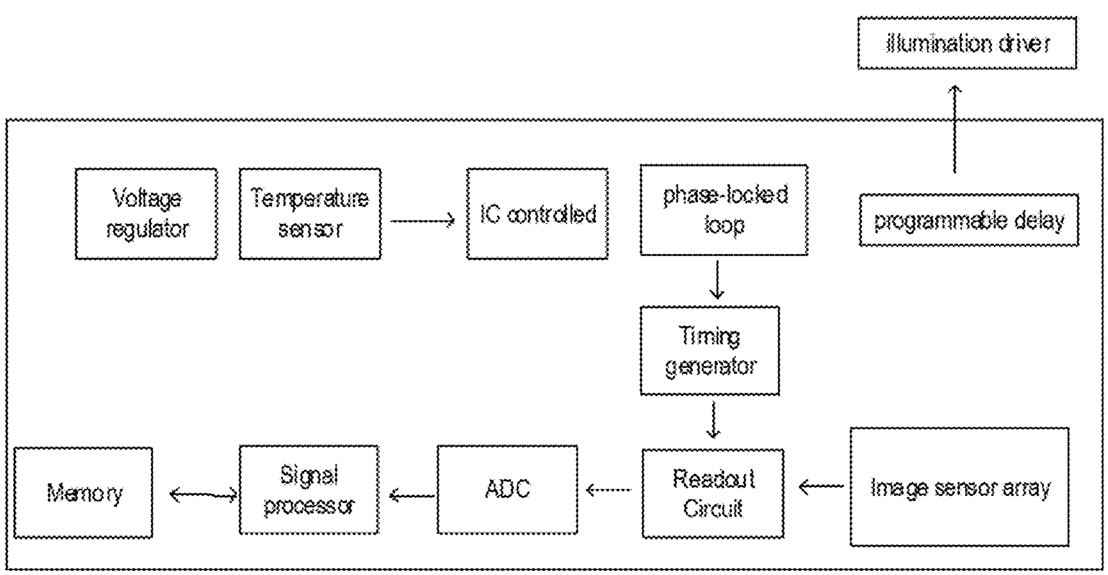
FIG. 19 shows a block diagram of an example receiver unit or controller.

FIG. 19 shows a block diagram of an example receiver unit or controller. Here, an image sensor array (e.g., 240×180) may be implemented using any implementations of the photo-detecting device described in reference to FIGS. 3A through 8E, FIGS. 14C through 14L. A phase-locked loop (PLL) circuit (e.g., an integer-N PLL) may generate a clock signal (e.g., four-phase system clocks) for modulation and demodulation. Before sending to the pixel array and external illumination driver, these clock signals may be gated and/or conditioned by a timing generator for a preset integration time and different operation modes. A programmable delay line may be added in the illumination driver path to delay the clock signals.

A voltage regulator may be used to control an operating voltage of the image sensor. For example, multiple voltage domains may be used for an image sensor. A temperature sensor may be implemented for the possible use of depth calibration and power control.

The readout circuit of the photo-detecting apparatus bridges each of the photo-detecting devices of the image sensor array to a column analog-to-digital converter (ADC), where the ADC outputs may be further processed and integrated in the digital domain by a signal processor before reaching the output interface. A memory may be used to store the outputs by the signal processor. In some implementations, the output interface may be implemented using a 2-lane, 1.2 Gb/s D-PHY MIPI transmitter, or using CMOS outputs for low-speed/low-cost systems.

An inter-integrated circuit (I2C) interface may be used to access all of the functional blocks described here.

In the present disclosure, if not specifically mention, the absorption region is entirely embedded in the substrate, partially embedded in the substrate or entirely on the first surface of the substrate. Similarly, if not specifically mention, the germanium-based light absorption material is entirely embedded in the semiconductor substrate, partially embedded in the semiconductor substrate or entirely over the first surface of the semiconductor substrate.

In the present disclosure, if not specifically mention, the absorption region is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the absorption region receives an optical signal and converts the optical signal into electrical signals.

In the present disclosure, if not specifically mention, the substrate is made by a first material or a first material-composite. The absorption region is made by a second material or a second material-composite. The second material or a second material-composite is different from the first material or a first material-composite. In some embodiments, the absorption region includes a semiconductor material. In some embodiments, the absorption region includes polycrystalline material. In some embodiments, the substrate includes a semiconductor material. In some embodiments, the absorption region includes a Group III-V semiconductor material. In some embodiments, the substrate includes a Group III-V semiconductor material. The Group III-V semiconductor material may include, but is not limited to, GaAs/AlAs, InP/InGaAs, GaSb/InAs, or InSb. In some embodiments, the absorption region includes a semiconductor material including a Group IV element. For example, Ge, Si or Sn. In some embodiments, the absorption region includes $Ge_xSi_{1-x}$, wherein $0<x<1$. In some embodiments, the absorption region includes the $Si_xGe_ySn_{1-x-y}$, wherein 0x1, 0 y 1. In some embodiments, the absorption region includes the $Ge_{1-a}Sn_a$, wherein 0 a 0.1. In some embodiments, the substrate includes Si. In some embodiments, the substrate is composed of Si. In some embodiments, the absorption region is composed of Ge, Si or $Ge_xSi_{1-x}$. In some embodiments, the absorption region composed of intrinsic germanium is of p-type due to material defects formed during formation of the absorption region, wherein the defect density is from $1\times10^{14}$ cm$^{-3}$ to $1\times10^{16}$ cm$^{-3}$.

In the present disclosure, if not specifically mention, the absorption region has a thickness depending on the wavelength of photons to be detected and the material of the absorption region. In some embodiments, when the absorption region includes germanium and is designed to absorb photons having a wavelength not less than 800 nm, the absorption region has a thickness not less than 0.1 um. In some embodiments, the absorption region includes germanium and is designed to absorb photons having a wavelength between 800 nm and 2000 nm, the absorption region has a thickness between 0.1 um and 2.5 um. In some embodiments, the absorption region has a thickness between 1 um and 2.5 um for higher quantum efficiency. In some embodiments, the absorption region may be grown using a blanket epitaxy, a selective epitaxy, or other applicable techniques.

In the present disclosure, if not specifically mention, the first readout circuit, the second readout circuit, the first common readout circuit or the second common readout circuit may be in a three-transistor configuration consisting of a reset gate, a source-follower, and a selection gate, a circuit including four or more transistors, or any suitable circuitry for processing charges. In some embodiments, the first readout circuits and the second readout circuits may be fabricated on the substrate. In some other embodiments, the first readout circuits and the second readout circuits may be fabricated on another substrate and integrated/co-packaged with the absorption region via die/wafer bonding or stacking. In some embodiments, the photo-detecting apparatus includes a bonding layer (not shown) between the readout circuit and the absorption region 10. The bonding layer may include any suitable material such as oxide or semiconductor or metal or alloy.

In the present disclosure, if not specifically mention, the first readout circuit includes a first capacitor. The first capacitor is configured to store the photo-carriers collected by one of the first doped regions. In some embodiments, the first capacitor is electrically coupled to the reset gate of the first readout circuit. In some embodiments, the first capacitor is between the source-follower of the first readout circuit and the reset gate of the first readout circuit. In some embodiments, the second readout circuit includes a second capacitor. In some embodiments, the second capacitor is configured to store the photo-carriers collected by the other one of the first doped regions. In some embodiments, the second capacitor is electrically coupled to the reset gate of the second readout circuit. In some embodiments, the second capacitor is between the source-follower of the second readout circuit and the reset gate of the second readout circuit. Examples of the first capacitor and the second capacitor include, but not limited to, floating-diffusion capacitors, metal-oxide-metal (MOM) capacitors, metal-insulator-metal (MIM) capacitors, and metal-oxide-semiconductor (MOS) capacitors.

In the present disclosure, if not specifically mention, in a same pixel, the type of the carriers collected by the first doped region of one of the switches and the type of the carriers collected by the first doped region of the other switch are the same. For example, when the photo-detecting apparatus is configured to collects electrons, when the first switch is switched on and the second switch is switched off, the first doped region in the first switch collects electrons of the photo-carriers generated from the absorption region, and when the second switch is switched on and the first switch is switched off, the first doped region in the second switch also collects electrons of the photo-carriers generated from the absorption region.

In some embodiments, the first dielectric layer, the second dielectric layer in the present disclosure include, but is not limited to $SiO_2$. In some embodiments, the first dielectric layer, the second dielectric layer the third dielectric layer, the fourth dielectric layer and the fifth dielectric layer include a high-k material including, but is not limited to, $Si_3N_4$, SiON, $SiN_x$, $SiO_x$, $GeO_x$, $Al_2O_3$, $Y_2O_3$, $TiO_2$, $HfO_2$ or $ZrO_2$. In some embodiments, the first dielectric layer, the second dielectric layer, the third dielectric layer, the fourth dielectric layer and the fifth dielectric layer in the present disclosure include semiconductor material but, but is not limited to amorphous Si, polycrystalline Si, crystalline Si, or a combination thereof.

In the present disclosure, if not specifically mention, the first conductive contact, second conductive contact, third conductive contact include metals or alloys. For example, the first conductive contact, second conductive contact, third conductive contact include Al, Cu, W, Ti, Ta—TaN—Cu stack or Ti—TiN—W stack.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A photo-detecting apparatus, comprises:

a pixel comprising:

N subpixels, wherein each of the subpixels comprises a detection region and two first conductive contacts, wherein the detection region is between the two first conductive contacts, and wherein N is a positive integer and is ≥2; and an isolation region surrounding the detection regions of the N subpixels, wherein, in cross-section through the pixel, a minimum width between the first conductive contacts of two adjacent subpixels is less than a width of the isolation region.

2. The photo-detecting apparatus according to claim 1, wherein each of the subpixels further comprises two second conductive contacts, wherein the detection region is between the two second conductive contacts.

3. The photo-detecting apparatus according to claim 2, wherein each of the subpixels further includes two first doped regions under the respective first conductive contact.

4. The photo-detecting apparatus according to claim 3, wherein each of the subpixels further includes two second doped regions under the respective two second conductive contact, and each of the second doped regions is of a second conductivity type different from a first conductivity type of each of the first doped regions.

5. The photo-detecting apparatus according to claim 1, wherein the pixel further includes an absorption region, wherein the detection regions of the N subpixels are in the same absorption region.

6. The photo-detecting apparatus according to claim 5, wherein a minimum width between the first conductive contacts of the two adjacent subpixels is less than a width of the absorption region from a cross-sectional view of the photo-detecting apparatus.

7. The photo-detecting apparatus according to claim 4, wherein the pixel further includes an absorption region, wherein the first doped regions and the second doped regions of the N subpixels are in the same absorption region.

8. The photo-detecting apparatus according to claim 7, wherein the pixel further comprises a blocking layer surrounding the absorption region, wherein the blocking layer is of a conductivity type different from a first conductivity type of each of the first doped regions.

9. The photo-detecting apparatus according to claim 1, wherein the isolation region is outside of the absorption region and physically separated from the absorption region.

10. The photo-detecting apparatus according to claim 3, wherein the pixel further comprises a third doped region between two adjacent subpixels of the N subpixels, and the third doped region is separated from the first doped regions of the two adjacent subpixels, wherein the third doped region is of a conductivity type different from the first conductivity type.

11. The photo-detecting apparatus according to claim 4, wherein one of the subpixels further comprise a counter-doped region overlapped with a portion of one of the first doped regions of the subpixel, wherein the counter-doped region is of a conductivity type different from the first conductivity type.

12. The photo-detecting apparatus according to claim 2, wherein the pixel comprises 2N readout circuits and 2N control signals, two of the readout circuits are electrically coupled to the respective first conductive contact of one of the subpixels, and two of the control signals circuits are electrically coupled to the respective second conductive contacts of one of the subpixels.

13. The photo-detecting apparatus according to claim 1, wherein the pixel comprises a common readout circuit electrically to one of the first conductive contacts of one of the subpixels and one of the first conductive contacts of another one of the subpixels.

14. The photo-detecting apparatus according to claim 2, wherein the pixel comprises a common control signal electrically to one of the second conductive contacts of one of the subpixels and one of the second conductive contacts of another one of the subpixels.

15. The photo-detecting apparatus according to claim 1, wherein the photo-detecting apparatus further comprises multiple optical elements over the respective subpixel.

16. A photo-detecting apparatus, comprising:

a first pixel and a second pixel adjacent to the first pixel, wherein each of the first pixel and the second pixel comprises:

N detection regions;

2N first conductive contacts each coupled to one of the detection regions; and 2N second conductive contacts each coupled to one of the detection regions, wherein N is a positive integer and is ≥2; and an isolation region between the first pixel and the second pixel, wherein, in cross-section through the photo-detecting apparatus, a minimum width between one of the 2N first conductive contacts of the first pixel and one of the 2N first conductive contacts of the second pixel is less than a width of the isolation region.

17. An imaging system comprising:

a transmitter unit configured to emit light; and a receiver unit comprising an image sensor comprising:

a photo-detecting apparatus, comprising:

a plurality of pixels, wherein each of the pixels comprises:

N subpixels, wherein each of the subpixels comprises a detection region and two first conductive contacts, wherein the detection region is between the two first conductive contacts and the detection region is configured to absorb photons having a wavelength, and to generate photo-carriers from the absorbed photons, wherein N is a positive integer and is ≥2; and an isolation region surrounding the detection regions of the N subpixels, wherein, in cross-section through the pixel, a minimum width between the first conductive contacts of the two adjacent subpixels is less than a width of the isolation region.

18. The imaging system of claim 17, further comprising a processing unit capable of processing the photo-carriers generated by the receiver unit.

* * * * *